US 9,741,400 B2

(12) United States Patent
Nagatsuka et al.

(10) Patent No.: US 9,741,400 B2
(45) Date of Patent: Aug. 22, 2017

(54) SEMICONDUCTOR DEVICE, MEMORY DEVICE, ELECTRONIC DEVICE, AND METHOD FOR OPERATING THE SEMICONDUCTOR DEVICE

(71) Applicant: SEMICONDUCTOR ENERGY LABORATORY CO., LTD., Atsugi-shi, Kanagawa-ken (JP)

(72) Inventors: Shuhei Nagatsuka, Kanagawa (JP); Tomokazu Yokoi, Kanagawa (JP); Naoaki Tsutsui, Kanagawa (JP); Kazuaki Ohshima, Kanagawa (JP); Tatsuya Onuki, Kanagawa (JP)

(73) Assignee: Semiconductor Energy Laboratory Co., LTD., Kanagawa-ken (JP)

(*) Notice: Subject to any disclaimer, the term of this patent is extended or adjusted under 35 U.S.C. 154(b) by 0 days.

(21) Appl. No.: 15/341,707

(22) Filed: Nov. 2, 2016

(65) Prior Publication Data
US 2017/0133064 A1  May 11, 2017

(30) Foreign Application Priority Data

Nov. 5, 2015  (JP) .................. 2015-217863

(51) Int. Cl.
*G11C 7/10* (2006.01)
*G11C 7/06* (2006.01)
(Continued)

(52) U.S. Cl.
CPC ............. *G11C 7/065* (2013.01); *G11C 5/063* (2013.01); *G11C 7/10* (2013.01); *G11C 7/12* (2013.01);
(Continued)

(58) Field of Classification Search
CPC .......... G11C 7/065; G11C 5/063; G11C 8/10; G11C 7/12; G11C 7/10; H01L 27/11582; H01L 27/11568
See application file for complete search history.

(56) References Cited

U.S. PATENT DOCUMENTS 5,534,884 A    7/1996  Mase et al.
5,731,856 A    3/1998  Kim et al.
(Continued)

FOREIGN PATENT DOCUMENTS

EP    1737044 A    12/2006
EP    2226847 A     9/2010
(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Toan Le
(74) *Attorney, Agent, or Firm* — Nixon Peabody LLP; Jeffrey L. Costellia

(57) ABSTRACT

A semiconductor device or a memory device with a reduced area, a large storage capacity, a high-speed operation, or low power consumption is provided. The semiconductor device includes a first transistor, a second transistor, a capacitor, a first wiring, a second wiring, a sense amplifier circuit, a decoder, a step-up circuit, a level shifter, and a buffer circuit. The first wiring is electrically connected to the buffer circuit and a second gate electrode of the first transistor. The second wiring is electrically connected to the sense amplifier circuit and the drain electrode of the second transistor. The capaci-
(Continued)

tor is electrically connected to the drain electrode of the first transistor and the source electrode of the second transistor.

9 Claims, 47 Drawing Sheets

(51) Int. Cl.

| | | |
|---|---|---|
| H01L 27/11582 | (2017.01) | |
| H01L 27/11568 | (2017.01) | |
| G11C 5/06 | (2006.01) | |
| G11C 8/10 | (2006.01) | |
| G11C 7/12 | (2006.01) | |

(52) U.S. Cl.
CPC .......... *G11C 8/10* (2013.01); *H01L 27/11568* (2013.01); *H01L 27/11582* (2013.01)

(56) References Cited

U.S. PATENT DOCUMENTS

| | | |
|---|---|---|
| 5,744,864 A | 4/1998 | Cillessen et al. |
| 5,982,471 A | 11/1999 | Hirakata et al. |
| 6,169,532 B1 | 1/2001 | Sumi et al. |
| 6,266,038 B1 | 7/2001 | Yoshida et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,961,042 B2 | 11/2005 | Murai |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,098,880 B2 | 8/2006 | Inoue et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,737,517 B2 | 6/2010 | Kawamura et al. |
| 8,067,775 B2 | 11/2011 | Miyairi et al. |
| 8,378,403 B2 | 2/2013 | Kato |
| 8,421,081 B2 | 4/2013 | Kato et al. |
| 8,455,868 B2 | 6/2013 | Yamazaki et al. |
| 8,686,486 B2 | 4/2014 | Kato et al. |
| 8,687,411 B2 | 4/2014 | Saito |
| 8,709,889 B2 | 4/2014 | Saito |
| 8,743,590 B2 | 6/2014 | Kurokawa |
| 8,772,849 B2 | 7/2014 | Noda |
| 8,787,102 B2 | 7/2014 | Ishizu |
| 8,797,785 B2 | 8/2014 | Saito |
| 8,809,853 B2 | 8/2014 | Saito et al. |
| 8,809,927 B2 | 8/2014 | Takemura |
| 8,854,865 B2 | 10/2014 | Saito |
| 8,896,046 B2 | 11/2014 | Kato |
| 8,958,263 B2 | 2/2015 | Takemura |
| 2001/0020928 A1 | 9/2001 | Yanagisawa et al. |
| 2001/0046027 A1 | 11/2001 | Tai et al. |
| 2002/0003271 A1 | 1/2002 | Ikeda et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0219188 A1 | 10/2005 | Kawabe et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0133146 A1 | 6/2006 | Maekawa et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0205976 A1 | 9/2007 | Takatori et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042968 A1 | 2/2008 | Oh |
| 2008/0050595 A1 | 2/2008 | Nakagawara et al. |
| 2008/0055218 A1 | 3/2008 | Tsuda et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284970 A1 | 11/2008 | Ishitani |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0079684 A1 | 3/2009 | Watanabe |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0244020 A1 | 9/2010 | Sakata et al. |
| 2011/0110145 A1* | 5/2011 | Yamazaki ............ G11C 11/405 365/149 |
| 2012/0061668 A1 | 3/2012 | Miyairi et al. |
| 2012/0161220 A1 | 6/2012 | Yamazaki |

(56) References Cited

U.S. PATENT DOCUMENTS

| | | | |
|---|---|---|---|
| 2012/0193697 A1 | 8/2012 | Takemura | |
| 2012/0261742 A1 | 10/2012 | Hirano et al. | |
| 2013/0069132 A1 | 3/2013 | Atsumi et al. | |
| 2013/0140569 A1 | 6/2013 | Yoneda et al. | |
| 2013/0148411 A1 | 6/2013 | Atsumi et al. | |
| 2013/0155790 A1 | 6/2013 | Atsumi | |
| 2013/0221356 A1 | 8/2013 | Yamazaki et al. | |
| 2013/0258746 A1 | 10/2013 | Kurokawa | |
| 2013/0293266 A1* | 11/2013 | Takemura | H03K 19/094 326/102 |
| 2014/0042433 A1* | 2/2014 | Yamazaki | H01L 29/78693 257/43 |
| 2014/0325249 A1 | 10/2014 | Toyotaka | |
| 2014/0374747 A1 | 12/2014 | Kurokawa | |
| 2016/0225772 A1* | 8/2016 | Tsubuku | H01L 27/1255 |
| 2016/0351243 A1* | 12/2016 | Ishizu | H01L 27/1255 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165451 A | 6/2006 |
| JP | 2014-197444 A | 10/2014 |
| WO | WO-2004/114391 | 12/2004 |
| WO | WO-2011/055433 | 5/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

"First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996. vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000°C.", Journal of Solid State Chemistry, 1985, vol. 60, pp. 382-384.

Kimizuka.N et al., "Syntheses and Single-Crystal Data of Homologous Compounds, In2O3(ZnO)m (m =3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film. Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

905D

905E

SEMICONDUCTOR DEVICE, MEMORY DEVICE, ELECTRONIC DEVICE, AND METHOD FOR OPERATING THE SEMICONDUCTOR DEVICE

BACKGROUND OF THE INVENTION

1. Field of the Invention

One embodiment of the present invention relates to a semiconductor device or a memory device.

Note that one embodiment of the present invention is not limited to the above technical field. The technical field of one embodiment of the invention disclosed in this specification relates to an object, a method, or a manufacturing method. One embodiment of the present invention relates to a process, a machine, manufacture, or a composition of matter. One embodiment of the present invention relates to a semiconductor device, a display device, a light-emitting device, a power storage device, a memory device, a circuit board, an electronic device, a driving method thereof, or a manufacturing method thereof.

2. Description of the Related Art

With an increase in the amount of data, the importance of memory devices has been increasing. Need for an increase in storage capacity in an available portable terminal has also arisen, and integration of a circuit including a memory device and a circuit having another function is required. Examples of a memory element using an insulating film for charge accumulation are disclosed in Patent Documents 1 and 2.

REFERENCE

Patent Document

[Patent Document 1] Japanese Published Patent Application No. 2006-165451
[Patent Document 2] PCT International Publication No. WO2011/055433

SUMMARY OF THE INVENTION

An object of one embodiment of the present invention is to provide a novel semiconductor device or a novel memory device. Another object of one embodiment of the present invention is to provide a semiconductor device or a memory device with a reduced area. Another object of one embodiment of the present invention is to provide a semiconductor device or a memory device with a large storage capacity. Another object of one embodiment of the present invention is to provide a semiconductor device or a memory device that operates at high speed. Another object of one embodiment of the present invention is to provide a semiconductor device or a memory device with low power consumption.

One embodiment of the present invention does not necessarily achieve all the objects listed above and only needs to achieve at least one of the objects. The description of the above objects does not disturb the existence of other objects. Other objects will be apparent from and can be derived from the description of the specification, the drawings, the claims, and the like.

One embodiment of the present invention is a semiconductor device including a first transistor, a second transistor, a first capacitor, a first wiring, a second wiring, a buffer circuit, and a sense amplifier circuit. The first transistor includes an oxide semiconductor film, a first gate electrode, a second gate electrode, a first gate insulating film, and a second gate insulating film. The second transistor includes an oxide semiconductor film. The oxide semiconductor film of the first transistor includes a region positioned between the first gate electrode and the second gate electrode. The first gate insulating film includes a region positioned between the oxide semiconductor film and the first gate electrode of the first transistor. The second gate insulating film includes a region positioned between the oxide semiconductor film and the second gate electrode of the first transistor. The second gate insulating film contains at least one of hafnium oxide, aluminum oxide, and silicon nitride. The first wiring is electrically connected to the buffer circuit. The second gate electrode of the first transistor is electrically connected to the first wiring. The second wiring is electrically connected to the sense amplifier circuit. One of a source electrode and a drain electrode of the first transistor is electrically connected to one electrode of the first capacitor. One of a source electrode and a drain electrode of the second transistor is electrically connected to the second wiring. The other of the source electrode and the drain electrode of the second transistor is electrically connected to the one electrode of the first capacitor.

Alternatively, one embodiment of the present invention is a semiconductor device including a first transistor, a second transistor, a first capacitor, a first wiring, a second wiring, a buffer circuit, a sense amplifier circuit, a decoder, a level shifter, and a step-up circuit. The first transistor includes an oxide semiconductor film, a first gate electrode, a second gate electrode, a first gate insulating film, and a second gate insulating film. The second transistor includes an oxide semiconductor film. The oxide semiconductor film of the first transistor includes a region positioned between the first gate electrode and the second gate electrode. The first gate insulating film includes a region positioned between the oxide semiconductor film and the first gate electrode of the first transistor. The second gate insulating film includes a region positioned between the oxide semiconductor film and the second gate electrode of the first transistor. The level shifter is electrically connected to the step-up circuit. The buffer circuit is electrically connected to the level shifter. The level shifter is configured to output a first potential, a second potential, and a third potential through the buffer circuit. Any one of the first potential, the second potential, and the third potential is supplied to the second gate electrode of the first transistor. The first potential or the second potential is supplied to the second gate electrode of the first transistor to trap charge in the second gate insulating film. The third potential is supplied to the second gate electrode of the first transistor to turn off the second transistor. The first wiring is electrically connected to the buffer circuit. The second gate electrode of the first transistor is electrically connected to the first wiring. The second wiring is electrically connected to the sense amplifier circuit. One of a source electrode and a drain electrode of the first transistor is electrically connected to one electrode of the first capacitor. One of a source electrode and a drain electrode of the second transistor is electrically connected to the second wiring. The other of the source electrode and the drain electrode of the second transistor is electrically connected to the one electrode of the capacitor.

In the above structure, the second gate insulating film preferably contains oxygen and hafnium. Alternatively, the second gate insulating film preferably contains aluminum and oxygen. Alternatively, the second gate insulating film preferably contains silicon and nitrogen. Alternatively, the second gate insulating film preferably includes a first layer and a second layer over the first layer, and each of the first layer and the second layer preferably contains a material selected from hafnium oxide, aluminum oxide, and silicon nitride.

Another embodiment of the present invention is a memory device including the semiconductor device described in any of the above.

Another embodiment of the present invention is an electronic device including the semiconductor device described in any of the above or the memory device described in the above, and a display portion, a microphone, a speaker, or an operation key.

Another embodiment of the present invention is an operating method of a semiconductor device. The semiconductor device includes a first transistor, a second transistor, a first capacitor, a first wiring, a second wiring, a first circuit, and a sense amplifier circuit. The first circuit includes a decoder, a level shifter, a buffer circuit, and a step-up circuit. The first transistor includes an oxide semiconductor film, a first gate electrode, a second gate electrode, a first gate insulating film, and a second gate insulating film. The second transistor includes an oxide semiconductor film. The oxide semiconductor film of the first transistor includes a region positioned between the first gate electrode and the second gate electrode. The first gate insulating film includes a region positioned between the oxide semiconductor film and the first gate electrode of the first transistor. The second gate insulating film includes a region positioned between the oxide semiconductor film and the second gate electrode of the first transistor. The level shifter is electrically connected to the step-up circuit. The first wiring is electrically connected to the buffer circuit. The second gate electrode of the first transistor is electrically connected to the first wiring. The second wiring is electrically connected to the sense amplifier circuit. One of a source electrode and a drain electrode of the first transistor is electrically connected to one electrode of the first capacitor. One of a source electrode and a drain electrode of the second transistor is electrically connected to the second wiring. The other of the source electrode and the drain electrode of the second transistor is electrically connected to the one electrode of the capacitor. The operating method of the semiconductor device includes a first step of trapping charge in the second gate insulating film by providing a first potential difference between the other of the source electrode and the drain electrode of the first transistor and the second gate electrode of the first transistor, a second step of turning on the second transistor so that charge is accumulated in the other of the source electrode and the drain electrode of the second transistor, and a third step of turning off the second transistor so that charge is held in the other of the source electrode and the drain electrode of the second transistor.

In the above structure, the level shifter is preferably configured to output a first potential, a second potential, and a third potential through the buffer circuit; any one of the first potential, the second potential, and the third potential is preferably supplied to the second gate electrode of the first transistor; in the first step, the first potential or the second potential is preferably supplied to the second gate electrode of the first transistor; and in the third step, the third potential is preferably supplied to the second gate electrode of the first transistor. In the above structure, it is preferable to include a fourth step of providing a second potential difference between the other of the source electrode and the drain electrode of the first transistor and the second gate electrode of the first transistor to measure current between the source electrode and the drain electrode of the first transistor, and it is preferable that the second potential difference be smaller than the first potential difference. In the above structure, the second gate insulating film preferably contains oxygen and hafnium. Alternatively, the second gate insulating film preferably contains aluminum and oxygen. Alternatively, the second gate insulating film preferably contains silicon and nitrogen. Alternatively, the second gate insulating film preferably includes a first layer and a second layer over the first layer, and each of the first layer and the second layer preferably contains a material selected from hafnium oxide, aluminum oxide, and silicon nitride.

According to one embodiment of the present invention, a novel semiconductor device or a novel memory device can be provided. According to one embodiment of the present invention, a semiconductor device or a memory device with a reduced area can be provided. According to one embodiment of the present invention, a semiconductor device or a memory device with a large storage capacity can be provided. According to one embodiment of the present invention, a semiconductor device or a memory device that operates at high speed can be provided. According to one embodiment of the present invention, a semiconductor device or a memory device with low power consumption can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1A:
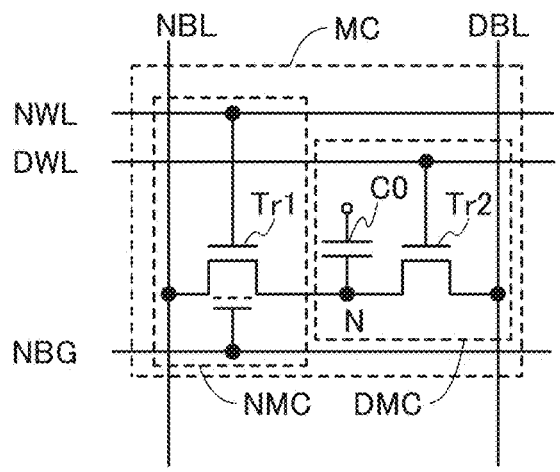
FIGS. 1A to 1C are circuit diagrams illustrating structure examples of a semiconductor device.

Embodiments will be described below with reference to drawings. The embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

Furthermore, in this specification, any of the embodiments below can be combined as appropriate. In the case where some structural examples are given in one embodiment, any of the structure examples can be combined as appropriate.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Unless otherwise specified, an on-state current in this specification refers to a drain current of a transistor in the on state. Unless otherwise specified, the on state of an n-channel transistor means that the voltage difference between its gate electrode and source electrode ($V_{gs}$) is higher than or equal to the threshold voltage ($V_{th}$), and the on state of a p-channel transistor means that $V_{gs}$ is lower than or equal to $V_{th}$. For example, the on-state current of an n-channel transistor sometimes refers to a drain current that flows when $V_{gs}$ is higher than or equal to $V_{th}$. The on-state current of a transistor depends on voltage ($V_{ds}$) between its drain electrode and source electrode in some cases.

Unless otherwise specified, the off-state current in this specification refers to a drain current of a transistor in the off state. Unless otherwise specified, the off state of an n-channel transistor means that $V_{gs}$ is lower than $V_{th}$, and the off state of a p-channel transistor means that $V_{gs}$ is higher than $V_{th}$. For example, the off-state current of an n-channel transistor sometimes refers to a drain current that flows when $V_{gs}$ is lower than $V_{th}$. The off-state current of a transistor depends on $V_{gs}$ in some cases. Thus, "the off-state current of a transistor is lower than $10^{-21}$ A" may mean there is $V_{gs}$ at which the off-state current of the transistor is lower than $10^{-21}$ A.

The off-state current of a transistor depends on $V_{ds}$ in some cases. Unless otherwise specified, the off-state current in this specification may be an off-state current at $V_{ds}$ whose absolute value is 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ used in a semiconductor device or the like including the transistor.

In this specification, terms for describing arrangement, such as "over" and "under", are used for convenience to indicate a positional relation between components with reference to drawings. The positional relation between components is changed as appropriate in accordance with a direction in which the components are described. Therefore, the terms for explaining arrangement are not limited to those used in this specification and may be changed to other terms as appropriate depending on the situation.

Furthermore, in a block diagram in this specification, components are functionally classified and shown by blocks that are independent of each other. However, in an actual circuit and the like, such components are sometimes hard to classify functionally, and there is a case where one circuit is associated with a plurality of functions or a case where a plurality of circuits are associated with one function. Therefore, the segmentation of blocks in a block diagram is not limited by any of the components described in the specification and can be differently determined as appropriate depending on the situation.

In addition, in this specification, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and a potential supplied to a wiring or the like is sometimes changed depending on the reference potential.

In this specification, a switch is in a conductive state (on state) or in a non-conductive state (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of the mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification, an explicit description "X and Y are electrically connected" in some cases means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification, the explicit description "X and Y are electrically connected" is the same as the description "X and Y are connected" in some cases.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a structure example of a semiconductor device of one embodiment of the present invention will be described.

A semiconductor device 10 of one embodiment of the present invention includes a cell array 70. The cell array 70 includes a plurality of memory cells MC. Examples of the memory cell MC in the cell array 70 are described with reference to FIGS. 1A to 1C, FIGS. 2A and 2B, and FIG. 3.

Figure 2A:
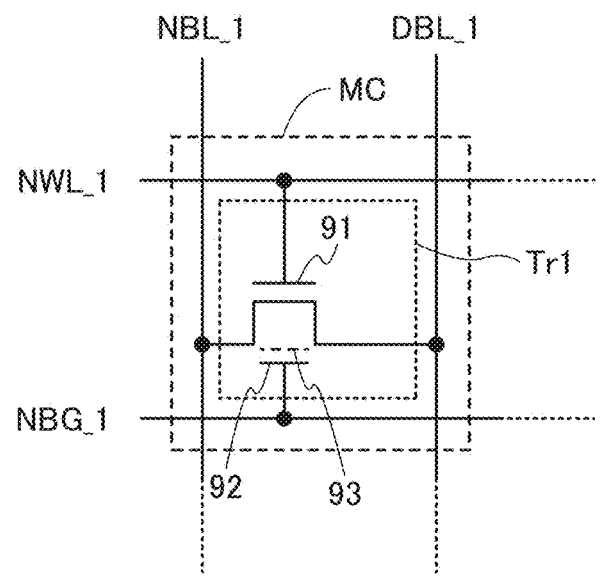
FIGS. 2A and 2B are circuit diagrams illustrating a structure example of a semiconductor device.

The memory cell MC illustrated in FIG. 2A includes a transistor Tr1. The transistor Tr1 preferably includes two upper and lower gate electrodes between which a channel region is positioned. The transistor Tr1 in FIG. 2A includes a gate electrode 91 and a gate electrode 92. A first gate insulating film is positioned between the channel region and the gate electrode 91, and a second gate insulating film is positioned between the channel region and the gate electrode 92. It is preferable that the second gate insulating film easily trap charge as compared with the first gate insulating film. The transistor Tr1 in FIG. 2A includes the second gate insulating film, and the second gate insulating film includes a charge trap layer 93. The threshold value of the transistor Tr1 can be changed by trapping charge in the second gate insulating film, so that the memory cell MC can function as a memory element.

One of a source electrode and a drain electrode of the transistor Tr1 is electrically connected to a wiring NBL_1, the other of the source electrode and the drain electrode thereof is electrically connected to a wiring DBL_1, the gate electrode 91 thereof is electrically connected to a wiring NWL_1, and the gate electrode 92 thereof is electrically connected to a wiring NBG_1.

Figure 2B:
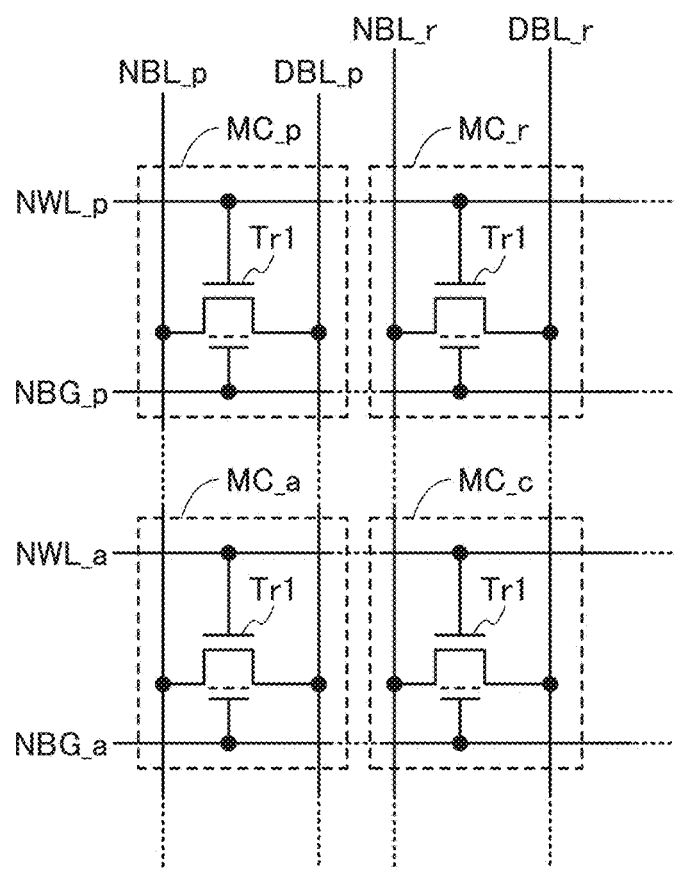

FIG. 2B illustrates an example of the cell array 70. In the cell array 70, the memory cells each of which is illustrated in FIG. 2A are arranged in a matrix. The semiconductor device of one embodiment of the present invention preferably includes n memory cells (memory cells MC_1 to MC_n), k wirings NBL (wirings NBL_1 to NBL_k), k wirings DBL (wirings DBL_1 to DBL_k), m wirings NWL (wirings NWL_1 to NWL_m), m wirings DWL (wirings DWL_1 to DWL_m), and m wirings NBG (wirings NBG_1 to NBG_m). Here, n, k, and m are natural numbers. One of a source electrode and a drain electrode of the transistor Tr1 in the memory cell MC_p is electrically connected to a wiring NBL_p, the other of the source and the drain thereof is electrically connected to a wiring DBL_p, the gate electrode 91 thereof is electrically connected to a wiring NWL_p, and the gate electrode 92 thereof is electrically connected to a wiring NBG_p.

The gate electrode 91 of the transistor Tr1 in the memory cell MC_r adjacent to the memory cell MC_p in the same row is electrically connected to the wiring NWL_p, the gate electrode 92 thereof is electrically connected to the wiring NBG_p, one of a source electrode and a drain electrode thereof is electrically connected to a wiring NBL_r, and the other of the source electrode and the drain electrode thereof is electrically connected to a wiring DBL_r.

One of a source electrode and a drain electrode of the transistor Tr1 in the memory cell MC_a adjacent to the memory cell MC_p in the same column is electrically connected to the wiring NBL_p, the other of the source and the drain thereof is electrically connected to the wiring DBL_p, the gate electrode 91 thereof is electrically connected to a wiring NWL_a, and the gate electrode 92 thereof is electrically connected to a wiring NBG_a.

The gate electrode 91 of the transistor Tr1 in the memory cell MC_c in the same row as the memory cell MC_a and in the same column as the memory cell MC_r is electrically connected to the wiring NWL_a, the gate electrode 92 thereof is electrically connected to the wiring NBG_a, one of a source electrode and a drain electrode thereof is electrically connected to the wiring NBL_r, and the other of the source electrode and the drain electrode thereof is electrically connected to the wiring DBL_r.

Figure 3:
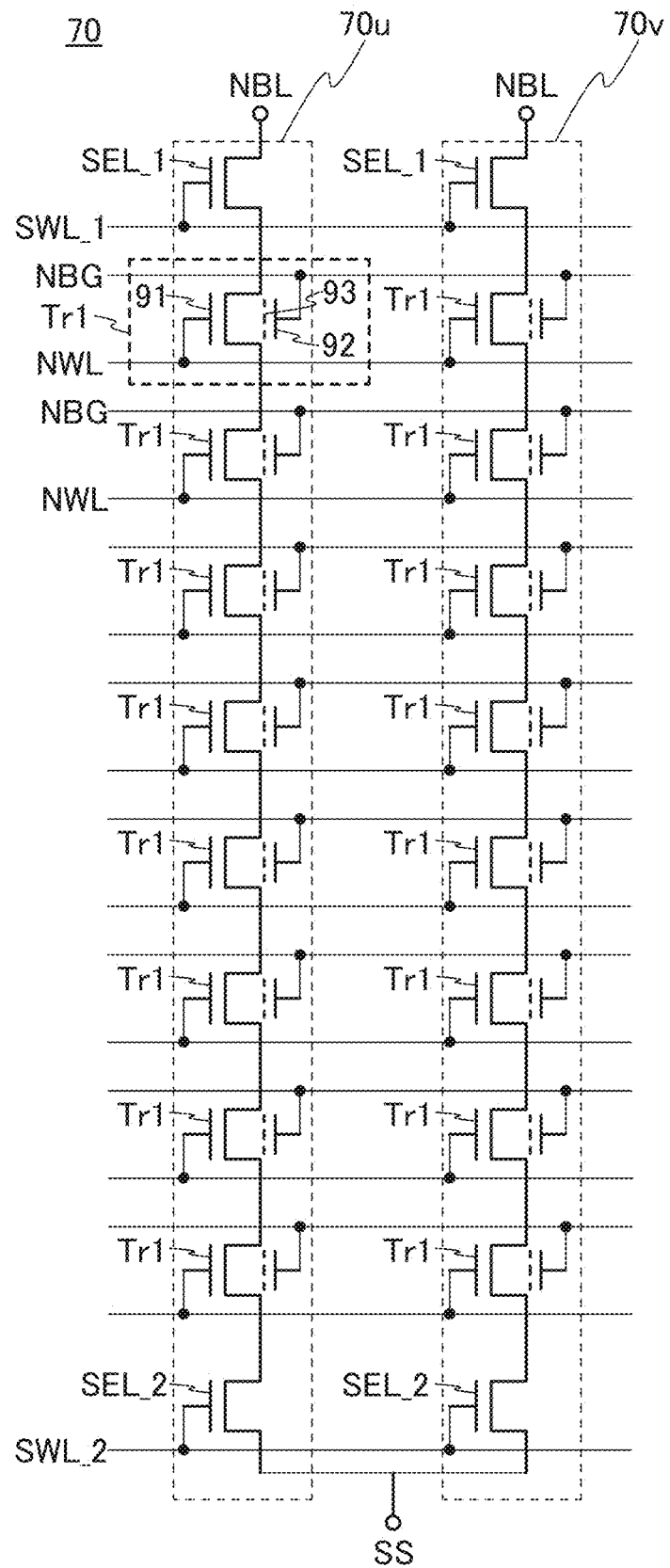
FIG. 3 is a circuit diagram illustrating a structure example of a semiconductor device.

Here, an example in which memory cells are connected to each other is illustrated in FIG. 3. FIG. 3 illustrates an example of the cell array 70 different from the example in FIG. 2B. The cell array 70 in FIG. 3 includes a plurality of blocks. FIG. 3 illustrates a block 70u and a block 70v as two blocks included in the cell array 70. Each block includes the eight transistors Tr1, a transistor SEL_1, and a transistor SEL_2. The eight transistors Tr1 are connected to each other in series. Among the transistors Tr1 which are connected to each other in series, one of a source electrode and a drain electrode of the transistor Tr1 located at one end is electrically connected to one of a source electrode and a drain electrode of the transistor SEL_1 functioning as a selection transistor, and one of a source electrode and a drain electrode of the transistor Tr1 located at the other end is electrically connected to one of a source electrode and a drain electrode of the transistor SEL_2. The gate electrode 91 of each of the transistors Tr1 is electrically connected to the wiring NWL, the gate electrode 92 thereof is electrically connected to the wiring NBG, and the charge trap layer 93 thereof is provided between the source electrode and the gate electrode 92. The other of the source electrode and the drain electrode of the transistor SEL_1 is electrically connected to a terminal NBL, and the other of the source electrode and the drain electrode of the transistor SEL_2 is electrically connected to a terminal SS.

In the cell array 70, the blocks are adjacent to each other, and the wirings NWL and the wirings NBG are shared by the plurality of blocks. For example, the gate electrode 91 of the transistor Tr1 in a first block and the gate electrode 91 of the transistor Tr1 in a second block, which are in the same row, are connected to the same wiring NWL. In addition, for example, the gate electrode 92 of the transistor Tr1 in the first block and the gate electrode 92 of the transistor Tr1 in the second block, which are in the same row, are connected to the same wiring NBG. The plurality of blocks are preferably connected to one common terminal SS. A gate electrode of the transistor SEL_1 in the first block and the gate electrode of the transistor SEL_1 in the second block are connected to the same wiring SWL_1. A gate electrode of the transistor SEL_2 in the first block and a gate electrode of the transistor SEL_2 in the second block are connected to the same wiring SWL_2.

An example when data is written to the cell array 70 is described. A voltage $V_p$ is applied to the wiring NBG connected to the transistor Tr1 which performs writing, and a voltage $V_c$ is applied to the other wirings NBG. A voltage of 0 V is applied to the terminal NBL connected to the block including the transistor Tr1 which performs writing, and the voltage $V_c$ is applied to the other terminal NBL. The voltage $V_p$ is applied to the wiring SWL_1. Here, the threshold value of the transistor Tr1 which performs writing is preferably higher than or equal to $V_c$ and lower than or equal to $V_a$.

An example when data of the cell array 70 is read is described. The voltage $V_c$ is applied to the wiring NWL electrically connected to the transistor Tr1 which performs reading, and the voltage $V_a$ is applied to the other wirings NWL. The voltage $V_c$ is applied to the terminal NBL connected to the block including the transistor Tr1 which performs reading, and a voltage of 0 V is applied to the other terminal NBL. The voltage $V_c$ is applied to the wirings SWL_1 and SWL_2. A voltage of 0 V is applied to the terminal SS.

The memory cell MC of one embodiment of the present invention preferably includes a sub memory cell NMC and a sub memory cell DMC.

FIG. 1A illustrates a structure in which a transistor Tr2 and a capacitor C0 are added to the memory cell MC in FIG. 2A. The memory cell MC illustrated in FIG. 1A includes the sub memory cells NMC and DMC. The sub memory cell NMC includes the transistor Tr1. The sub memory cell DMC includes the transistor Tr2 and the capacitor C0.

One of the source electrode and the drain electrode of the transistor Tr1 in FIG. 1A is electrically connected to the wiring NBL, the other of the source electrode and the drain electrode thereof is electrically connected to one electrode of the capacitor C0, the gate electrode 91 thereof is electrically connected to the wiring NWL, and the gate electrode 92 thereof is electrically connected to the wiring NBG. Here, a node to which the one electrode of the capacitor C0 is connected is referred to as node N for explanation. A ground potential is supplied to the other electrode of the capacitor C0, for example. Here, the ground potential is a potential GND.

One of a source electrode and a drain electrode of the transistor Tr2 in FIG. 1A is electrically connected to the wiring DBL, the other of the source electrode and the drain electrode thereof is electrically connected to the one electrode of the capacitor C0, and a gate electrode thereof is electrically connected to the wiring DWL. The transistor Tr2 in FIG. 1B includes a gate electrode 94 and a gate electrode 95. A first gate insulating film is positioned between a channel region and the gate electrode 94, and a second gate insulating film is positioned between the channel region and the gate electrode 95.

The threshold value of the transistor Tr1 is changed by trapping charge in the charge trap layer 93 of the transistor Tr1, so that data can be stored. In the case where data is stored through the above-described method, there is description "data is stored in the sub memory cell NMC" in some cases. Here, the sub memory cell NMC may be referred to as a nonvolatile memory, for example.

The transistor Tr2 is turned on so that charge is accumulated in the capacitor C0. After that, the transistors Tr2 and Tr1 are turned off, whereby the potential of the node N can be held and data can be stored in the node N. A transistor in which a channel formation region includes a semiconductor with a wider band gap and lower intrinsic carrier density than silicon or the like can have an extremely small off-state current and thus is preferably used as the transistors Tr2 and Tr1. Examples of such a semiconductor material include an oxide semiconductor having a band gap greater than or equal to twice the band gap of silicon. As each of the transistors Tr1 and Tr2, it is preferable to use a transistor including an oxide semiconductor in its channel region. In a transistor including an oxide semiconductor in its channel region, the off-state current can be extremely low. With an extremely low off-state current of the transistors Tr1 and Tr2, a change in the potential held in the node N can be extremely small. Therefore, data can be held in the node N for a long time. Data written in the memory cell MC can be held for an extremely long time and therefore the interval between refresh operations can be long. Specifically, the interval between refresh operations can be an hour or longer. In the case where data is stored through the above-described method, there is description "data is stored in the sub memory cell DMC" in some cases.

With the use of an OS transistor for the memory cell MC, the semiconductor device 10 can be used as a memory device in which data can be held for a long time. Therefore, in the semiconductor device 10, power supply can be stopped for a long time during which data is not written or read. As a result, the power consumption of the semiconductor device 10 can be reduced.

Here, the write speed of data to the sub memory cell DMC is in some cases higher than that of data to the sub memory cell NMC. In some cases, the sub memory cell NMC can store data even after data is read from the sub memory cell DMC.

In the semiconductor device 10 of one embodiment of the present invention, data may be stored in both the sub memory cells NMC and DMC in one memory cell MC. When one memory cell MC stores two pieces of data, the semiconductor device 10 can have increased storage capacity.

Alternatively, in the semiconductor device 10 of one embodiment of the present invention, data may be stored in the sub memory cell NMC in a first period, whereas data may be stored in the sub memory cell DMC in a second period in one memory cell MC.

Further alternatively, the semiconductor device 10 of one embodiment of the present invention may include a first region and a second region. Here, data is written to the sub memory cells NMC in the memory cells MC in the first region, and data is written to the sub memory cells DMC in the memory cells MC in the second region. Note that the ranges of the first region and the second region can be changed by the user of the semiconductor device 10.

Figure 1B:
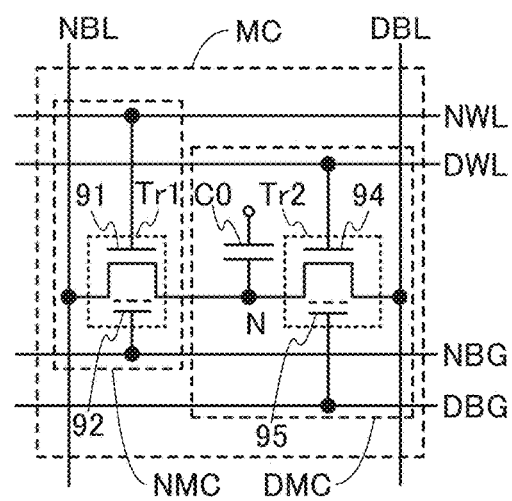

FIG. 1B illustrates the case where the transistor Tr2 includes two gate electrodes, the gate electrode 94 is electrically connected to the wiring DWL, and the gate electrode 95 is electrically connected to the wiring DBG. Here, a potential or signal supplied to the gate electrode 95 may be the same as or different from a potential or signal supplied to the gate electrode 94. By supplying a constant potential to the gate electrode 95, the threshold value of the transistor Tr2 may be controlled, for example. With the gate electrode 95, an on-state current can be increased.

Figure 1C:
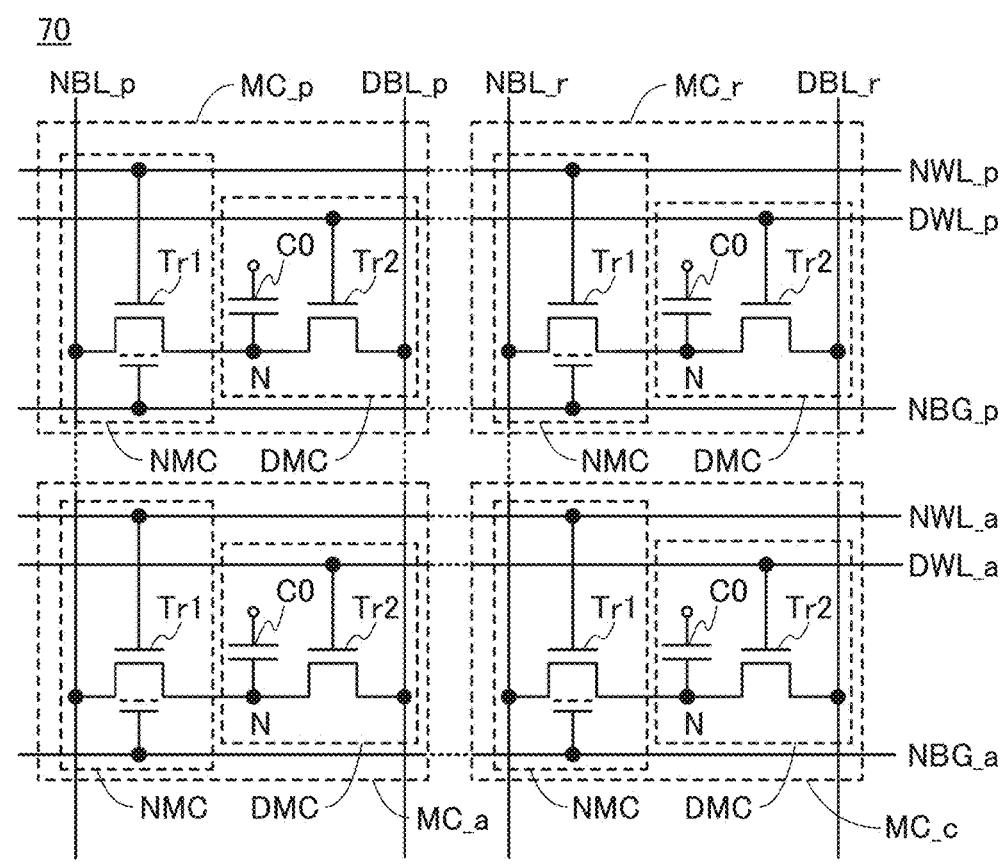

FIG. 1C illustrates an example of the cell array 70 in which the memory cells MC in FIG. 1A are arranged in a matrix.

<Reading Data from Sub Memory Cell NMC>

An example of reading data held in the sub memory cell NMC in the memory cell MC is described below.

Here, a voltage $V_p$, a voltage $-V_c$, and a voltage $-V_e$ described below are voltages whose potential differences from a certain reference potential are $V_p$, $V_c$, and $-V_e$, respectively. A potential GND can be used as the certain reference potential, for example. In this case, a voltage of 0 [V] in some cases refers to the potential GND.

The potential $V_c$ is preferably lower than the potential $V_p$. The potential $-V_e$ is a negative potential. A negative potential in some cases refers to a potential lower than the certain reference potential.

Figure 4:
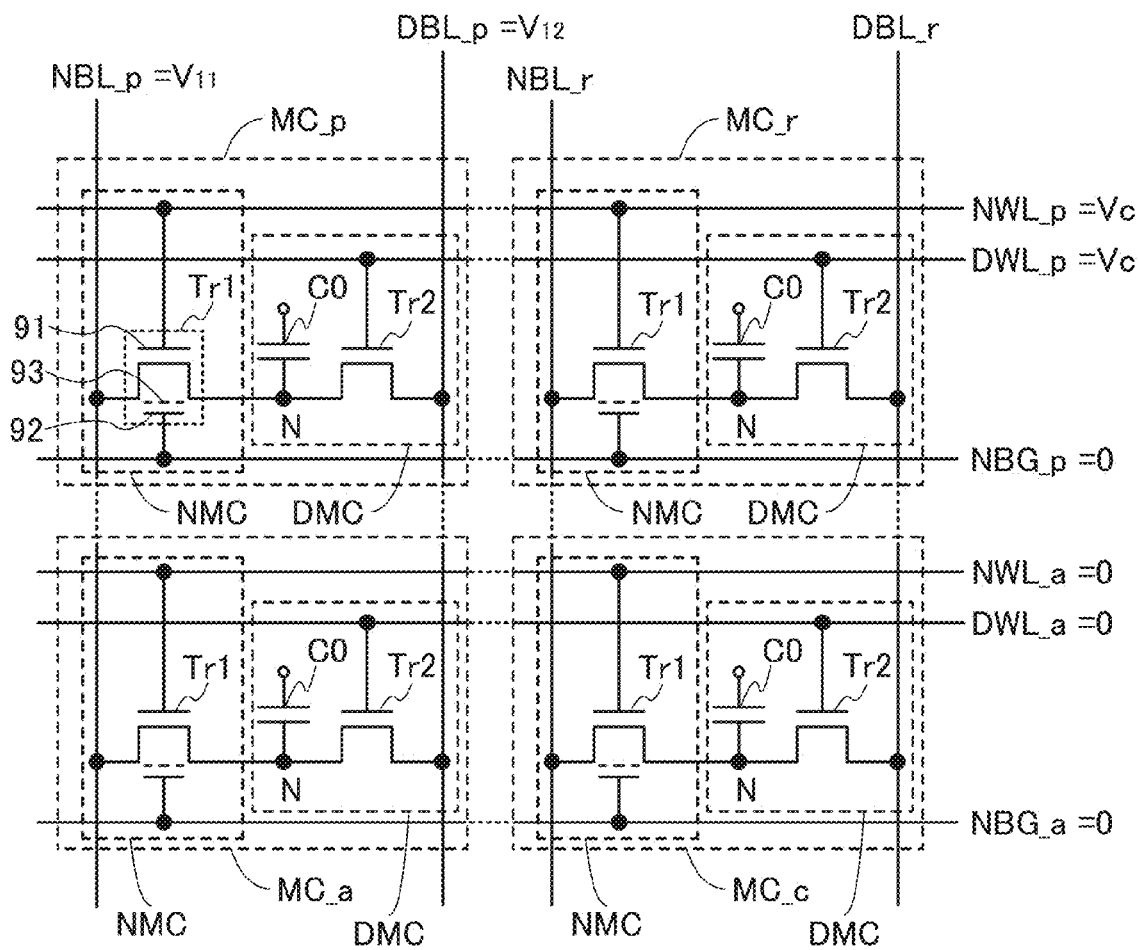
FIG. 4 is a circuit diagram illustrating a structure example of a semiconductor device.

FIG. 4 illustrates an example of a voltage applied to each wiring when data of the sub memory cell NMC is read. Here, for example, data of the sub memory cell NMC in the memory cell MC_p illustrated in FIG. 4 is read. A voltage $V_c$ is applied to the wirings NWL_p and DWL_p. A voltage of 0 [V] is applied to the wiring NBG_p. A potential difference is provided between the wirings NBL_p and DBL_p. For example, a voltage $V_{11}$ is applied to one of the wirings DBL_p and NBL_p and a voltage $V_{12}$ is applied to the other wiring.

Here, for example, the case where the transistors Tr1 and Tr2 are each an n-channel transistor is considered. The voltage $V_{12}$ is set to be higher than the voltage $V_{11}$. The threshold value of the transistor Tr1 after writing is higher than [the voltage $V_c$-the voltage $V_{11}$].

Whether the threshold value of the transistor Tr1 is lower than or equal to [the voltage $V_c$-the voltage $V_{11}$] or higher than [the voltage $V_c$-the voltage $V_{11}$] is determined by measuring current flowing between the wirings NBL_p and DBL_p to determine the state of written data. Here, in the case where the voltage $V_{11}$ is 0 V, for example, the threshold value of the transistor Tr1 is lower than the voltage $V_c$ after data "Low" is written and higher than the voltage $V_c$ after data "High" is written.

It is preferable to amplify the current flowing between the wirings NBL_p and DBL_p because the current is low.

Here, a voltage of 0 [V] is applied to the wiring NWL_a, a wiring DWL_a, and the wiring NBG_a which are connected to memory cells in a row different from the row of memory cell from which data is read, for example, the memory cell MC_a in FIG. 4. Here, the threshold value of the transistor Tr2 is denoted by $V_t$. The voltage $V_{11}$ is preferably higher than $-V_t$, for example. In the case where the voltage $V_{11}$ is lower than or equal to $-V_t$, current flows through the transistor Tr2 because the potential of the gate electrode 95 with respect to the source electrode is $V_{11}$ or higher. For example, the voltage $V_1$ may be 0 [V].

A difference between the voltage $V_c$ and a voltage VDD is preferably 0.3 V or higher, further preferably 0.5 V or higher, still further preferably 0.8 V or higher, yet further preferably 1.5 V or higher, and yet still further preferably 3 V or higher. The voltage VDD is in some cases used as power supply of the circuits in the semiconductor device 10.

<Writing Data to Sub Memory Cell NMC>

Next, the case where data "High" is written to the sub memory cell NMC in the memory cell MC is described.

Figure 5:
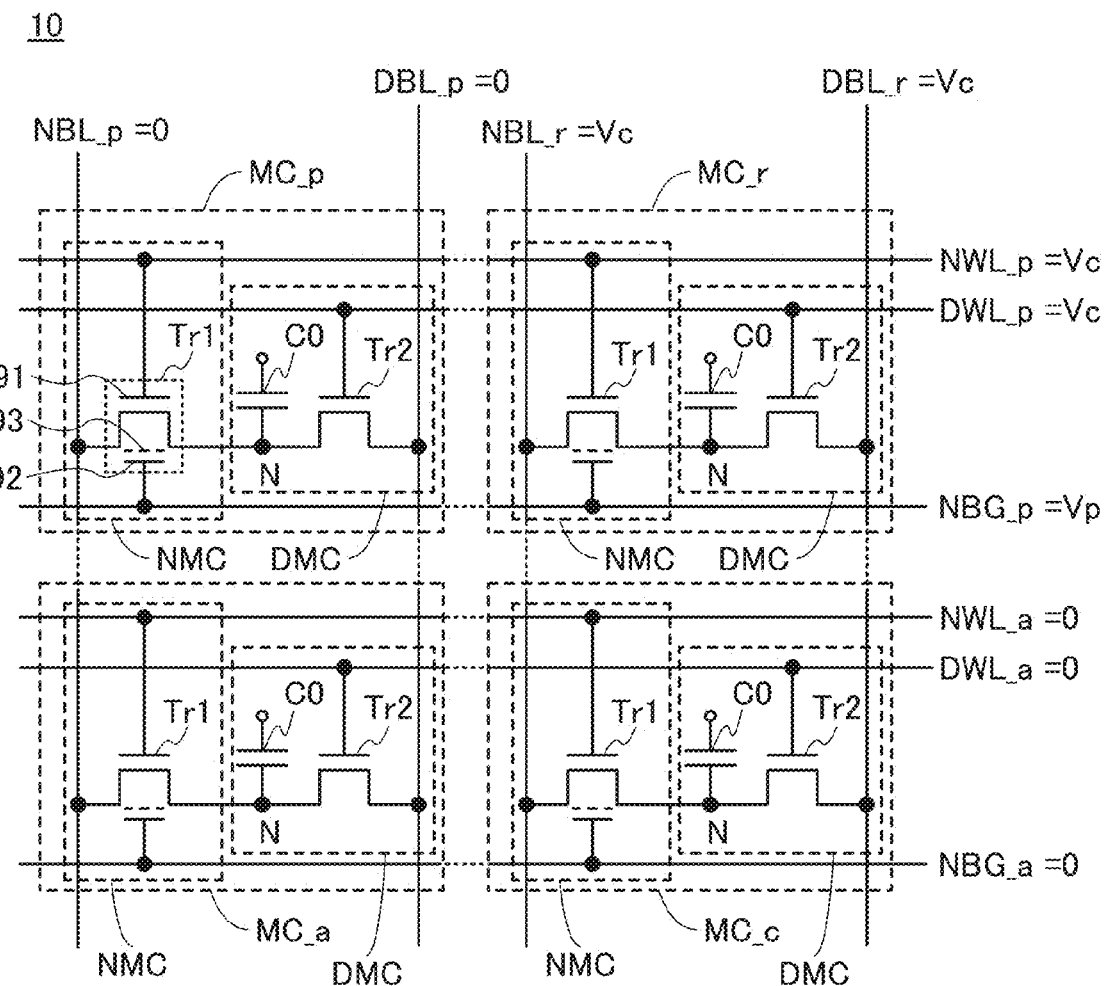
FIG. 5 is a circuit diagram illustrating a structure example of a semiconductor device.

FIG. 5 illustrates an example of a voltage applied to each wiring when data is written to the sub memory cell NMC. First, a signal is input to a wiring connected to a memory cell to which data is written. Here, for example, data is written to the sub memory cell NMC in the memory cell MC_p illustrated in FIG. 5. Charge is trapped in the second gate insulating film provided between the gate electrode 92 and the channel region by providing a potential difference between the source electrode and the gate electrode 92 of the transistor Tr1 to change the threshold value of the transistor Tr1.

Here, a potential is supplied to each wiring so that a potential difference between the source electrode and the gate electrode 92 of the transistor Tr1 is $V_p$. A voltage of 0 [V] is applied to the wirings NBL_p and DBL_p. A voltage $V_c$ is applied to the wirings NWL_p and DWL_p. A voltage $V_p$ is applied to the wiring NBG_p. The potential difference between the source electrode and the gate electrode 92 of the transistor Tr1 is $V_p$.

The voltage $V_c$ is applied to the wirings NBL_r and DBL_r. In a memory cell in the same row as the memory cell to which data is written and in a column which is not selected, for example, the memory cell MC_r in FIG. 5, the potential of the gate electrode 92 with respect to the source electrode of the transistor Tr1 is $V_p-V_c$. Here, $V_p-V_c$ is preferably 0.8 times or less and further preferably 0.5 times or less $V_p$ for example. That is, $V_c$ is preferably 0.2 times or more and further preferably 0.5 times or more $V_p$, for example. In some cases, $V_p$ is 3 times or more, 5 times or more, or 10 times or more $V_c$.

A voltage of 0 [V] is applied to the wirings NWL_a, DWL_a, and NBG_a. In a memory cell in the same column as the memory cell to which data is written and in a row which is not selected, for example, the memory cell MC_a in FIG. 5, the potential of the gate electrode 92 with respect to the source electrode of the transistor Tr1 is 0 [V].

In a memory cell in a row and a column different from the row and the column of the memory cell to which data is written, for example, the memory cell MC_c in FIG. 5, the potential of the gate electrode 92 with respect to the source electrode of the transistor Tr1 is $V_c$.

<Erasing Data from Sub Memory Cell NMC>

Next, the case where data "Low" is written to the sub memory cell NMC in the memory cell MC is described. Here, writing of data "Low" is expressed as "data is erased" in some cases.

Figure 6:
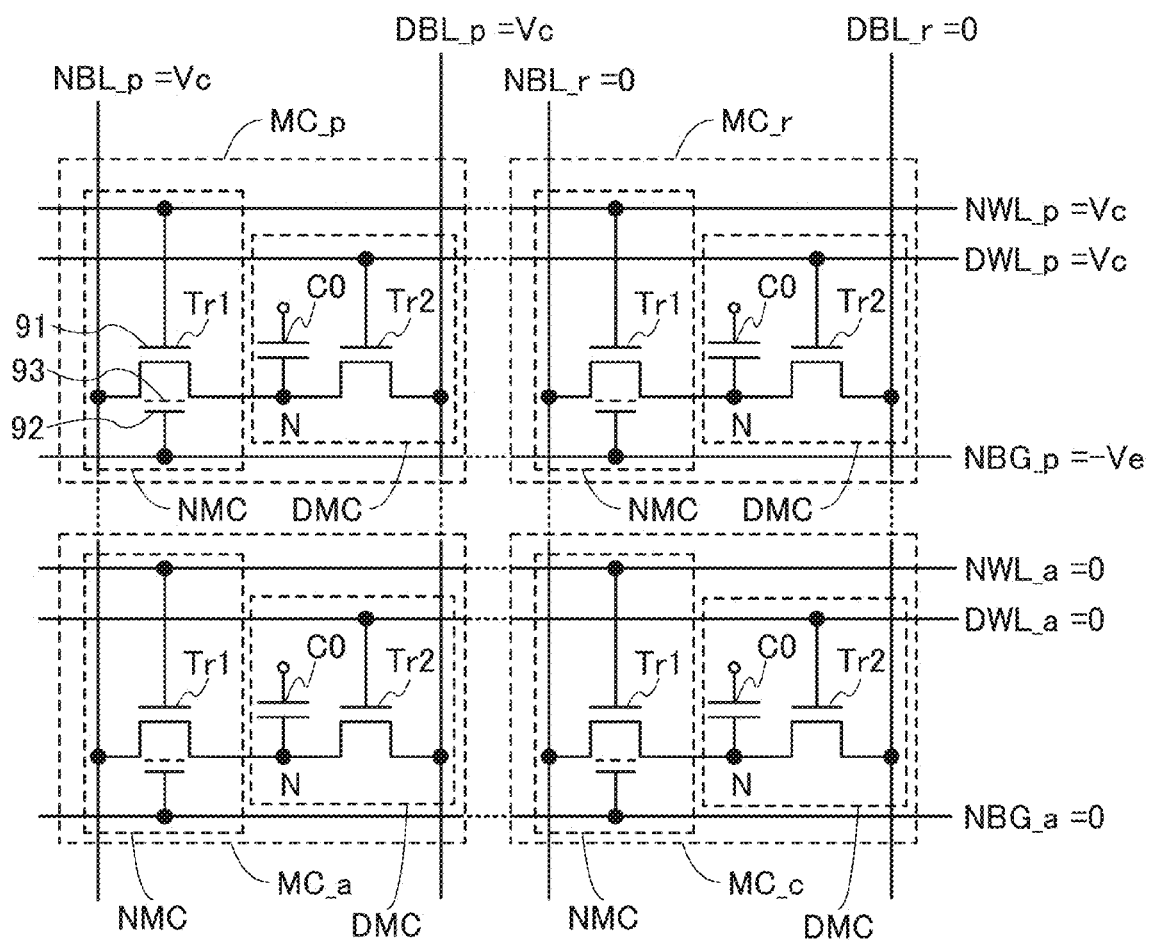
FIG. 6 is a circuit diagram illustrating a structure example of a semiconductor device.

FIG. 6 illustrates an example of a voltage applied to each wiring when data is erased from the sub memory cell NMC. First, a signal is input to a wiring connected to a memory cell from which data is erased. Here, for example, data of the sub memory cell NMC in the memory cell MC_p illustrated in FIG. 6 is erased. For example, the polarity of the potential of the gate electrode 92 with respect to the source electrode is opposite to that when the data "High" is written. Accordingly, the charge trapped in the second gate insulating film is released and thus the threshold value can be changed. Alternatively, charge whose polarity is opposite to that of the charge trapped when the data "High" is written may be injected. Here, heat treatment may be performed at a temperature higher than or equal to 40° C. and lower than or equal to 300° C. so that the charge is released more easily. The charge may be released by ultraviolet irradiation.

A voltage $V_c$ is applied to the wirings NBL_p and DBL_p. A voltage $V_c$ is applied to the wirings NWL_p and DWL_p. A voltage $-V_e$ is applied to the wiring NBG_p. The potential difference between the source electrode and the gate electrode 92 of the transistor Tr1 is $-V_e-V_c$.

A voltage of 0 [V] is applied to the wirings NBL_r and DBL_r. In a memory cell in the same row as the memory cell from which data is erased and in a column which is not selected, for example, the memory cell MC_r in FIG. 6, the potential of the gate electrode 92 with respect to the source electrode of the transistor Tr1 is $-V_e$. That is, $V_e$ is preferably 0.8 times or less and further preferably 0.5 times or less $[V_e+V_e]$, for example. That is, $V_c$ is preferably 0.25 times or more and further preferably 1 times or more $V_e$, for example. In some cases, $V_e$ is 3 times or more, 5 times or more, or 10 times or more $V_c$.

A voltage of 0 [V] is applied to the wirings NWL_a, DWL_a, and NBG_a. In a memory cell in the same column as the memory cell from which data is erased and in a row which is not selected, for example, the memory cell MC_a in FIG. 6, the potential of the gate electrode 92 with respect to the source electrode of the transistor Tr1 is $-V_c$.

A voltage of 0 [V] is applied to the wirings NBL_r and DBL_r. In a memory cell in a row and a column different from the row and the column of the memory cell from which data is erased, for example, the memory cell MC_c in FIG. 6, the potential of the gate electrode 92 with respect to the source electrode of the transistor Tr1 is 0 [V].

Writing of data "Low" is expressed as "data is erased" in some cases. Data may be erased in each individual memory cell, or data may be erased in a plurality of memory cells at a time.

Data "High" may be written more than once. The threshold value of the transistor Tr1 can be changed gradually by writing the data more than once. For example, the case where the threshold value is changed to $V_a$ after first writing and $V_b$ after second writing is considered. The threshold value when data is read can be determined by changing the voltages applied to the wirings NWL_p, NBL_p, and DBL_p. In such a manner, multilevel data can be written to one memory cell.

<Circuit Configuration Example 1 of Semiconductor Device>

Figure 7:
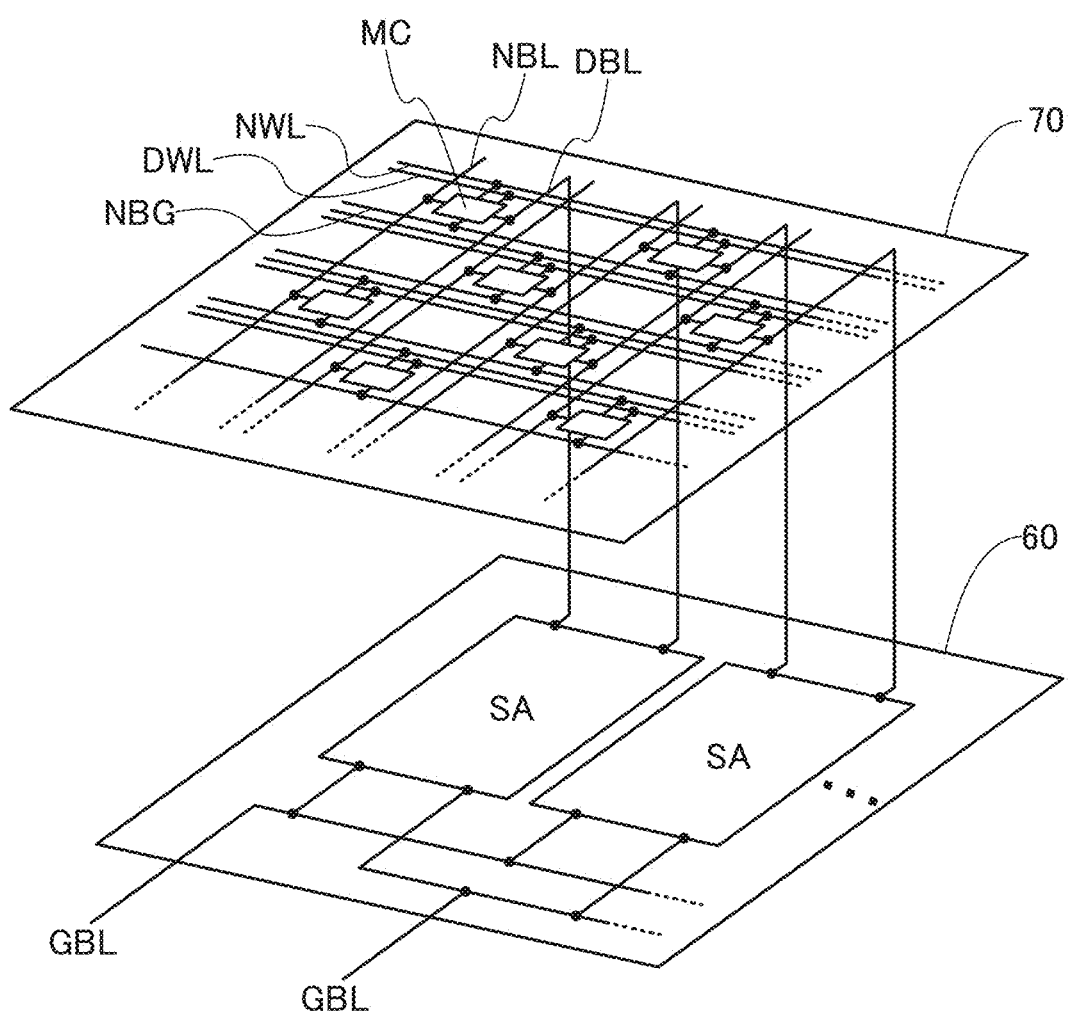
FIG. 7 illustrates a structure example of a semiconductor device.
Figure 8:
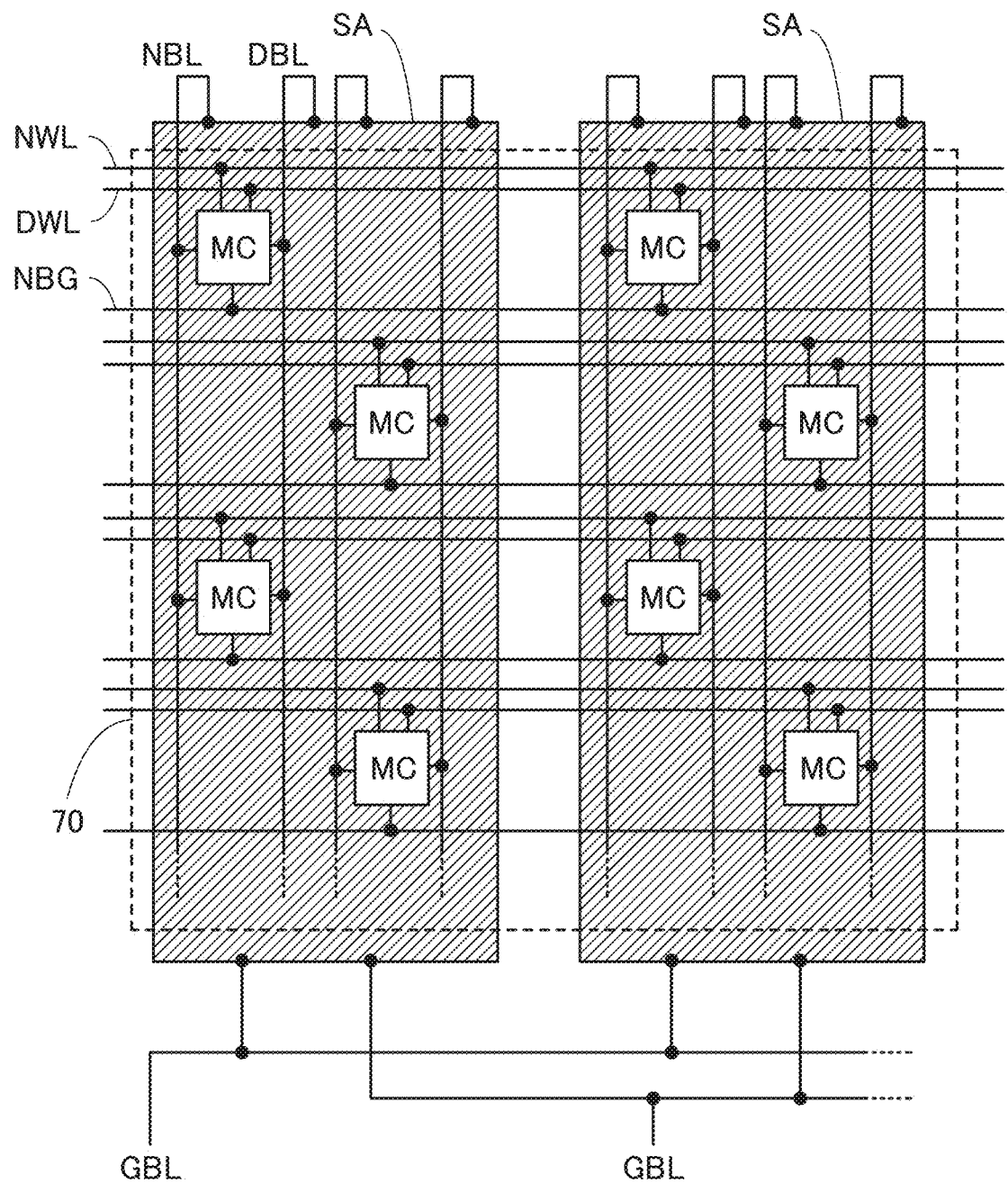
FIG. 8 is a top view illustrating a structure example of a semiconductor device.

FIG. 7 illustrates an example of a circuit configuration of the semiconductor device 10. FIG. 8 is a top view of the semiconductor device 10 in FIG. 7.

The semiconductor device 10 includes the cell array 70 and a sense amplifier circuit 60. The cell array 70 includes a plurality of memory cells MC. The memory cell MC includes the sub memory cells NMC and DMC. Each of the memory cells MC is connected to the wirings NWL, DWL, NBG, NBL, and DBL. The sub memory cells DMC are selected according to a potential supplied to the wiring DWL, and a potential corresponding to data to be written to the sub memory cells DMC is supplied to the wiring DBL (hereinafter, the potential is also referred to as writing potential); in this manner, data is written to the sub memory cells DMC. Here, the case where the cell array 70 includes the memory cells MC arranged in a matrix of i rows and j columns (i and j are natural numbers of 2 or more) is shown. Therefore, in the cell array 70, i wirings NWL, i wirings DWL, i wirings NBG, j wirings NBL, and j wirings DBL are provided.

The sense amplifier circuit 60 is connected to a plurality of wirings DBL and a plurality of wirings GBL. The sense amplifier circuit 60 may be connected to the plurality of wirings NBL. The sense amplifier circuit 60 has a function of amplifying a signal that is input and controlling output of the amplified signal. Specifically, the sense amplifier circuit 60 has a function of amplifying the potentials of the wirings DBL (hereinafter, the potentials are also referred to as reading potentials), which correspond to data stored in the memory cells MC, and outputting them to the wirings GBL at a predetermined timing. Since the reading potentials are amplified by the sense amplifier circuit 60, data can be surely read even in the case where a potential read from the memory cell MC is extremely low. Furthermore, since output of the amplified potentials to the wirings GBL is controlled, each of the wirings GBL can be shared. The sense amplifier circuit 60 has a function of amplifying current flowing between the wirings NBL and DBL, which corresponds to data stored in the memory cells MC, and outputting it to the wirings GBL at a predetermined timing.

Figure 13:
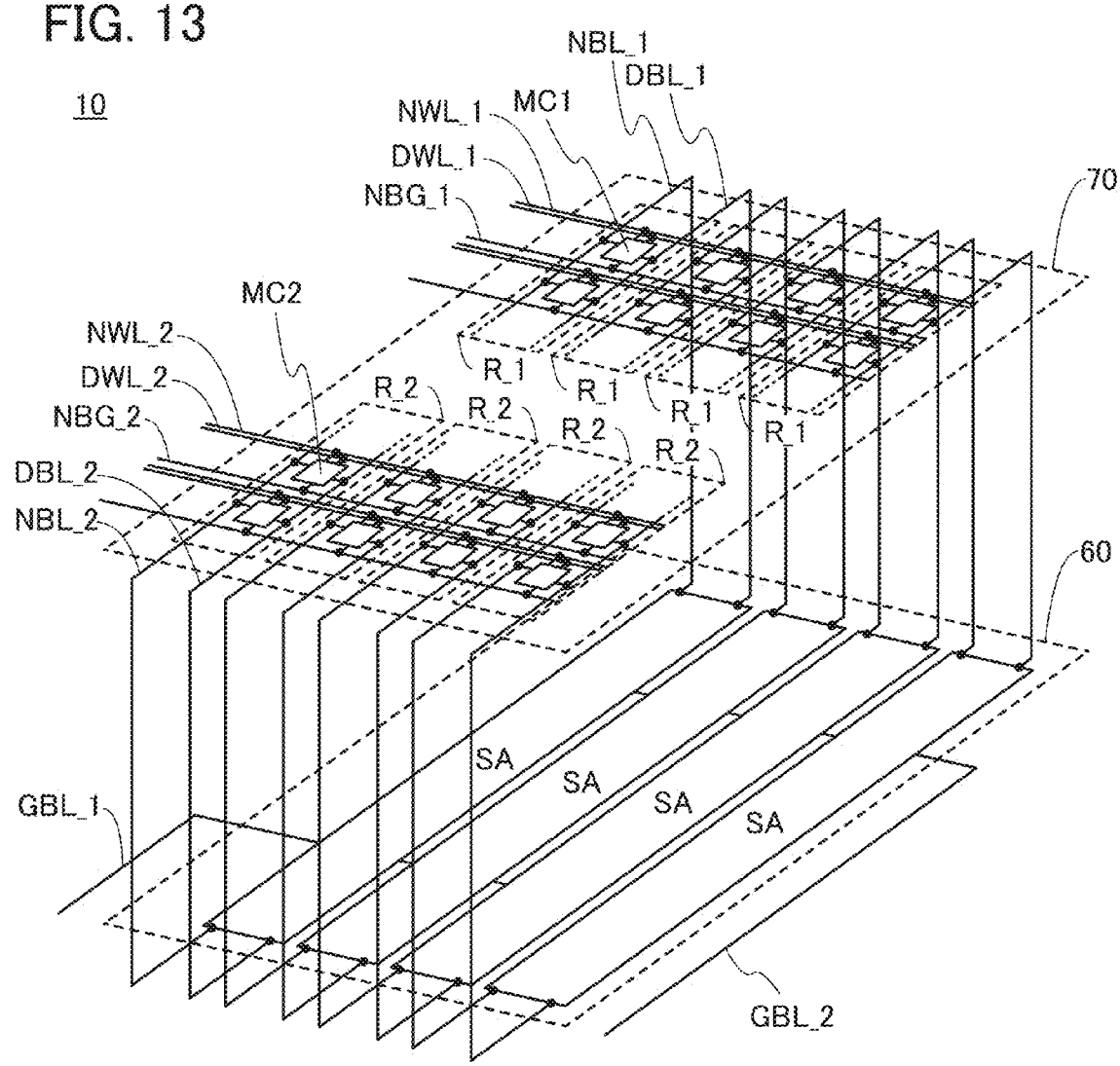
FIG. 13 illustrates a structure example of a semiconductor device.

In one embodiment of the present invention, as a layout type of the cell array 70, a folded-type layout, an open-type layout, or the like can be used. In the case of a folded-type layout, noise generated in a reading potential which is output to the wiring DBL can be reduced owing to a change in the potential of the wiring DWL. On the other hand, in the case of an open-type layout, the density of the memory cells MC can be higher than that in the case of a folded-type layout, and thus the area of the cell array 70 can be reduced. FIG. 13 illustrates a structure example of the cell array 70 in the case of a folded-type layout. In the cell array 70 illustrated in FIG. 13, the memory cell MC connected to one wiring DBL and the memory cell MC adjacent to the memory cell MC connected to one wiring DBL are not connected to the same wiring DWL.

The sense amplifier SA has a function of amplifying a difference between a reference potential and a reading potential that is supplied to the wiring DBL and holding the amplified potential difference. Furthermore, the sense amplifier SA has a function of controlling the output of the amplified potential to the wiring GBL. Here, the sense amplifier SA is connected to two wirings DBL and two wirings GBL.

In one embodiment of the present invention, the memory cells MC and the sense amplifiers SA are formed in different layers. In particular, the memory cells MC are preferably formed over the sense amplifiers SA. At least one memory cell MC is preferably positioned so as to overlap with the sense amplifier SA, in which case the area of the semiconductor device 10 can be smaller than that when the memory cells MC and the sense amplifiers SA are positioned in the same layer. Accordingly, the storage capacity per unit area of the semiconductor device 10 can be increased. When all the memory cells MC are positioned so as to overlap with the sense amplifier SA, the area of the semiconductor device 10 can be further reduced. The memory cells MC may be positioned so as to overlap with one sense amplifier SA; alternatively, the memory cells MC may be positioned so as to overlap with the plurality of sense amplifiers SA. Note that there is no particular limitation on the number of the memory cells MC in the cell array 70. For example, the number thereof can be larger than or equal to 128 and smaller than or equal to 512.

In addition, because the memory cells MC and the sense amplifiers SA are stacked, the length of the wirings DBL connecting the memory cells MC to the sense amplifiers SA can be reduced. Consequently, the wiring resistance of the wirings DBL can be low, and a reduction in the power consumption and an increase in the operation speed of the semiconductor device 10 can be achieved. Furthermore, the areas of the capacitors provided in the memory cells MC can be small; thus, the sizes of the memory cells MC can be small.

Next, a more specific configuration example of the semiconductor device 10 is described with reference to FIG. 9.

Figure 9:
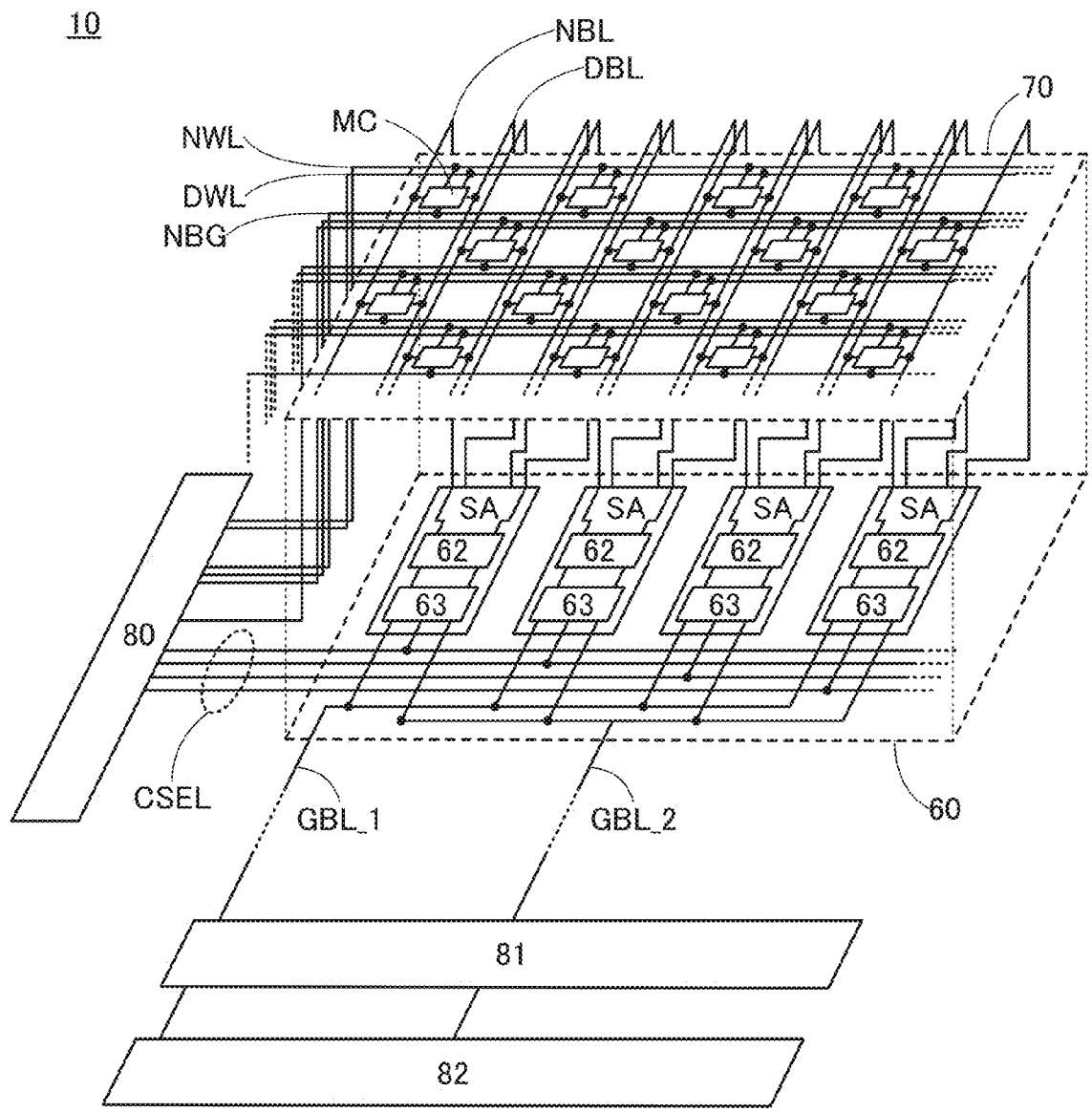
FIG. 9 illustrates a structure example of a semiconductor device.

The semiconductor device 10 illustrated in FIG. 9 has the configuration of the semiconductor device 10 illustrated in FIG. 7, and in addition includes a driver circuit 80, a main amplifier 81, and an input/output circuit 82.

The main amplifier 81 is connected to the sense amplifier circuit 60 and the input/output circuit 82. The main amplifier 81 has a function of amplifying a signal input thereto. Specifically, the main amplifier 81 has a function of amplifying the potentials of the wirings GBL and outputting them to the input/output circuit 82. Note that the main amplifier 81 is not necessarily provided.

The input/output circuit 82 has a function of outputting the potentials of the wirings GBL or the potentials output from the main amplifier 81 as reading data to the outside.

The driver circuit 80 is connected to the memory cells MC through the wirings WL. The driver circuit 80 has a function of supplying a signal for selecting the memory cells MC to which data is written (hereinafter, the signal is also referred to as a write word signal) to the wiring WL. Note that the driver circuit 80 can be formed using a decoder or the like.

The semiconductor device 10 includes a plurality of memory cells MC and sense amplifiers SA electrically connected to the plurality of memory cells MC. The sense amplifier circuit 60 includes a plurality of sense amplifiers SA. The sense amplifiers SA are connected to the memory cells MC through the wirings BL. Here, a structure in which two adjacent wirings BL (a wiring BL_1 and a wiring BL_2) are connected to the same sense amplifier SA is shown. The sense amplifier SA includes an amplifier circuit 62 and a switch circuit 63.

The amplifier circuit 62 has a function of amplifying the potential of the wiring BL. Specifically, the amplifier circuit 62 has a function of amplifying a difference between the potential of the wiring BL and a reference potential and holding the amplified potential difference. For example, in the case where the potential of the wiring BL_1 is amplified, a difference between the potential of the wiring BL_1 and the potential of the wiring BL_2 (i.e., a reference potential) is amplified. In the case where the potential of the wiring BL_2 is amplified, a difference between the potential of the wiring BL_1 (i.e., a reference potential) and the potential of the wiring BL_2 is amplified.

The switch circuit 63 has a function of determining whether the amplified potential of the wiring BL is output to the wiring GBL. In the example shown here, the switch circuit 63 is connected to two wirings GBL (a wiring GBL_1 and a wiring GBL_2). The switch circuit 63 has a function of controlling electrical connection between the wirings BL_1 and GBL_1 and electrical connection between the wirings BL_2 and GBL_2. The switch circuit 63 is connected to one of a plurality of wirings CSEL, and the operation of the switch circuit 63 is controlled on the basis of a signal supplied to the wiring CSEL from the driver circuit 80. The semiconductor device 10 is capable of selecting a signal to be output to the outside with the use of the switch circuits 63 and the wirings CSEL. Therefore, the input/output circuit 82 does not need to select a signal with the use of a multiplexer or the like, and thus can have a simple circuit configuration and a small occupied area.

The switch circuits 63 and the wirings CSEL are preferably positioned so as to overlap with the cell array 70 as illustrated in FIG. 9. Specifically, the switch circuits 63 and the wirings CSEL are preferably positioned so as to overlap with the memory cells MC. Accordingly, an increase in the area of the semiconductor device 10 can be reduced, and the sense amplifier circuit 60 can have a function of selecting an output signal.

Note the here, the wirings WL and CSEL are connected to the driver circuit 80; however, the wirings WL and CSEL may be connected to different driver circuits. In this case, the potentials of the wirings WL and CSEL are controlled by different driver circuits.

Note that the number of the wirings GBL is not particularly limited, and may be a given number smaller than the number of the wirings BL (i.e., j) in the cell array 70. For example, in the case where the number of the wirings BL connected to one wiring GBL is k (k is an integer of 2 or more), the number of the wirings GBL is j/k.

Figure 19A:
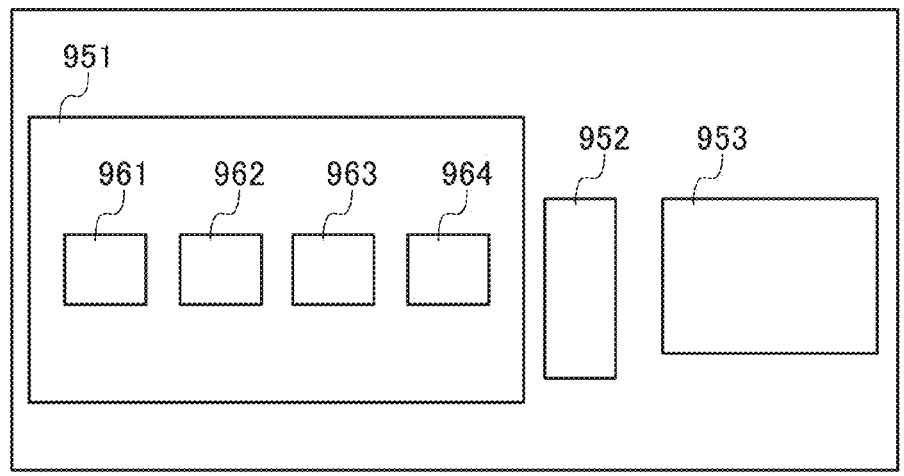
FIGS. 19A and 19B illustrate a configuration example of a circuit.

FIG. 19A illustrates a configuration example of the driver circuit 80. The driver circuit 80 preferably includes a first driver circuit 951, a circuit 952, and a second driver circuit 953. The circuit 952 has a function of raising or lowering an input voltage. For example, the circuit 952 preferably includes one or more of step-up circuits and one or more of step-down circuits. The voltage such as $V_c$, $V_p$, or $-V_e$ can be generated by raising or lowering a power supply voltage such as the voltage VDD with the circuit 952.

The first driver circuit 951 preferably includes a decoder 961, a control circuit 962, a level shifter 963, and a buffer circuit 964.

Figure 19B:
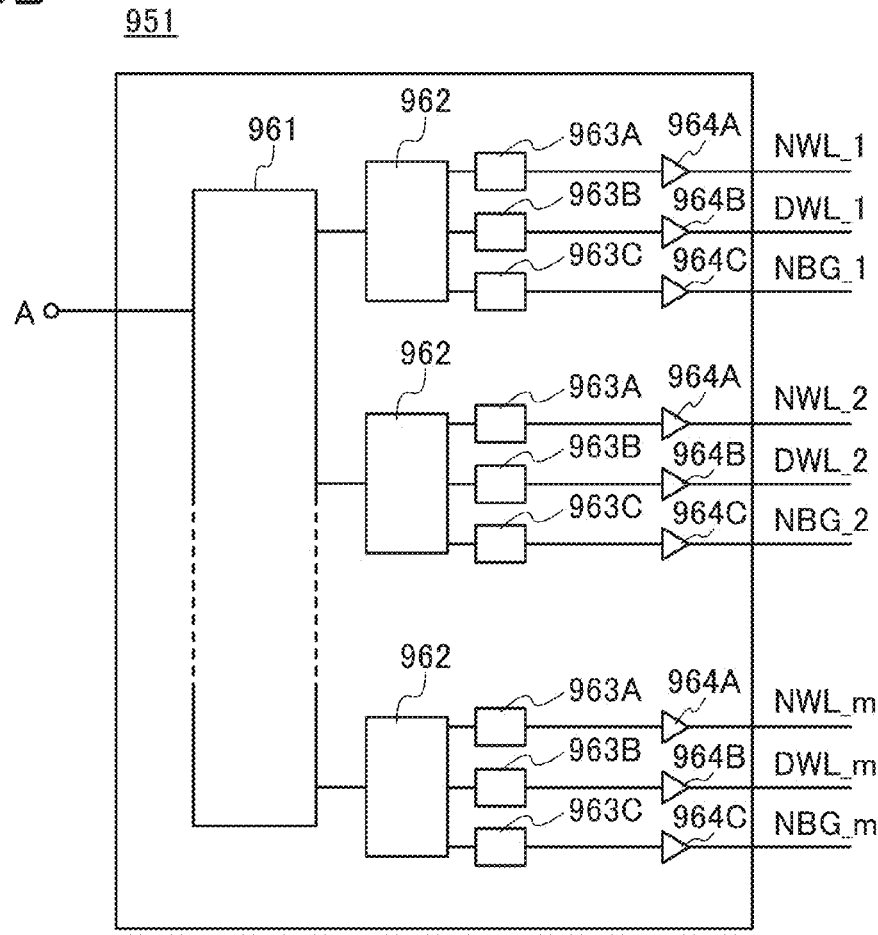

An example of connection of the decoder 961, the control circuit 962, the level shifter 963, and the buffer circuit 964 in the first driver circuit 951 is illustrated in FIG. 19B. An address selection signal line A is connected to the decoder 961. The control circuit 962 is connected to the decoder 961, and level shifters 963A, 963B, and 963C are connected to the control circuit 962. Output from the level shifters 963A, output from the level shifters 963B, and output from the level shifters 963C are connected to the wirings NWL, DWL, and NBG through buffer circuits 964A, 964B, and 964C, respectively. The connection in FIG. 19B is an example, and another connection may be employed. For example, a control circuit may be connected between the level shifters and the buffer circuits.

An input signal and a voltage generated in the circuit 952 are input to the level shifters 963A, 963B, and 963C. The level shifters convert the potentials input therein into objective potentials (e.g., $V_p$, $-V_e$, $V_c$, or 0 [V]) and output the potentials. For example, a potential input into the level shifter 963C is converted into an objective potential and applied to the wiring NBG_1 through the buffer circuit 964C. The level shifter 963C outputs $V_p$, $V_c$, and 0 as a first potential, a second potential, and a third potential, respectively. The potential supplied to the wiring NBG_1 is selected in accordance with an operation such as writing, erasing, or reading performed on the sub memory cell NMC.

Figure 20A:
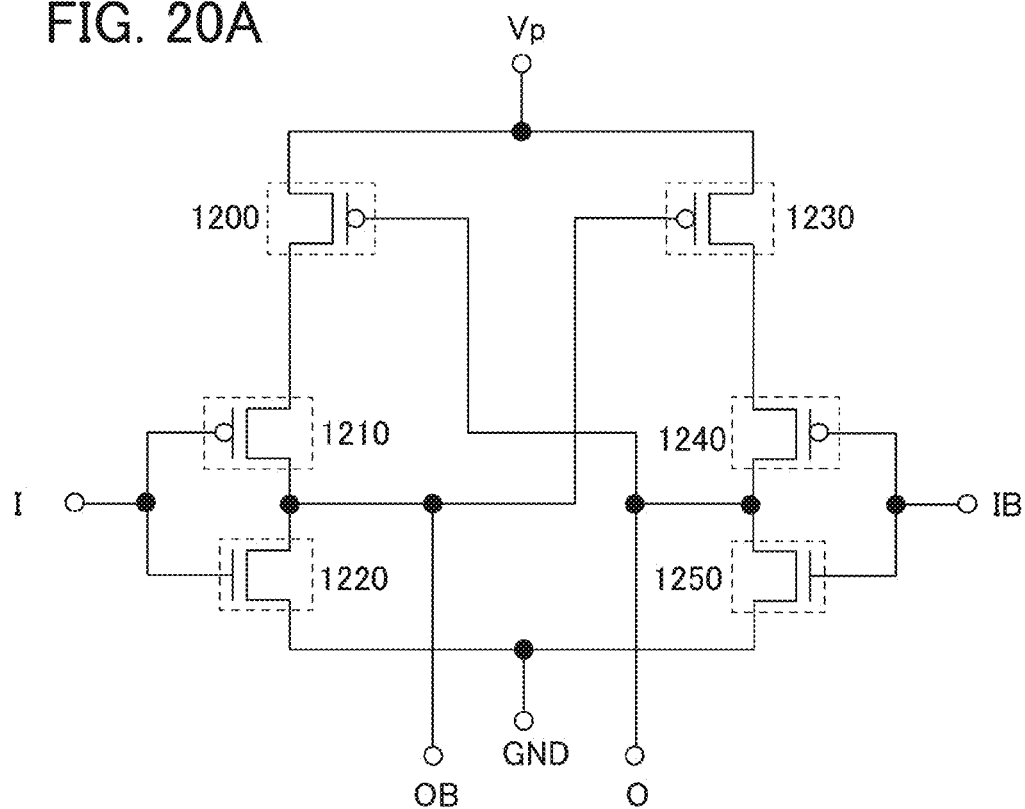
FIGS. 20A and 20B are each a circuit diagram illustrating one embodiment of the present invention.
Figure 20B:
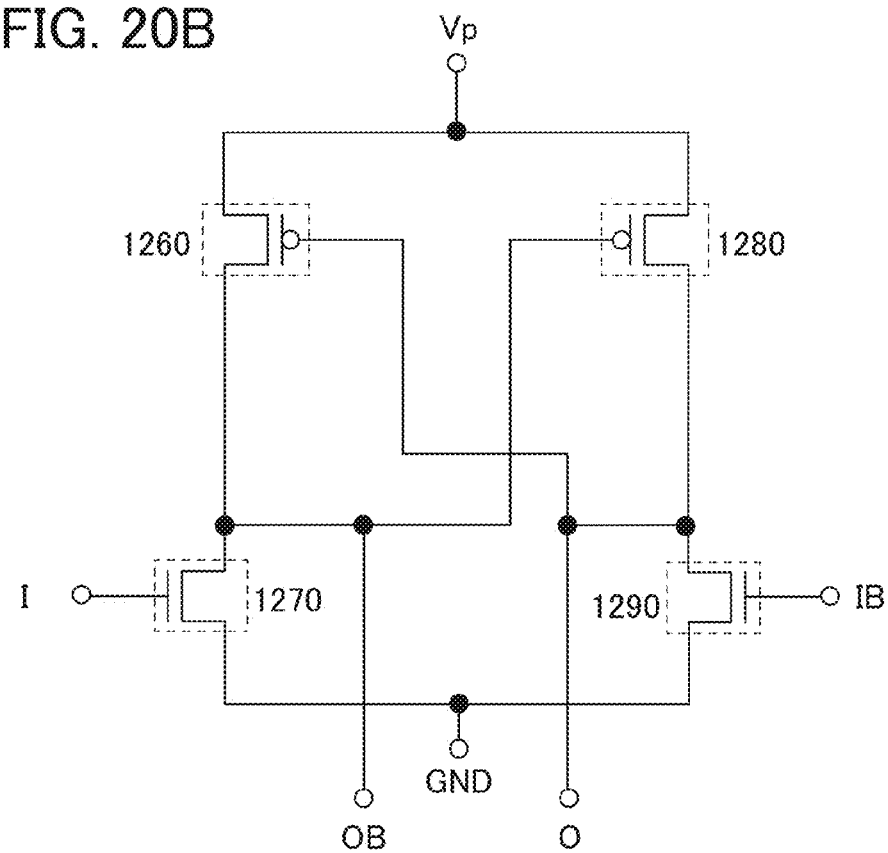

FIGS. 20A and 20B illustrate examples of a step-up level shifter. The level shifter illustrated in FIG. 20A has the following structure. A source terminal of a first p-type transistor 1200 and a source terminal of a third p-type transistor 1230 are both electrically connected to a power source, for example, the circuit 952. Here, for example, the case where a voltage $V_p$ is output from the step-up circuit is considered. A drain terminal of the first p-type transistor 1200 is electrically connected to a source terminal of a second p-type transistor 1210, and a drain terminal of the third p-type transistor 1230 is electrically connected to a source terminal of a fourth p-type transistor 1240. A drain terminal of the second p-type transistor 1210 is electrically connected to a drain terminal of a first n-type transistor 1220 and a gate terminal of the third p-type transistor 1230, and a drain terminal of the fourth p-type transistor 1240 is electrically connected to a drain terminal of a second n-type transistor 1250 and a gate terminal of the first p-type transistor 1200. GND (=0 V) is supplied to both a source terminal of the first n-type transistor 1220 and a source terminal of the second n-type transistor 1250.

In FIG. 20A, an input signal (I) is input to a gate terminal of the second p-type transistor 1210 and a gate terminal of the first n-type transistor 1220, and an inverted signal (IB) of the input signal is input to a gate terminal of the fourth p-type transistor 1240 and a gate terminal of the second n-type transistor 1250. An output signal (O) is taken out from the drain terminal side of the fourth p-type transistor 1240. In addition, an inverted signal (OB) of the output signal can be taken out from the drain terminal side of the second p-type transistor 1210.

In FIG. 20A, when a high-level potential is input to the input signal (I), the output signal (O) outputs a high-level potential (here, the voltage $V_p$), and when a low-level potential is input to the input signal (I), the output signal (O) outputs a low-level potential (here, the voltage GND).

FIG. 20B illustrates an example of a step-up level shifter different from the level shifter in FIG. 20A. The level shifter illustrated in FIG. 20B has the following structure. A source terminal of a first p-type transistor 1260 and a source terminal of a second p-type transistor 1280 are both electrically connected to a power source, for example, the above-described step-up circuit. Here, for example, the case where a voltage $V_p$ is output from the step-up circuit is considered. A drain terminal of a first n-type transistor 1270 is electrically connected to a drain terminal of the first p-type transistor 1260 and a gate terminal of the second p-type transistor 1280, and a drain terminal of a second n-type transistor 1290 is electrically connected to a drain terminal of the second p-type transistor 1280 and a gate terminal of the first p-type transistor 1260. GND (=0 V) is supplied to both a source terminal of the first n-type transistor 1270 and a source terminal of the second n-type transistor 1290.

Figure 21A:
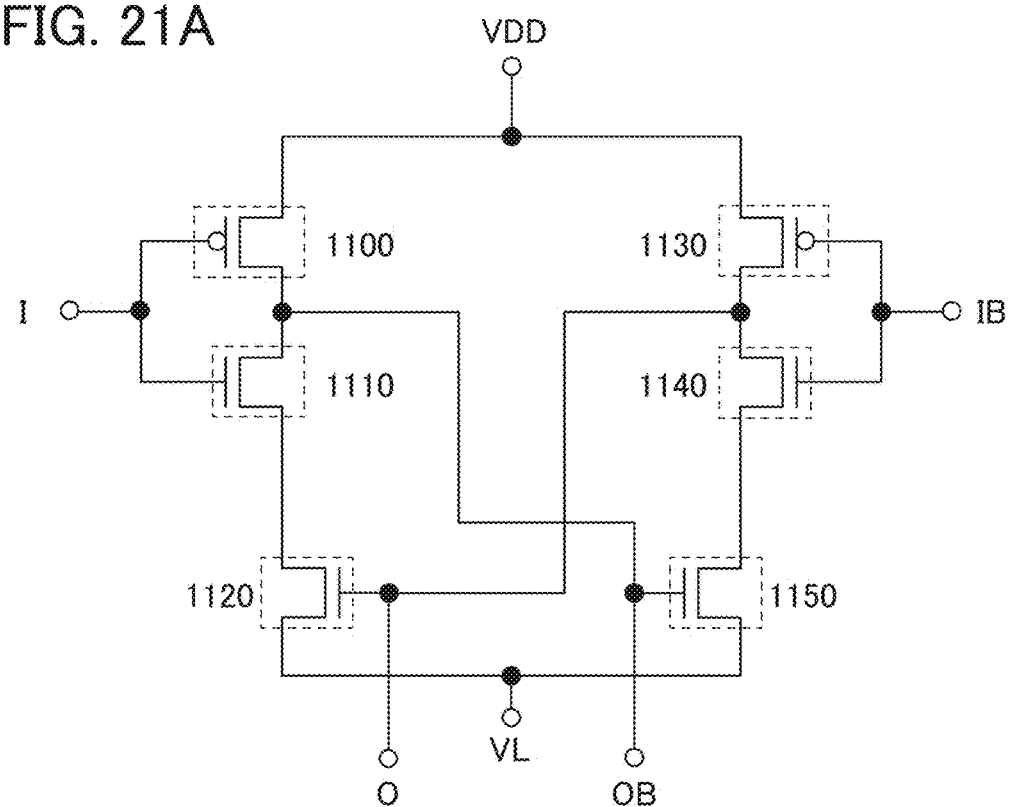
FIGS. 21A and 21B are each a circuit diagram illustrating one embodiment of the present invention.
Figure 21B:
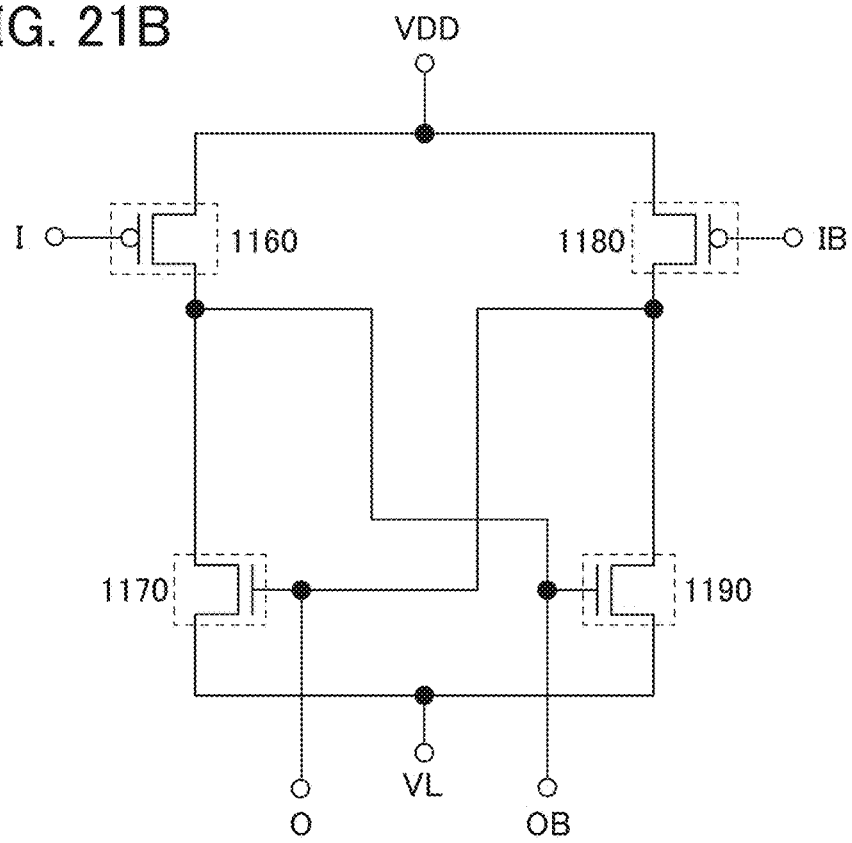

FIGS. 21A and 21B illustrate examples of a step-down level shifter. The level shifter illustrated in FIG. 21A has the following structure. A source terminal of a first p-type transistor 1100 and a source terminal of a second p-type transistor 1130 are both electrically connected to a power source which supplies a potential VDD. A drain terminal of the first p-type transistor 1100 is electrically connected to a drain terminal of a first n-type transistor 1110 and a gate terminal of a fourth n-type transistor 1150. A drain terminal of the second p-type transistor 1130 is electrically connected to a drain terminal of a third n-type transistor 1140 and a gate terminal of a second n-type transistor 1120. A source terminal of the second n-type transistor 1120 and a source terminal of the fourth n-type transistor 1150 are both electrically connected to a power source which supplies a potential $-V_e$.

In FIG. 21A, an input signal (I) is input to a gate terminal of the first p-type transistor 1100 and a gate terminal of the first n-type transistor 1110, and an inverted signal (IB) of the input signal is input to a gate terminal of the second p-type transistor 1130 and a gate terminal of the third n-type transistor 1140. An output signal (O) is taken out from the gate terminal side of the second n-type transistor 1120. In addition, an inverted signal (OB) of the output signal can be taken out from the gate terminal side of the fourth n-type transistor 1150.

When the input signal (I) has a high-level potential, the output signal (O) outputs a high-level potential, and at that time, the potential is VDD. When the input signal (I) has a low-level potential, the output signal (O) outputs a low-level potential, and at that time, the potential is $-V_e$.

FIG. 21B illustrates an example of a step-down level shifter different from the level shifter in FIG. 21A. The level shifter illustrated in FIG. 21B has the following structure. A source terminal of a first p-type transistor 1160 and a source terminal of a second p-type transistor 1180 are both electrically connected to a power source which supplies a potential VDD. A drain terminal of the first p-type transistor 1160 is electrically connected to a drain terminal of a first n-type transistor 1170 and a gate terminal of a second n-type transistor 1190, and a drain terminal of the second p-type transistor 1180 is electrically connected to a drain terminal of the second n-type transistor 1190 and a gate terminal of the first n-type transistor 1170. A source terminal of the first n-type transistor 1170 and a source terminal of the second n-type transistor 1190 are both electrically connected to a power source which supplies a potential $-V_e$.

A plurality of level shifters connected to each other may be used. For example, the output of the level shifter in FIG. 20A may be input to the level shifter in FIG. 21A.

The second driver circuit 953 preferably includes a decoder. For example, the second driver circuit 953 is connected to a plurality of wirings CSEL.

<Configuration Example of Sense Amplifier>

Next, a specific configuration example of the sense amplifier SA of one embodiment of the present invention is described.

Figure 10:
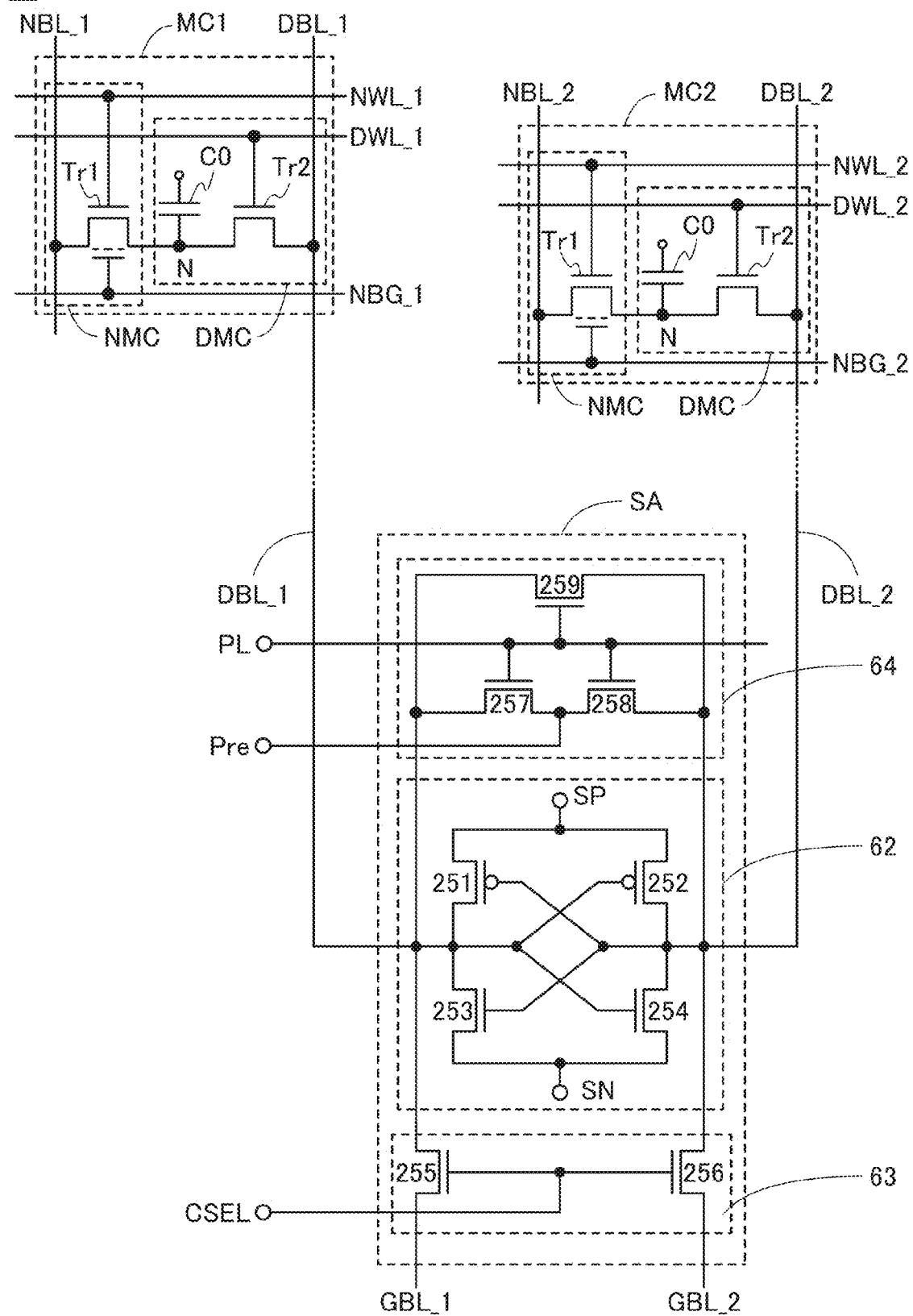
FIG. 10 is a circuit diagram illustrating a structure example of a semiconductor device.

FIG. 10 illustrates an example of a circuit configuration of the memory cells MC and the sense amplifier SA electrically connected to the memory cells MC. The memory cells MC are connected to the sense amplifier SA through the wirings DBL and the like. In the example shown here, a memory cell MC_1 is connected to the sense amplifier SA through the wiring DBL_1, and a memory cell MC_2 is connected to the sense amplifier SA through the wiring DBL_2.

In the example in FIG. 10, one memory cell MC is connected to one wiring DBL; however, a plurality of memory cells MC may be connected to the sense amplifier SA through one wiring DBL.

The sense amplifier SA includes the amplifier circuit 62, the switch circuit 63, and a precharge circuit 64.

The amplifier circuit 62 includes p-channel transistors 251 and 252 and n-channel transistors 253 and 254. One of a source electrode and a drain electrode of the transistor 251 is connected to a wiring SP, and the other of the source electrode and the drain electrode thereof is connected to a gate electrode of the transistor 252, a gate electrode of the transistor 254, and the wiring DBL_1. One of a source electrode and a drain electrode of the transistor 253 is connected to the gate electrode of the transistor 252, the gate electrode of the transistor 254, and the wiring DBL_1, and the other of the source electrode and the drain electrode thereof is connected to a wiring SN. One of a source electrode and a drain electrode of the transistor 252 is connected to the wiring SP, and the other the source electrode and the drain electrode thereof is connected to a gate electrode of the transistor 251, a gate electrode of the transistor 253, and the wiring DBL_2. One of a source electrode and a drain electrode of the transistor 254 is connected to the gate electrode of the transistor 251, the gate electrode of the transistor 253, and the wiring DBL_2, and the other of the source electrode and the drain electrode thereof is connected to the wiring SN. The amplifier circuit 62 has a function of amplifying the potential of the wiring DBL_1 and the potential of the wiring DBL_2. In FIG. 10, the sense amplifier SA including the amplifier circuit 62 functions as a latch sense amplifier.

The switch circuit 63 includes n-channel transistors 255 and 256. The transistors 255 and 256 may be p-channel transistors. One of a source electrode and a drain electrode of the transistor 255 is connected to the wiring DBL_1, and the other of the source electrode and the drain electrode thereof is connected to the wiring GBL_1. One of a source electrode and a drain electrode of the transistor 256 is connected to the wiring DBL_2, and the other of the source electrode and the drain electrode thereof is connected to the wiring GBL_2. Gate electrodes of the transistors 255 and 256 are connected to the wiring CSEL. The switch circuit 63 has a function of controlling electrical connection between the wirings DBL_1 and GBL_1 and electrical connection between the wirings DBL_2 and GBL_2 on the basis of a potential supplied to the wiring CSEL.

The precharge circuit 64 includes n-channel transistors 257, 258, and 259. The transistors 257, 258, and 259 may be p-channel transistors. One of a source electrode and a drain electrode of the transistor 257 is connected to the wiring DBL_1, and the other of the source electrode and the drain electrode thereof is connected to a wiring Pre. One of a source electrode and a drain electrode of the transistor 258 is connected to the wiring DBL_2, and the other of the source electrode and the drain electrode thereof is connected to the wiring Pre. One of a source electrode and a drain electrode of the transistor 259 is connected to the wiring DBL_1, and the other of the source electrode and the drain electrode thereof is connected to the wiring DBL_2. A gate electrode of the transistor 257, a gate electrode of the transistor 258, and a gate electrode of the transistor 259 are connected to a wiring PL. The precharge circuit 64 has a function of initializing the potentials of the wirings DBL_1 and DBL_2.

The amplifier circuit 62, the switch circuit 63, and the precharge circuit 64 are preferably positioned so as to overlap with the memory cells MC.

When data stored in the sub memory cell DMC is read, a signal can be amplified using the sense amplifier SA.

The sense amplifier SA can also be used to read data stored in the sub memory cell NMC. For example, current flowing between the wirings NBL_1 and DBL_1 can be amplified using the sense amplifier SA.

It is preferable to share at least part of the reading circuits of the sub memory cells DMC and NMC because the area of the semiconductor device 10 can be reduced.

<Reading Data from Sub Memory Cell DMC>

An example of reading data held in the sub memory cell DMC in the memory cell MC is described below.

<Operation Example of Sense Amplifier>

Operation examples of the sub memory cells DMC and the sense amplifier SA illustrated in FIG. 10 in data reading are described with reference to a timing chart of FIG. 11.

Note that a low-level potential is supplied to each of the wirings NWL_1, NBG_1, NBL_1, NWL_2, NBG_2, and NBL_2. Here, for example, the low-level potential is set to a voltage of 0 [V].

A low-level potential is supplied to the other electrode of the capacitor C0. Here, for example, the low-level potential is set to a voltage of 0 [V].

First, in a period T1, the transistors 257 to 259 included in the precharge circuit 64 are turned on, so that the potentials of the wirings DBL_1 and DBL_2 are initialized. Specifically, a high-level potential VH_PL is supplied to the wiring PL, whereby the transistors 257 to 259 in the precharge circuit 64 are turned on. Accordingly, a potential Vpre of the wiring Pre is supplied to the wirings DBL_1 and DBL_2. Note that the potential Vpre can be, for example, (VH_SP+VL_SN)/2. Here, for example, VH_SP and VL_SN are set to VDD and 0 [V], respectively.

Note that in the period T1, a low-level potential VL_CSEL is supplied to the wiring CSEL, and accordingly, the transistors 255 and 256 in the switch circuit 63 are off. A low-level potential VL_WL is supplied to the wiring DWL_1, and accordingly, the transistor Tr2 in the memory cell MC_1 is off. Here, for example, VL_WL is set to 0 V. The low-level potential VL_WL is also supplied to the wiring DWL_2, and accordingly, the transistor Tr2 in the memory cell MC_2 is off (not shown in FIG. 11). The potential Vpre is supplied to the wirings SP and SN, and accordingly, the amplifier circuit 62 is off.

Then, a low-level potential VL_PL is supplied to the wiring PL to turn off the transistors 257 to 259 in the precharge circuit 64. In a period T2, the wiring DWL_1 is selected. Specifically, in FIG. 11, a high-level potential VH_WL is supplied to the wiring DWL_1 to select the wiring DWL_1 and turn on the transistor Tr2 in the memory cell MC_1. Here, for example, the high-level potential VH_WL is set to a voltage $V_c$. The wiring DBL_1 and the capacitor C0 are thus electrically connected to each other through the transistor Tr2. Since the wiring DBL_1 and the capacitor C0 are electrically connected to each other, the potential of the wiring DBL_1 changes according to the amount of charge held in the capacitor C0. A potential change is denoted by ΔV.

Here, when the capacitance of the capacitor C0 is denoted by C0 and the wiring capacitance of the wiring DBL_1 is denoted by Cb, a potential change ΔV can be expressed as follows.

$$\Delta V = (VH\_SP + VL\_SN \times Cb) / \{2(C0 + Cb)\}$$

Figure 11:
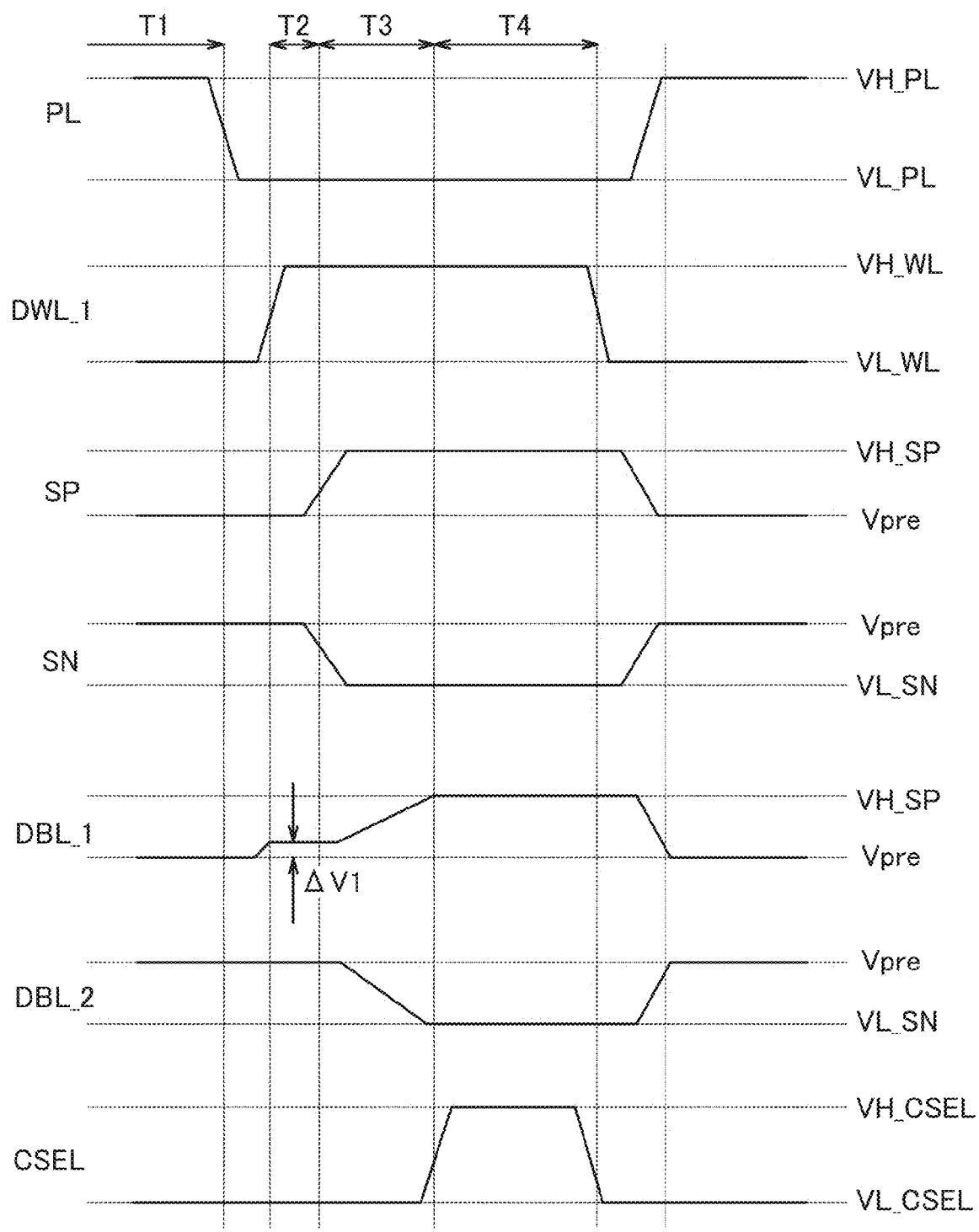
FIG. 11 is a timing chart.

The timing chart in FIG. 11 shows, for example, the case where the amount of charge accumulated in the capacitor C0 is large. Specifically, in the case where the amount of charge accumulated in the capacitor C0 is large, charge is released from the capacitor C0 to the wiring DBL_1, so that ΔV equals to $\Delta V_1$. In the case where the amount of charge accumulated in the capacitor C0 is small, charge flows from the wiring DBL_1 into the capacitor C0, so that ΔV equals to $-\Delta V_2$.

Note that in the period T2, the low-level potential VL_CSEL is kept supplied to the wiring CSEL, so that the transistors 255 and 256 in the switch circuit 63 remain off. The potential Vpre is kept supplied to the wirings SP and SN, so that the sense amplifier SA remains off.

In a period T3, the high-level potential VH_SP is supplied to the wiring SP and the low-level potential VL_SN is supplied to the wiring SN, whereby the amplifier circuit 62 is turned on. The amplifier circuit 62 has a function of amplifying the potential difference between the wirings DBL_1 and DBL_2 (ΔV in FIG. 11). Accordingly, in the timing chart in FIG. 11, the amplifier circuit 62 is turned on, whereby the potential of the wiring DBL_1 rises from the potential Vpre+$\Delta V_1$ to approach the potential VH_SP of the wiring SP. The potential of the wiring DBL_2 falls from the potential Vpre to approach the potential VL_SN of the wiring SN.

Note that in the case where the potential of the wiring DBL_1 is Vpre–$\Delta V_2$ at the beginning of the period T3, the amplifier circuit 62 is turned on, whereby the potential of the wiring DBL_1 falls from the potential Vpre–$\Delta V_2$ to approach the potential VL_SN of the wiring SN. The potential of the wiring DBL_2 rises from the potential Vpre to approach the potential VH_SP of the wiring SP.

In the period T3, the low-level potential VL_PL is kept supplied to the wiring PL, so that the transistors 257 to 259 in the precharge circuit 64 remains off. The low-level potential VL_CSEL is kept supplied to the wiring CSEL, so that the transistors 255 and 256 in the switch circuit 63 remains off. The high-level potential VH_WL is kept supplied to the wiring DWL_1, so that the transistor Tr2 in the memory cell MC_1 remains on. Consequently, charge corresponding to the potential VH_SP of the wiring DBL_1 is accumulated in the capacitor C0 in the memory cell MC_1.

Next, in a period T4, the potential supplied to the wiring CSEL is changed to turn on the switch circuit 63. Specifically, in FIG. 11, a high-level potential VH_CSEL is supplied to the wiring CSEL, so that the transistors 255 and 256 in the switch circuit 63 are turned on. Accordingly, the potential of the wiring DBL_1 is supplied to the wiring GBL_1, and the potential of the wiring DBL_2 is supplied to the wiring GBL_2.

In the period T4, the low-level potential VL_PL is kept supplied to the wiring PL, so that the transistors 257 to 259 in the precharge circuit 64 remain off. The high-level potential VH_WL is kept supplied to the wiring DWL_1, so that the transistor Tr2 in the memory cell MC_1 remains on. The high-level potential VH_SP is kept supplied to the wiring SP and the low-level potential VL_SN is kept supplied to the wiring SN, so that the amplifier circuit 62 remains on. As a result, charge corresponding to the potential VH_SP of the wiring DBL_1 is accumulated in the capacitor C0 in the memory cell MC_1.

When the period T4 is over, the potential supplied to the wiring CSEL is changed to turn off the switch circuit 63. Specifically, in FIG. 11, the low-level potential VL_CSEL is supplied to the wiring CSEL, so that the transistors 255 and 256 in the switch circuit 63 are turned off.

Furthermore, when the period T4 is over, the wiring DWL_1 is deselected. Specifically, in FIG. 11, the low-level potential VL_WL is supplied to the wiring DWL_1, so that the wiring DWL_1 is deselected to turn off the transistor Tr2 in the memory cell MC_1. Through the operation, charge corresponding to the potential VH_SP of the wiring DBL_1 is held in the capacitor C0; thus, data is held in the memory cell MC_1 even after the data is read.

Through the operation in the periods T1 to T4, data is read from the memory cell MC_1. Data in the memory cell MC_2 can be read similarly. After that, the potential of the wiring PL is set to VH_PL.

<Writing Data to Sub Memory Cell DMC>

Note that data can be written to the sub memory cell DMC in the memory cell MC on the basis of the above principle. Specifically, as in the case where data is read, first, the transistors 257 to 259 in the precharge circuit 64 are temporarily turned on to initialize the potentials of the wirings DBL_1 and DBL_2. Then, the wiring DWL_1 connected to the memory cell MC_1 to which data is to be written or the wiring DWL_2 connected to the memory cell MC_2 to which data is to be written is selected to turn on the transistor Tr2 in the memory cell MC_1 or MC_2. The wiring DBL_1 or DBL_2 and the capacitor C0 are thus electrically connected to each other through the transistor Tr2. Then, the high-level potential VH_SP is supplied to the wiring SP and the low-level potential VL_SN is supplied to the wiring SN to turn on the amplifier circuit 62. The potential supplied to the wiring CSEL is then changed to turn on the switch circuit 63. Specifically, the high-level potential VH_CSEL is supplied to the wiring CSEL, so that the transistors 255 and 256 in the switch circuit 63 are turned on. Consequently, the wirings DBL_1 and GBL_1 are electrically connected to each other and the wirings DBL_2 and GBL_2 are electrically connected to each other. Writing potentials (e.g., "High" or "Low") are supplied to the wirings GBL_1 and GBL_2, whereby the writing potentials are supplied to the wirings DBL_1 and DBL_2 through the switch circuit 63. Consequently, charge is accumulated in the capacitor C0 according to the potential of the wiring DBL_1 or DBL_2 and thus data is written to the memory cell MC_1 or MC_2.

Note that after the potential of the wiring GBL_1 is supplied to the wiring DBL_1 and the potential of the wiring GBL_2 is supplied to the wiring DBL_2, the relation in level between the potential of the wiring DBL_1 and the potential of the wiring DBL_2 is maintained by the amplifier circuit 62 as long as the sense amplifier SA is on even after the transistors 255 and 256 in the switch circuit 63 are turned off. Therefore, the timing of turning off the transistors 255 and 256 in the switch circuit 63 may be either before or after the wiring DWL_1 is selected.

<Sub Memory Cells NMC and DMC>

Figure 12:
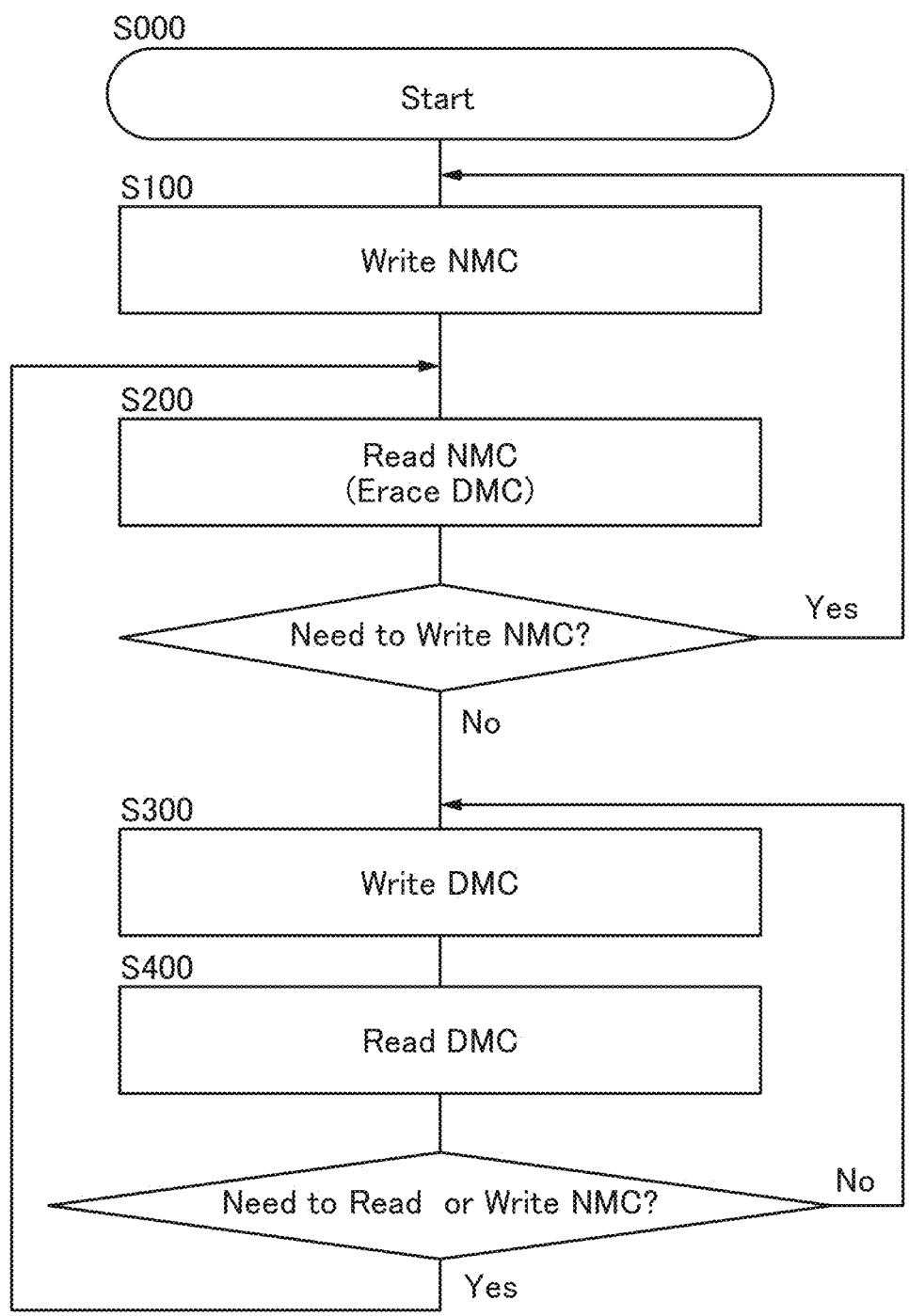
FIG. 12 is a flow chart.

FIG. 12 illustrates an example of a flow for writing and reading data to and from the sub memory cells NMC and DMC in the memory cell MC.

First, the processing starts in Step S000.

Next, data is written to the sub memory cell NMC in Step S100.

Then, the data of the sub memory cell NMC is read in Step S200. After that, the operation returns to Step S100 if data needs to be written to the sub memory cell NMC. If data does not need to be written to the sub memory cell NMC, the operation proceeds to Step S300.

Next, data is written to the sub memory cell DMC in Step S300. At this time, the data of the sub memory cell NMC is held. Here, in the case where the transistor Tr1 is turned off when a low-level potential, for example, a voltage of 0 [V] is supplied to each of the wirings NWL and NBG, the data of the sub memory cell DMC is held. To hold the data in the sub memory cell DMC, it is preferable that the threshold value of the transistor Tr1 be 0 V or higher even when data "High" or "Low" is written to the sub memory cell NMC.

Then, the data of the sub memory cell DMC is read in Step S400. At this time, the data of the sub memory cell NMC is held.

Next, the operation returns to Step S300 if data needs to be read from or written to the sub memory cell NMC. The operation returns to Step S200 if data needs to be read from or written to the sub memory cell NMC. The data of the sub memory cell NMC is read in Step S200. At this time, the data of the sub memory cell DMC written in Step S300 is lost.

With the flow in FIG. 12, in the period during which the data of the sub memory cell NMC is not read, data can be written to the sub memory cell DMC while the data of the sub memory cell NMC is held.

The data is written to the sub memory cell DMC in Step S300. At this time, the data of the sub memory cell NMC is held.

At this time, for example, it is assumed that the threshold value of the transistor Tr1 is lower than the voltage $V_c$ after data "Low" is written to the sub memory cell NMC and higher than the voltage $V_c$ after data "High" is written thereto. The case where not 0 V but $V_c$ is supplied to the wiring NWL in Step S300 described above is considered. In this case, where data "Low" is written to the sub memory cell NMC, the transistor Tr1 is turned off and the data input to the sub memory cell DMC cannot be held. At this time, the data depends on the potential supplied to the wiring NBL. In the case where 0 V is supplied to the wiring NBL, data "Low" is supplied to the sub memory cell DMC. In contrast, in the case where data "High" is written to the sub memory cell NMC, data "High" or "Low" is held in the sub memory cell DMC in accordance with the data input thereto. That is, the data held in the sub memory cell DMC depends on the states of the data of the sub memory cell NMC and the data input to the sub memory cell DMC.

<Circuit Configuration Example 2 of Semiconductor Device>

Next, another structure example of a semiconductor device of one embodiment of the present invention is described.

Figure 14:
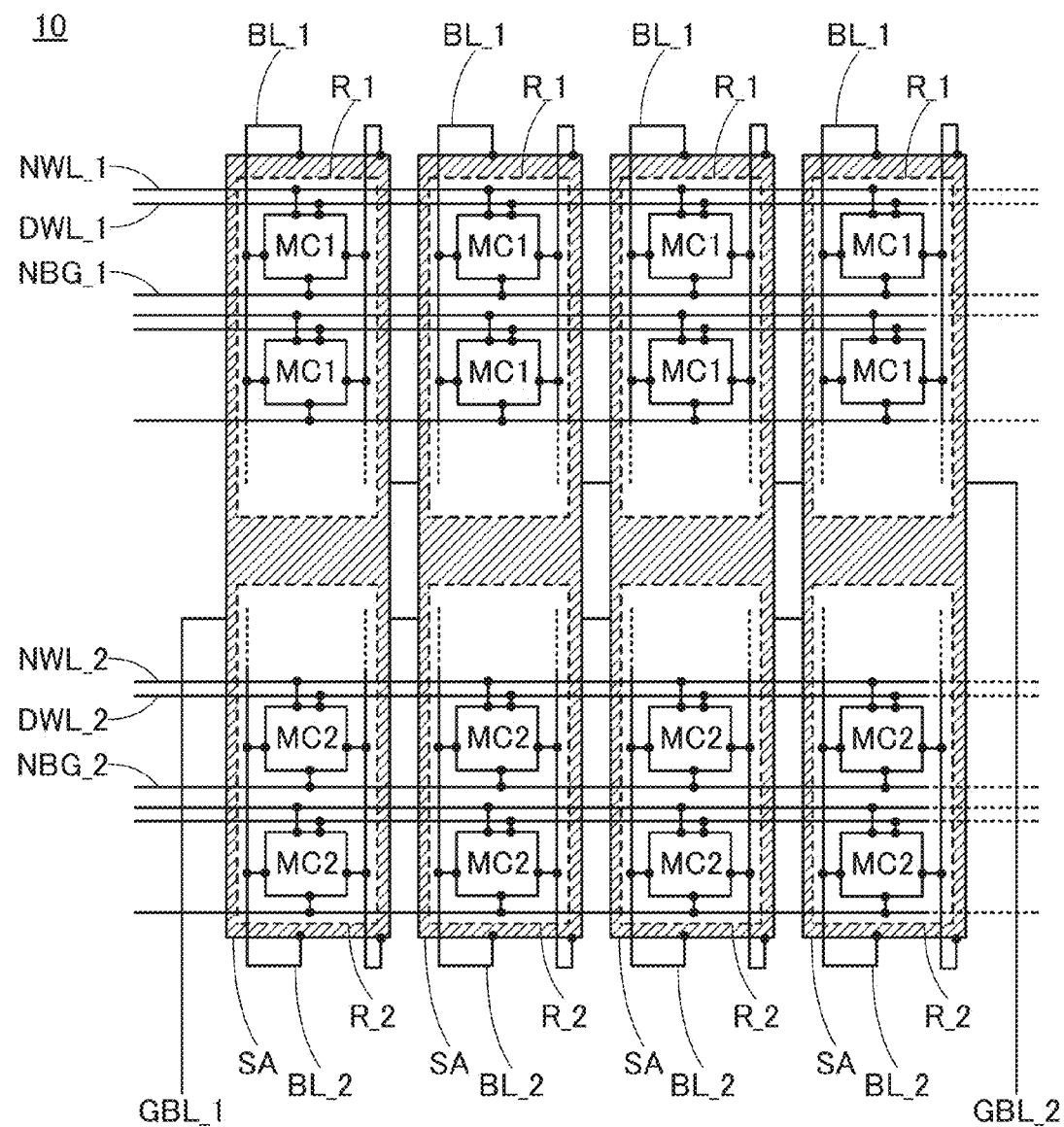
FIG. 14 is a top view illustrating a structure example of a semiconductor device.

FIG. 13 illustrates a structure example of the semiconductor device 10. FIG. 14 is a top view of the semiconductor device 10 illustrated in FIG. 13. Like the semiconductor device 10 in FIG. 7, the semiconductor device 10 illustrated in FIG. 13 and FIG. 14 has a structure in which the memory cells MC are stacked over the sense amplifiers SA. The semiconductor device 10 includes the cell array 70 having an open-type layout.

The semiconductor device 10 in FIG. 13 and FIG. 14 includes four sets of one sense amplifier SA positioned in a first layer and a plurality of memory cells MC_1 and a plurality of memory cells MC_2 which are connected to the sense amplifier SA. Note that the number of sets included in the semiconductor device 10 of one embodiment of the present invention may be one, two, three, or more than four.

In FIG. 13 and FIG. 14, a region R_1 including the plurality of memory cells MC_1 and a region R_2 including the plurality of memory cells MC_2 overlap with one sense amplifier SA connected to the plurality of memory cells MC_1 and the plurality of memory cells MC_2.

In FIG. 13 and FIG. 14, the sense amplifier SA is connected to the wirings DBL_1, NBL_1, DBL_2, and NBL_2. The plurality of memory cells MC_1 in one region R_1 are connected to the same wirings DBL_1 and NBL_1. The plurality of memory cells MC_2 in one region R_2 are connected to the same wirings DBL_2 and NBL_2.

The plurality of wirings DWL_1, the plurality of wirings NWL_1, and the plurality of wirings NBG_1 are shared by four regions R_1, and the plurality of wirings DWL_2, the plurality of wirings NWL_2, and the plurality of wirings NBG_2 are shared by four regions R_2. Specifically, one wiring DWL_1 is connected to four memory cells MC_1, and one wiring DWL_2 is connected to four memory cells MC_2. One wiring NWL_1 is connected to four memory cells MC_1, and one wiring NWL_2 is connected to four memory cells MC_2. One wiring NBG_1 is connected to four memory cells MC_1, and one wiring NBG_2 is connected to four memory cells MC_2.

Since the cell array 70 in FIG. 13 and FIG. 14 has an open-type layout, the wirings DBL_1 and NBL_1 do not each intersect with the wirings DWL_2, NWL_2, and NBG_2, and the wirings DBL_2 and NBL_2 do not each intersect with the wirings DWL_1, NWL_1, and NBG_1. Each of the sense amplifiers SA is connected to the wirings GBL_1 and GBL_2.

With such a configuration, the occupied area of the semiconductor device 10 can be reduced, and the storage capacity per unit area of the semiconductor device 10 can be increased.

The semiconductor device 10 of one embodiment of the present invention includes the cell array 70 as illustrated in FIG. 7 and the like. The memory cells MC in the cell array 70 each preferably include the sub memory cells NMC and DMC.

The cell array 70 preferably includes a plurality of sub cell arrays. For example, the cell array 70 includes a first sub cell array and a second sub cell array. In the first sub cell array, data is stored in the sub memory cell NMC in each memory cell MC. In the second sub cell array, data is stored in the sub memory cell DMC in each memory cell MC.

In the cell array 70, the sub cell array is preferably formed with a subarray region including a plurality of rows. Alternatively, the sub cell array may be formed in each row. The size of the sub cell array region can be changed by the user. That is, in the cell array 70, the capacitance of data stored in the sub memory cell NMC and the capacitance of data stored in the sub memory cell DMC can be selected by the user. The ratio between the capacitance of data stored in the sub memory cell NMC and the capacitance of data stored in the sub memory cell DMC may be changed with time.

Figure 15:
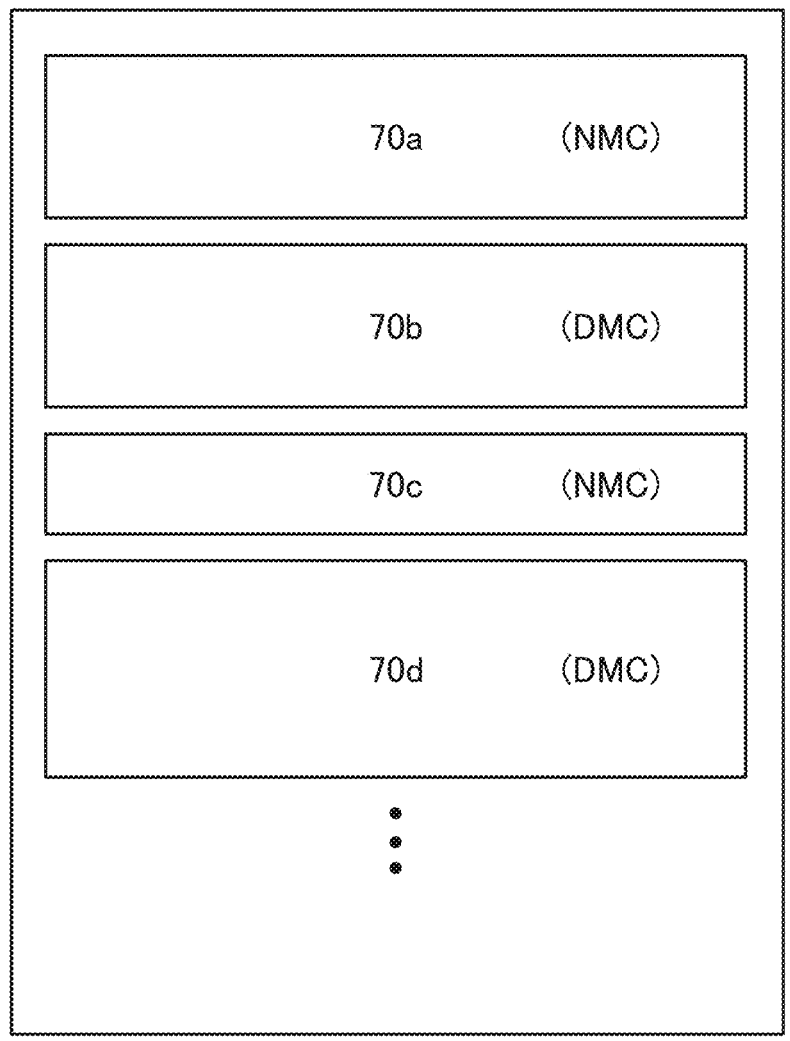
FIG. 15 is a block diagram illustrating a structure example of a semiconductor device.

The cell array 70 illustrated in FIG. 15 includes a sub cell array 70a, a sub cell array 70b, a sub cell array 70c, a sub cell array 70d, and the like. For example, data of the sub cell arrays 70a and 70c are stored in the sub memory cell NMC in each memory cell MC, and data of the sub cell arrays 70b and 70d are stored in the sub memory cell DMC in each memory cell MC.

Figure 16:
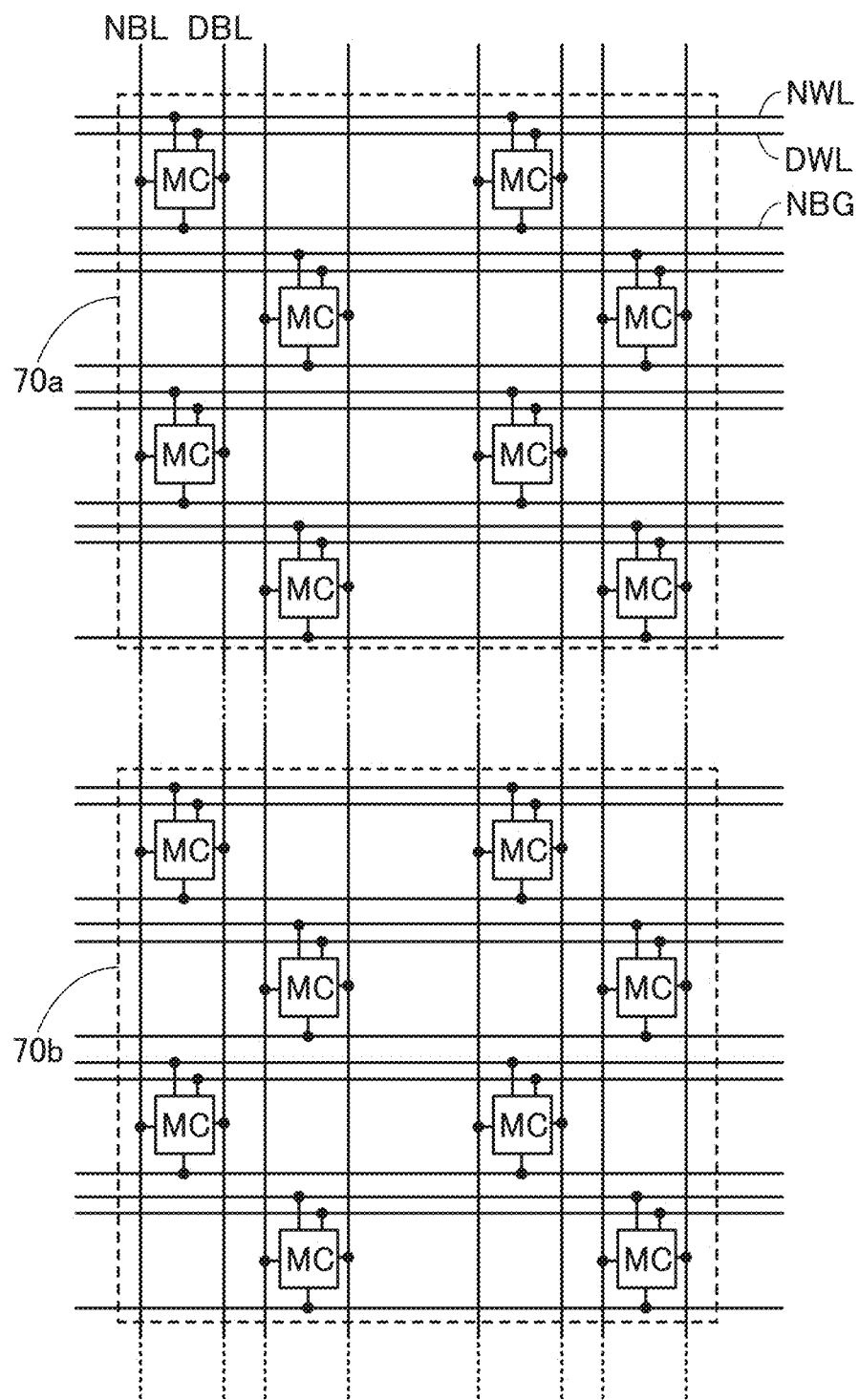
FIG. 16 is a circuit diagram illustrating a structure example of a semiconductor device.

FIG. 16 is a circuit diagram illustrating an example of the sub cell arrays 70a and 70b in the cell array 70.

Figure 17:
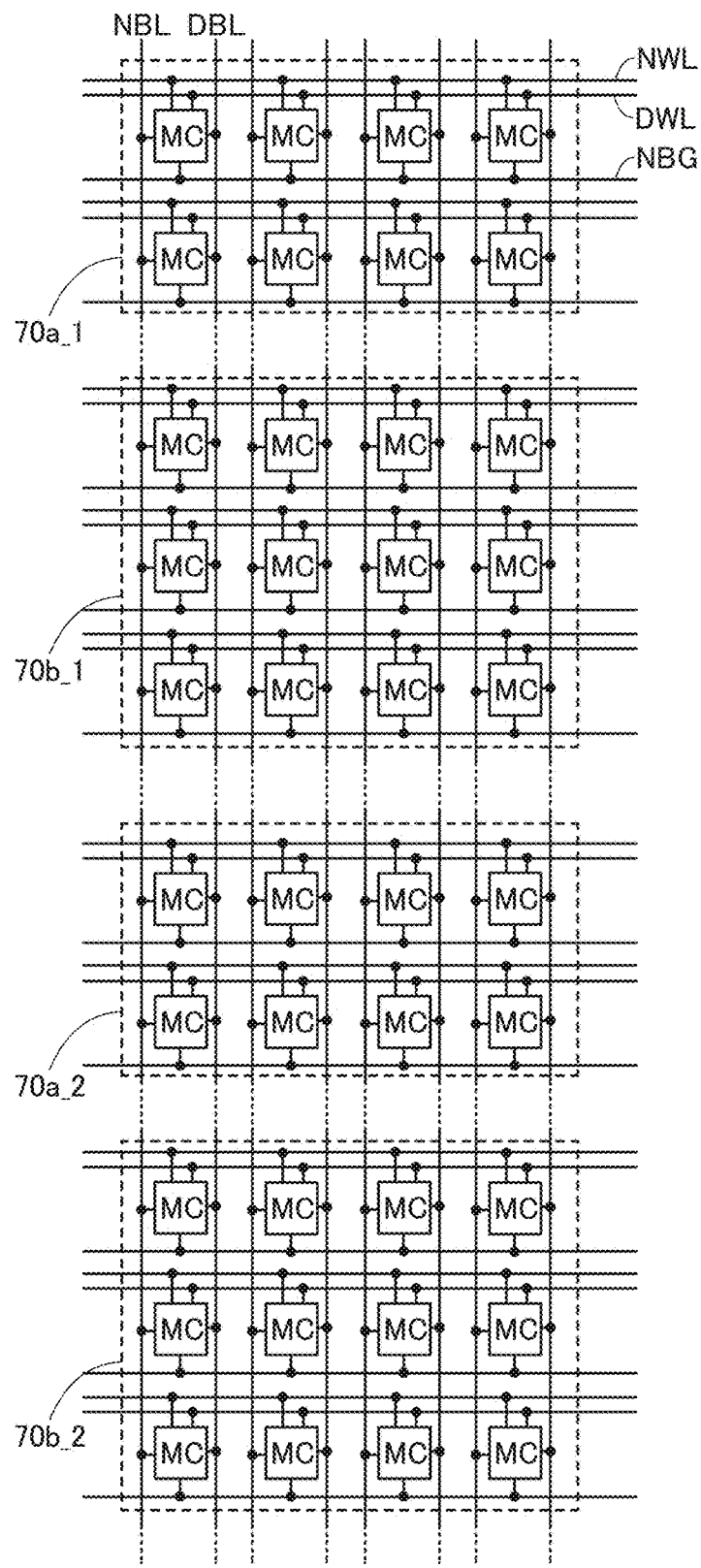
FIG. 17 is a circuit diagram illustrating a structure example of a semiconductor device.

FIG. 17 is a circuit diagram illustrating an example of the cell array 70. The cell array 70 includes a sub cell array 70a_1, a sub cell array 70a2, a sub cell array 70b_1, and a sub cell array 70b_2. Here, for example, data of the sub cell arrays 70a_1 and 70a_2 are stored in the sub memory cell NMC in each memory cell MC, and data of the sub cell arrays 70b_1 and 70b_2 are stored in the sub memory cell DMC in each memory cell MC. At this time, the cell array including a pair of the sub cell arrays 70b_1 and 70b_2 can have an open-type layout.

Figure 18:
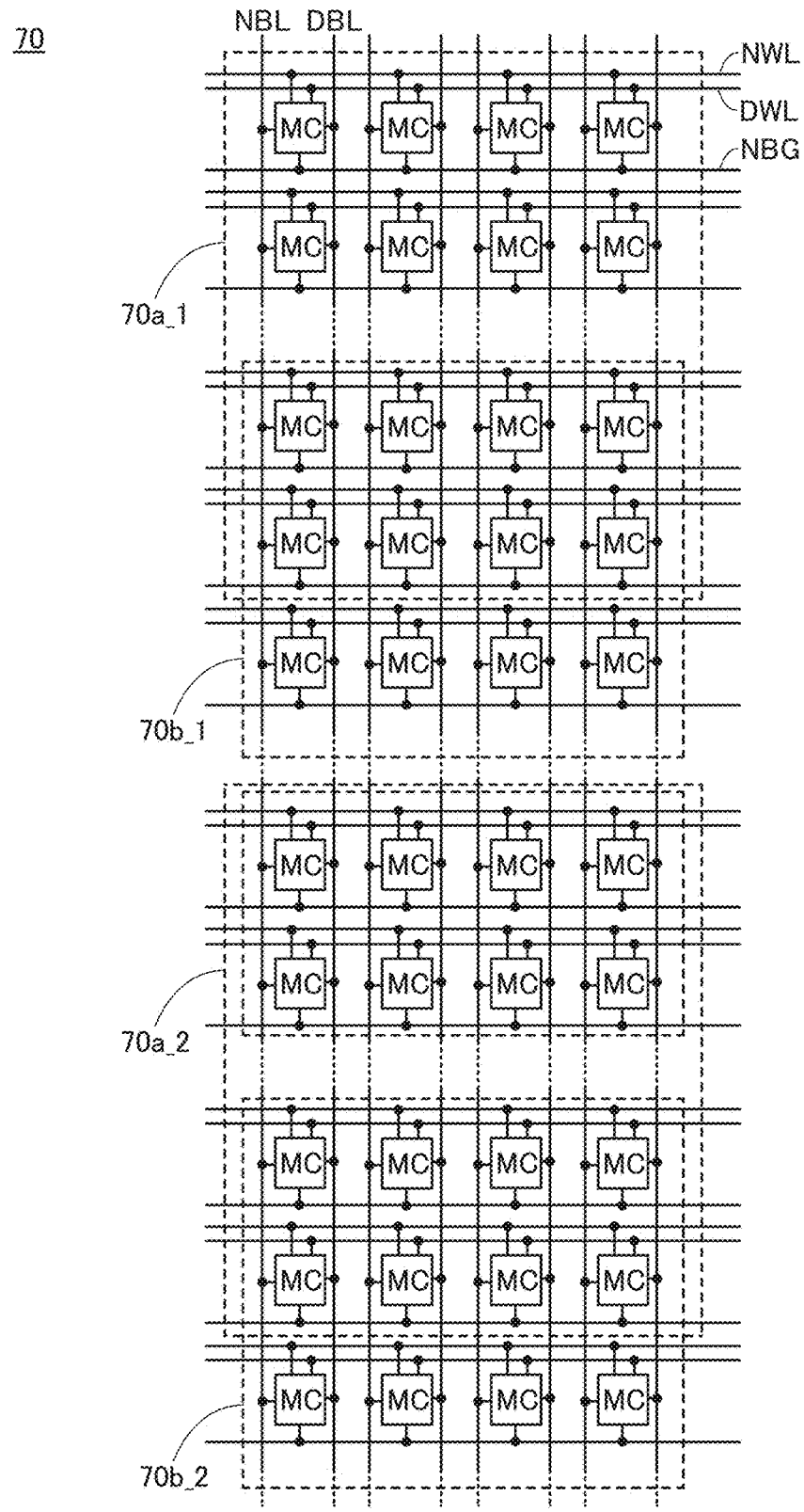
FIG. 18 is a circuit diagram illustrating a structure example of a semiconductor device.

The cell array 70 may include a memory cell MC in which data is stored in both of the sub memory cells NMC and DMC. For example, in the circuit diagram illustrated in FIG. 18, in a region where the sub cell arrays 70a_1 and 70b_1 overlap with each other, first data is stored in the sub memory cell NMC and second data is stored in the sub memory cell DMC in each memory cell MC.

The semiconductor device 10 of one embodiment of the present invention includes the cell array 70. The cell array 70 includes a plurality of memory cells MC arranged in a matrix. The memory cells MC each include the transistor Tr1, the transistor Tr2, and the capacitor C0. The cell array 70 includes a first region and a second region. In each of the memory cells MC in the first region, charge in the charge trap layer 93 is captured by providing the potential difference between the gate electrode 92 and the source electrode of the transistor Tr1 to change the threshold value of the transistor Tr1; accordingly, data is stored. In each of the memory cells MC in the second region, the transistor Tr2 is turned on so that charge is supplied to the one electrode of the capacitor C0 and then the transistor Tr2 is turned off and the charge is held in the one electrode of the capacitor C0; accordingly, data is stored.

The first region and the second region in the cell array 70 may overlap with each other. For example, first data and second data are stored in a first memory cell included in the cell array 70. That is, in the first memory cell, the first data is stored in such a manner that charge is trapped in the charge trap layer 93 by providing the potential difference between the gate electrode 92 and the source electrode of the transistor Tr1 to change the threshold value of the transistor Tr1, and the second data is stored in such a manner that the transistor Tr2 is turned on so that charge is supplied to the one electrode of the capacitor C0 and then the transistor Tr2 is turned off so that the charge is held in the one electrode of the capacitor C0.

Embodiment 2

In this embodiment, a semiconductor device and a transistor of one embodiment of the present invention will be described.

[Semiconductor Device]

Figure 22:
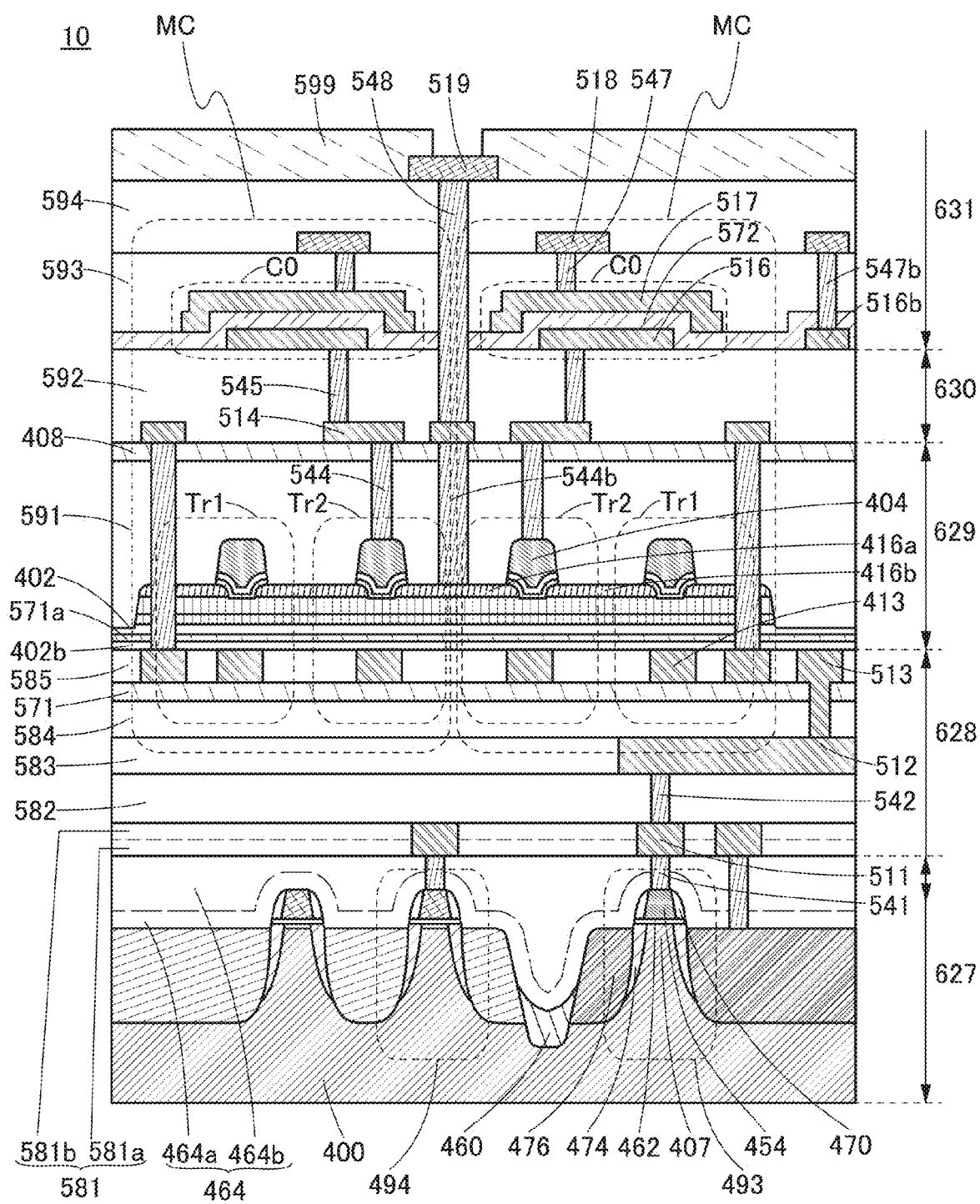
FIG. 22 is a cross-sectional view illustrating a structure example of a semiconductor device.
Figure 23:
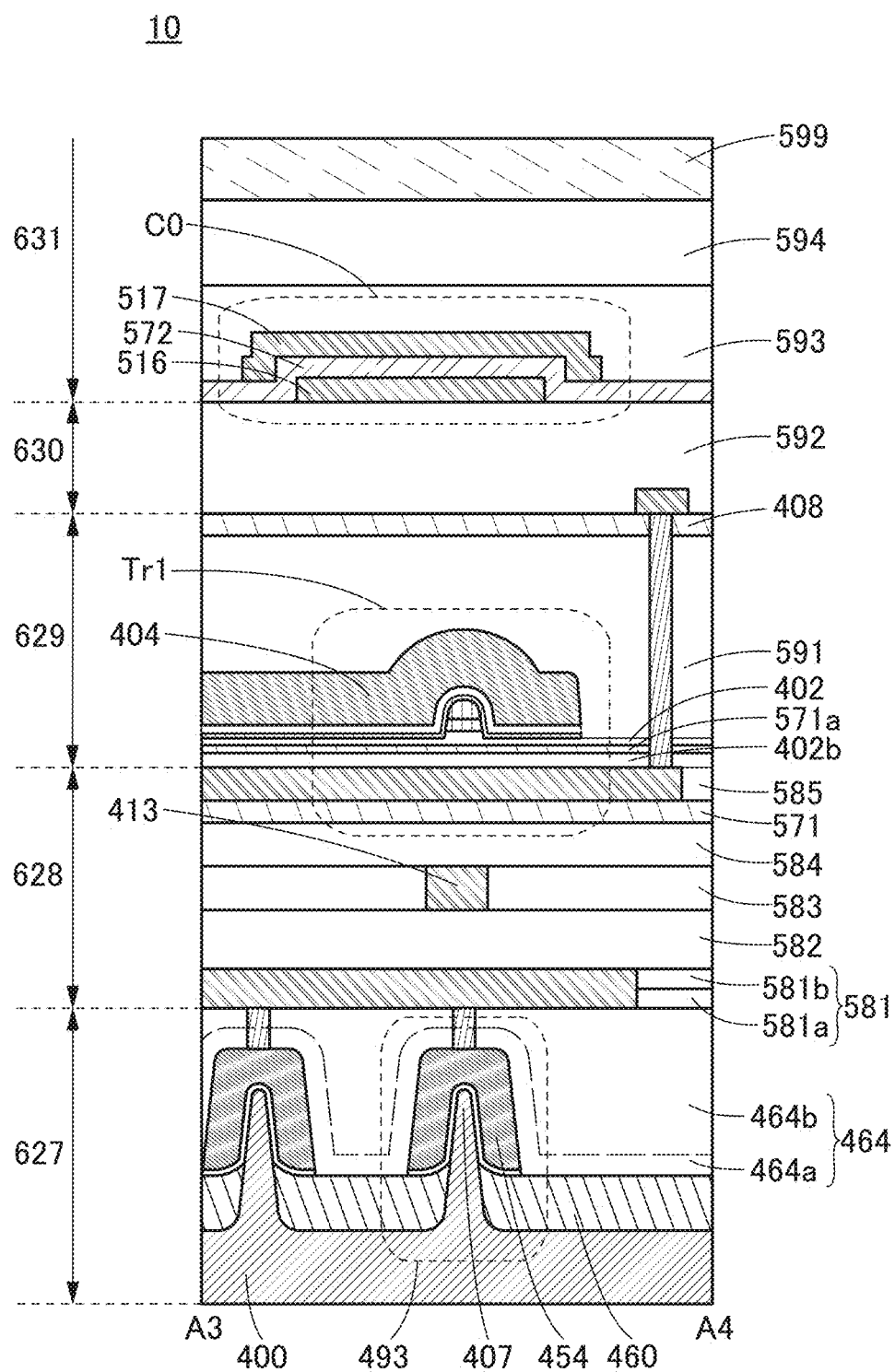
FIG. 23 is a cross-sectional view illustrating a structure example of a semiconductor device.

FIG. 22 illustrates an example of a cross-sectional view of the semiconductor device 10. FIG. 23 illustrates an example of a cross section substantially perpendicular to the A1-A2 direction shown in FIG. 22. The semiconductor device 10 illustrated in FIG. 22 includes five layers, i.e., layers 627 to 631. The layer 627 includes a transistor 493, a transistor 494, and the like. The layer 629 includes the transistor Tr1, the transistor Tr2, and the like. The layer 631 includes the capacitor C0 and the like.

<Layer 627>

The layer 627 includes a substrate 400, the transistor 493, the transistor 494, and the like over the substrate 400, an insulator 464 over the transistor 493 and the like, and plugs such as a plug 541. The plug 541 or the like is connected to, for example, a gate electrode, a source electrode, or a drain electrode of the transistor 493 or the like. The details of the transistors 493 and 494 will be described later.

The insulator 464 can be formed using, for example, silicon oxide, silicon oxynitride, silicon nitride oxide, silicon nitride, aluminum oxide, aluminum oxynitride, aluminum nitride oxide, aluminum nitride, or the like.

Alternatively, the insulator 464 can be formed using silicon carbonitride, silicon oxycarbide, or the like. Further alternatively, undoped silicate glass (USG), boron phosphorus silicate glass (BPSG), borosilicate glass (BSG), or the like can be used. USG, BPSG, and the like may be formed by an atmospheric pressure CVD method. Alternatively, hydrogen silsesquioxane (HSQ) or the like may be applied by a coating method. Here, the insulator 464 preferably contains hydrogen in some cases. When the insulator 464 contains hydrogen, defects or the like in the substrate 400 are reduced and characteristics of the transistor 493 and the like are improved in some cases.

The insulator 464 may have a single-layer structure or a stacked-layer structure of a plurality of materials. For example, the insulator 464 may have a two-layer structure of an insulator 464a and an insulator 464b as illustrated in FIG. 22. Here, for example, silicon nitride and USG are used as the insulator 464a and the insulator 464b, respectively.

Transistors for forming peripheral circuits of the semiconductor device 10 of one embodiment of the present invention, for example, circuits such as the sense amplifier circuit, the driver circuit, the main amplifier, and the input/output circuit are preferably provided in the layer 627. A transistor including an oxide semiconductor is provided in the layer 629. The memory cell of one embodiment of the present invention is preferably provided in the layer 629. The peripheral circuits of the semiconductor device 10 are provided in the layer 627, the layer 629 is stacked thereover, and the transistors in the cell array 70 are provided in the layer 629, whereby the area of the semiconductor device 10 can be reduced.

<Layer 628>

The layer 628 includes an insulator 581, an insulator 584 over the insulator 581, an insulator 571 over the insulator 584, an insulator 585 over the insulator 571, a conductor 511 and the like over the insulator 464, and a conductor 513 connected to the conductor 511 and the like and formed to fill an opening formed in the insulators 584, 571, and 585. The conductor 511 is preferably formed to be embedded in the insulator 581.

A conductor 413 is preferably provided in the layer 628. The conductor 413 is preferably formed to be embedded in the insulator 585. The conductor 413 preferably functions as the gate electrode 92 of the transistor Tr1.

For the insulator 581, refer to the description of the insulator 464. The insulator 581 may have a stacked-layer structure of a plurality of layers. For example, the insulator 581 has a two-layer structure of an insulator 581a and an insulator 581b over the insulator 581a as illustrated in FIG. 22. For the insulators 581a and 581b, refer to the description of the insulators 464a and 464b.

For the insulators 584 and 585, the material that is described as that of the insulator 464 can be used. The insulators 584 and 585 may have a single-layer structure or a stacked-layer structure of a plurality of materials.

A conductive material such as a metal material, an alloy material, or a metal oxide material can be used as a material of the conductor 511, the conductor 513, the conductor 413, a plug 542, and the like. For example, a single-layer structure or a stacked-layer structure using any of metals such as aluminum, titanium, chromium, nickel, copper, yttrium, zirconium, niobium, molybdenum, silver, tantalum, and tungsten, or an alloy containing any of these metals as a main component can be used. Alternatively, a metal nitride such as tungsten nitride, molybdenum nitride, or titanium nitride can be used.

The conductors such as the conductors 511 and 513 preferably function as wirings in the semiconductor device 10. Therefore, these conductors are also referred to as wirings or wiring layers in some cases. These conductors are preferably connected to each other via plugs such as the plug 542.

In the semiconductor device of one embodiment of the present invention, the conductor 511, the conductor 513, the conductor 413, the plug 542, and the like in the layer 628 may have a stacked-layer structure of two or more layers.

For example, copper can be used in a layer above the conductor or the plug. Copper has a low resistance and is preferably used as a conductor such as a plug or a wiring. On the other hand, copper is easily diffused, and the diffusion of copper into a semiconductor element degrades the characteristics of the semiconductor element in some cases. Thus, a layer under the conductor or the plug is preferably formed using a material through which copper is hardly allowed to pass. It is preferable that hydrogen or oxygen is hardly allowed to pass through the layer under the conductor or the plug. The layer under the conductor or the plug can be formed using tantalum, tantalum nitride, or titanium nitride, for example. Alternatively, the layer above the conductor or the plug may be formed using tungsten.

As an example of the insulator 581a, silicon nitride formed by a CVD method can be used. A film that releases a small amount of hydrogen is preferably used as the insulator 581a. The released amount of hydrogen can be measured by thermal desorption spectroscopy (TDS), for example. In TDS analysis, the amount of hydrogen released from the insulator 581a which is converted into hydrogen atoms is, for example, less than or equal to $5 \times 10^{20}$ atoms/cm$^3$, preferably less than or equal to $1 \times 10^{20}$ atoms/cm$^3$, in the range of 50° C. to 500° C. The amount of hydrogen released from the insulator 581a per area of the insulating film, which is converted into hydrogen atoms, is less than or equal to $5 \times 10^{15}$ atoms/cm$^2$, preferably less than or equal to $1 \times 10^{15}$ atoms/cm$^2$, for example. The dielectric constant of the insulator 581b is preferably lower than that of the insulator 581a.

The insulator 571 is preferably formed using an insulating material through which an impurity is hardly allowed to pass. Preferably, the insulator 571 has low oxygen permeability, for example. Preferably, the insulator 571 has low hydrogen permeability, for example. Preferably, the insulator 571 has low water permeability, for example.

The insulator 571 can be formed using a single-layer structure or a stacked-layer structure using, for example, an insulating film containing aluminum oxide, hafnium oxide, tantalum oxide, zirconium oxide, lead zirconate titanate (PZT), strontium titanate (SrTiO$_3$), (Ba,Sr)TiO$_3$ (BST), or silicon nitride. Alternatively, bismuth oxide, germanium oxide, niobium oxide, silicon oxide, titanium oxide, tungsten oxide, yttrium oxide, or gallium oxide may be added to the insulating film, for example. Alternatively, the insulating film may be subjected to nitriding treatment to be an oxynitride film. A layer of silicon oxide, silicon oxynitride, or silicon nitride may be stacked over the insulating film. Aluminum oxide is particularly preferable because of its excellent barrier property against water or hydrogen. The insulator 571 is formed using, for example, silicon carbide, silicon carbonitride, or silicon oxycarbide.

The insulator 571 may be a stack including a layer of a material through which water or hydrogen is hardly allowed to pass and a layer containing an insulating material. The insulator 571 may be, for example, a stack of a layer containing silicon oxide or silicon oxynitride, a layer containing a metal oxide, and the like.

The insulator 571 included in the semiconductor device 10 can suppress the diffusion of an element included in the conductor 513, the conductor 413, and the like into the insulator 571 and layers under the insulator 571 (e.g., the insulator 584, the insulator 581, and the layer 627), for example.

<Layer 629>

The layer 629 includes a transistor such as the transistors Tr1 and Tr2 and plugs such as a plug 544 and a plug 544b. The plugs such as the plugs 544 and 544b are connected to the conductor 513, and a gate electrode, a source electrode, and a drain electrode of the transistor Tr1 and the like. The details of the structure of the transistor which can be used for the transistors Tr1 and Tr2 will be described later.

The transistors Tr1 and Tr2 include a semiconductor layer 406. The semiconductor layer 406 contains a semiconductor material. Examples of the semiconductor material include oxide semiconductor materials, semiconductor materials such as silicon, germanium, gallium, and arsenic, compound semiconductor materials including silicon, germanium, gallium, arsenic, aluminum, and the like, and organic semiconductor materials. In particular, the semiconductor layer 406 preferably contains an oxide semiconductor.

As will be described later, a transistor 490 illustrated in FIGS. 27A and 27B and the like can be used as the transistor Tr1 in FIG. 22. In the transistor Tr1, the semiconductor layer 406 includes three layers of a semiconductor layer 406a, a semiconductor layer 406b, and a semiconductor layer 406c. The transistor Tr1 includes the semiconductor layer 406a, the semiconductor layer 406b over the semiconductor layer 406a, a conductor 416a and a conductor 416b over the semiconductor layer 406b, the semiconductor layer 406c in contact with a top surface and a side surface of the semiconductor layer 406b, a top surface of the conductor 416a, and a top surface of the conductor 416b, an insulator 412 over the semiconductor layer 406c, and a conductor 404 over the insulator 412. The conductor 404 is preferably formed over a region between the conductors 416a and 416b (a dividing region) with the insulator 412 positioned therebetween. The semiconductor device 10 in FIG. 22 includes an insulator 591 over the conductor 404 and an insulator 408 over the insulator 591.

The conductors 416a and 416b preferably function as the source electrode and the drain electrode of the transistor Tr1. The conductor 404 preferably functions as a gate electrode of the transistor Tr1. In the transistor Tr1, the conductor 404 and the conductor 413 preferably function as the gate electrode 91 and the gate electrode 92, respectively.

For the transistor Tr2, the description of the transistor Tr1 may be referred to, for example.

Here, the semiconductor layer of the transistors Tr1 and Tr2 can be formed easily by a thin film method such as a sputtering method, for example. Thus, as illustrated in FIG. 22, the semiconductor layer can be formed easily over the conductors such as the conductor 413 with an insulator 402 and the like positioned therebetween. Accordingly, in the transistors Tr1 and Tr2, the conductors 404 and 413 which are positioned over and below the semiconductor layer 406 can be provided easily.

In the cross section in FIG. 22, two memory cells MC are adjacent to each other. The memory cells MC each include the transistor Tr1, the transistor Tr2, and the capacitor C0. The transistors Tr1 and Tr2 are connected in series. The conductor 416b serves as one of the source electrode and the drain electrode of the transistor Tr1 and one of the source electrode and the drain electrode of the transistor Tr2.

The transistors Tr2 in the two memory cells MC are connected to the same wiring DBL. The plug 544b is electrically connected to the wiring DBL or functions as the wiring DBL.

The conductor 404 functioning as the gate electrode 91 of the transistor Tr2 is connected to a conductor 516 and the like functioning as one electrode of the capacitor C0 provided in the layer 631 through the plug 544 and the like provided in the layer 629 and a conductor 514, a plug 545, and the like provided in the layer 630.

In the cross section in FIG. 22, the transistors Tr1, the transistors Tr2, and the capacitors C0 in the two memory cells MC are arranged almost symmetrically about the plug 544b. The plug 544b is shared by the two memory cells MC, whereby the top area of the cell array 70 can be reduced.

Here, in the semiconductor device 10 of one embodiment of the present invention, it is possible to provide the transistor Tr1 in the sub memory cell NMC and the transistor Tr2 in the sub memory cell DMC in the same layer. That is, the transistors in the two kinds of sub memory cells can be manufactured using the semiconductor layer, the insulators, the conductors, and the like which are common. The manufacturing cost can be reduced using the semiconductor layer and the like which are common, for example.

The transistors Tr1 and Tr2 of one embodiment of the present invention preferably include a charge trap layer between the semiconductor layer 406 and the conductor 413. In the transistors Tr1 and Tr2 in FIG. 22, an insulator 402b, an insulator 571a over the insulator 402b, and the insulator 402 over the insulator 571a are provided between the semiconductor layer 406 and the conductor 413.

For the insulators 402 and 402b, the description of the insulator 584 can be referred to, for example. Furthermore, the semiconductor device 10 does not necessarily include the insulator 402b. The insulator 402 may be formed using silicon oxide or silicon nitride oxide (here, the silicon nitride oxide preferably contains more nitrogen than oxide), for example. In addition, the insulator 402b may be formed using silicon oxide, for example.

For the insulator 571a, refer to the description of the insulator 571.

The insulator 571a preferably functions as the charge trap layer. The threshold values of the transistors Tr1 and Tr2 can be controlled by trapping charge in the insulator 571a. In this specification, the threshold value refers to, for example, gate voltage at which a channel is formed. For example, the threshold value can be calculated from a curve obtained in a graph where the horizontal axis represents the gate voltage $V_g$ and the vertical axis represents the square root of drain current $I_d$ ($V_g$-$\sqrt{I_d}$ characteristics); the threshold value corresponds to the gate voltage $V_g$ at the intersection of an extrapolated tangent line having the highest inclination with the square root of drain current $I_d$ of 0 (i.e., $I_d$ of 0 A).

Here, the transistor Tr1 includes the conductor 404 overlapping with the semiconductor layer 406 with the insulator 412 positioned therebetween and the conductor 413 overlapping with the semiconductor layer 406 with the insulators 571a, 402, and 402b positioned therebetween. The conductors 404 and 413 of the transistor Tr1 correspond to the gate electrodes 91 and 92 in FIG. 1B and the like, respectively.

As shown in the above embodiment, charge is trapped in at least one of the insulators 571a, 402, and 402b by providing a potential difference between the conductor 413 and the source electrode of the transistor Tr1; accordingly, data is stored. Alternatively, charge may be trapped at the interface between two insulators among the insulators 571a, 402, and 402b, which are in contact with each other.

The transistor Tr2 may also include the conductor 413. Charge is trapped in at least one of the insulators 402 and 402b by providing a potential difference between the conductor 413 and the source electrode of the transistor Tr2, so that the threshold value of the transistor Tr2 can be controlled. The conductors 404 and 413 of the transistor Tr2 correspond to the gate electrodes 94 and 95 in FIG. 1B and the like, respectively.

The transistors Tr1 and Tr2 each include the two conductors 404 and 413, whereby current of the transistors can be increased in some cases.

The electron trap layer can be formed using an insulator, a semiconductor, and a conductor. The insulator can be formed using silicon oxide, silicon oxynitride, silicon nitride oxide, silicon nitride, hafnium oxide, aluminum oxide, tantalum oxide, aluminum silicate, or the like. The semiconductor can be formed using polycrystalline silicon, microcrystalline silicon, amorphous silicon, an oxide semiconductor, or the like. The conductor can be formed using tantalum, tungsten, titanium, molybdenum, aluminum, copper, a molybdenum-tungsten alloy, or the like. Alternatively, the conductor can be a multilayer film selected as appropriate from tantalum nitride, tungsten nitride, titanium nitride, and the like through which oxygen is hardly allowed to pass.

The charge trap layer preferably contains oxygen and a metal, for example. In the charge trap layer, the percentage of a metal determined by energy dispersive X-ray spectrometry (EDX) is preferably greater than or equal to 20 atomic % and less than or equal to 50 atomic %, and the percentage of oxygen determined by EDX is preferably greater than or equal to 30 atomic % and less than or equal to 70 atomic %. Examples of the metal include hafnium, aluminum, tantalum, tungsten, and molybdenum.

Alternatively, the charge trap layer preferably contains silicon nitride. In the charge trap layer, the percentage of nitrogen is preferably greater than or equal to 45 atomic % and less than 60 atomic %, and the percentage of silicon is preferably greater than or equal to 40 atomic % and less than 55 atomic %.

The insulator 571a may have a stacked-layer structure of a layer that easily traps charge and a layer that hardly transmits an impurity. For example, as the layer that easily traps charge, hafnium oxide is forming, and, as the layer that hardly transmits an impurity, aluminum oxide is stacked thereover. Alternatively, hafnium oxide may be formed over aluminum oxide. Further alternatively, three layers of hafnium oxide, aluminum oxide, and silicon oxide may be stacked. Here, the stacking order of the three layers is not limited.

The insulators 571 and 571a in the semiconductor device 10 can suppress the diffusion of hydrogen, water, or the like in the layer 627 into the transistor Tr1 and the like. In addition, the insulator 408 of the semiconductor device 10 can suppress the diffusion of an impurity, such as hydrogen or water, from above the insulator 408. In the case where the transistor Tr1 and the like include an oxide semiconductor, for example, the deterioration in characteristics of the transistor can be suppressed in some cases by suppressing the diffusion of hydrogen into the oxide semiconductor.

The material described as the material of the conductor 511 or the like can be used as each of the conductors 416a and 416b, for example. In the case where a material that is easily bonded to oxygen, for example, tungsten or titanium is used as each of the conductors 416a and 416b, an oxide of the material is formed, so that oxygen vacancies in the semiconductor layer 406 are increased in and near a region where the semiconductor layer 406 is in contact with the conductors 416a and 416b. When hydrogen is bonded to an oxygen vacancy, the carrier density is increased and the resistivity is decreased in the region. Each of the conductors 416a and 416b may be formed of stacked films.

The material described as the material of the insulator 571 can be used as the insulator 408. Excess oxygen is preferably supplied to the interface between the insulator 408 and a film under the insulator 408 and the vicinity of the interface at the time of formation of the insulator 408.

When the insulators 571, 571a, and 408 are formed using a material with low oxygen permeability, the diffusion of oxygen from the transistor Tr1 and the like to the outside (e.g., the diffusion of oxygen to a layer under the insulator 571 and a layer over the insulator 408) can be suppressed. Accordingly, oxygen can be supplied to the transistor Tr1 and the like efficiently. In the case where the transistor Tr1 and the like include an oxide semiconductor, for example, easy supply of oxygen to the oxide semiconductor might improve transistor characteristics.

<Layer 630>

The layer 630 includes an insulator 592, conductors such as the conductor 514, and plugs such as the plug 545. The plug 545 and the like are connected to the conductors such as the conductor 514.

<Layer 631>

The layer 631 includes the capacitor C0. The capacitor C0 includes the conductor 516, a conductor 517, and an insulator 572. The insulator 572 includes a region positioned between the conductors 516 and 517. The layer 631 preferably includes an insulator 593 and a plug 547 over the conductor 517. The plug 547 is preferably formed to be embedded in the insulator 593. The layer 631 preferably includes a conductor 516b connected to a plug (not illustrated) in the layer 630 and a plug 547b over the conductor 516b. For the insulator 572, refer to the description of the insulator 571.

The layer 631 may include a wiring layer connected to the plugs 547 and 547b. In the example illustrated in FIG. 22, the wiring layer includes a conductor 518 and the like connected to the plugs 547 and 547b, a plug 548 over the conductor 518, an insulator 594, a conductor 519 over the plug 548, and an insulator 599 over the conductor 519. The plug 548 is preferably formed to be embedded in the insulator 594. The insulator 599 includes an opening over the conductor 519.

The insulators, conductors, and semiconductor layers can be formed by a sputtering method, a CVD method (including a thermal CVD method, an MOCVD method, a PECVD method, and the like), an MBE method, an ALD method, a PLD method, or the like. In particular, the insulators are preferably formed by a CVD method and further preferably a plasma CVD method, because coverage can be further improved. It is preferable to use a thermal CVD method, an MOCVD method, or an ALD method in order to reduce plasma damage.

Figure 24:
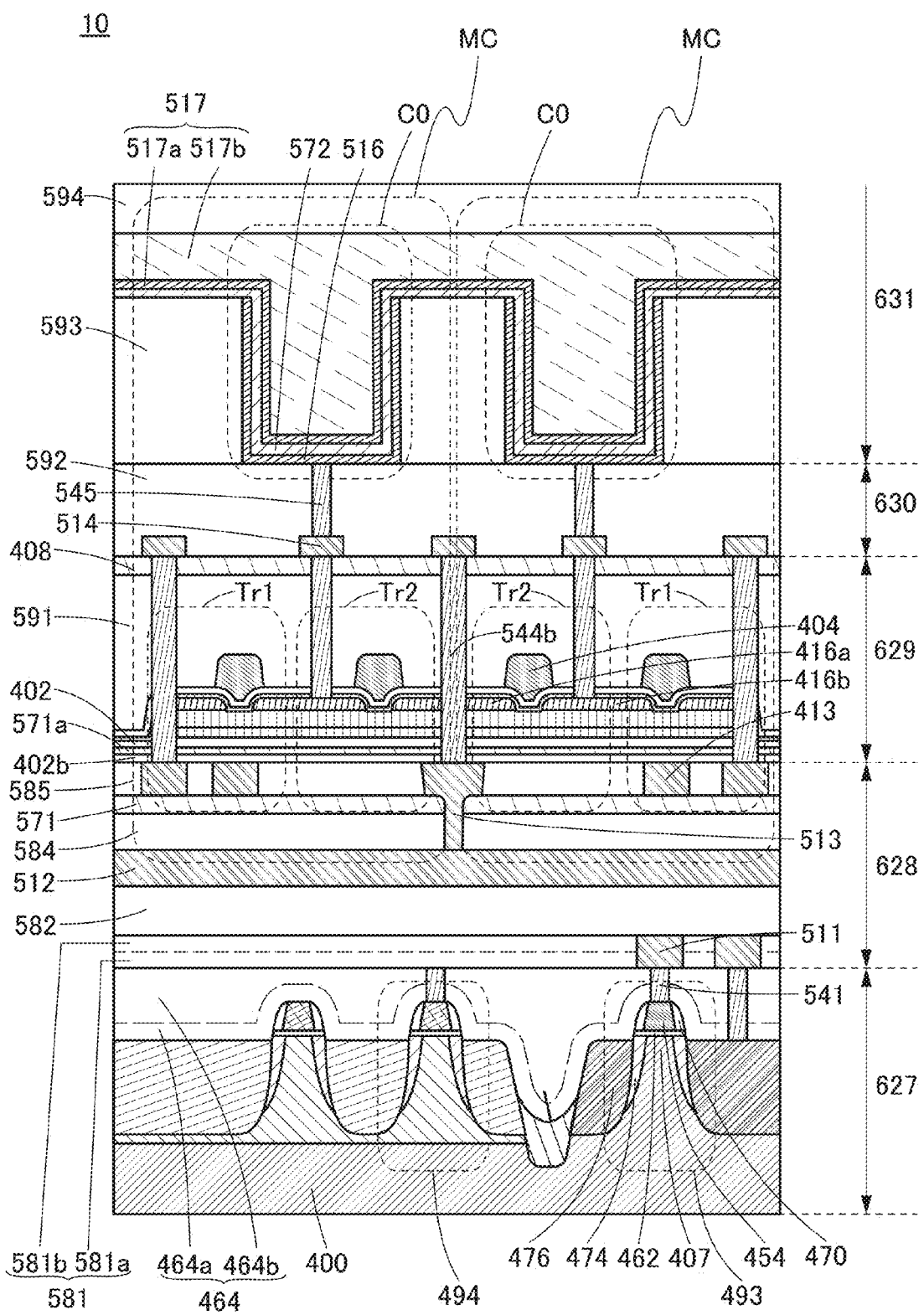
FIG. 24 is a cross-sectional view illustrating a structure example of a semiconductor device.

The semiconductor device 10 illustrated in FIG. 24 is different from that illustrated in FIG. 22 in the shape of the capacitor C0. In FIG. 24, the conductor 516 in the capacitor C0 is provided along an inner surface of a recessed portion provided in the insulator 593. The conductor 516 is provided in the recessed portion of the insulator 593, whereby the capacitance of the capacitor C0 can be increased in some cases. In FIG. 22, the conductor 416a of the transistor Tr2 is connected to the conductor 519 through the plug 548 and the like in the layer 631, whereas in FIG. 24, the conductor 416a of the transistor Tr2 is connected to a conductor 512 and the like in the layer 628 through a plug 544b, the conductor 513, and the like.

Figure 25A:
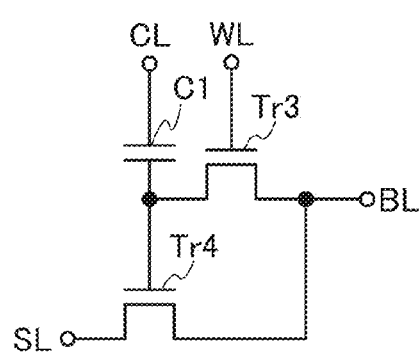
FIGS. 25A and 25B are a circuit diagram and a cross-sectional view illustrating a structure example of a semiconductor device.

The semiconductor device 10 may include a circuit illustrated in FIG. 25A. The circuit in FIG. 25A functions as a memory element.

The circuit in FIG. 25A includes a transistor Tr3, a transistor Tr4, and a capacitor C1. One of a source electrode and a drain electrode of the transistor Tr3 is electrically connected to one electrode of the capacitor C1, and the other of the source electrode and the drain electrode thereof is connected to a terminal BL. The other electrode of the capacitor C1 is connected to a terminal CL. A gate electrode of the transistor Tr4 is electrically connected to the one electrode of the capacitor C1. One of a source electrode and a drain electrode of the transistor Tr4 is connected to the terminal BL, and the other of the source electrode and the drain electrode thereof is connected to a terminal SL.

Figure 25B:
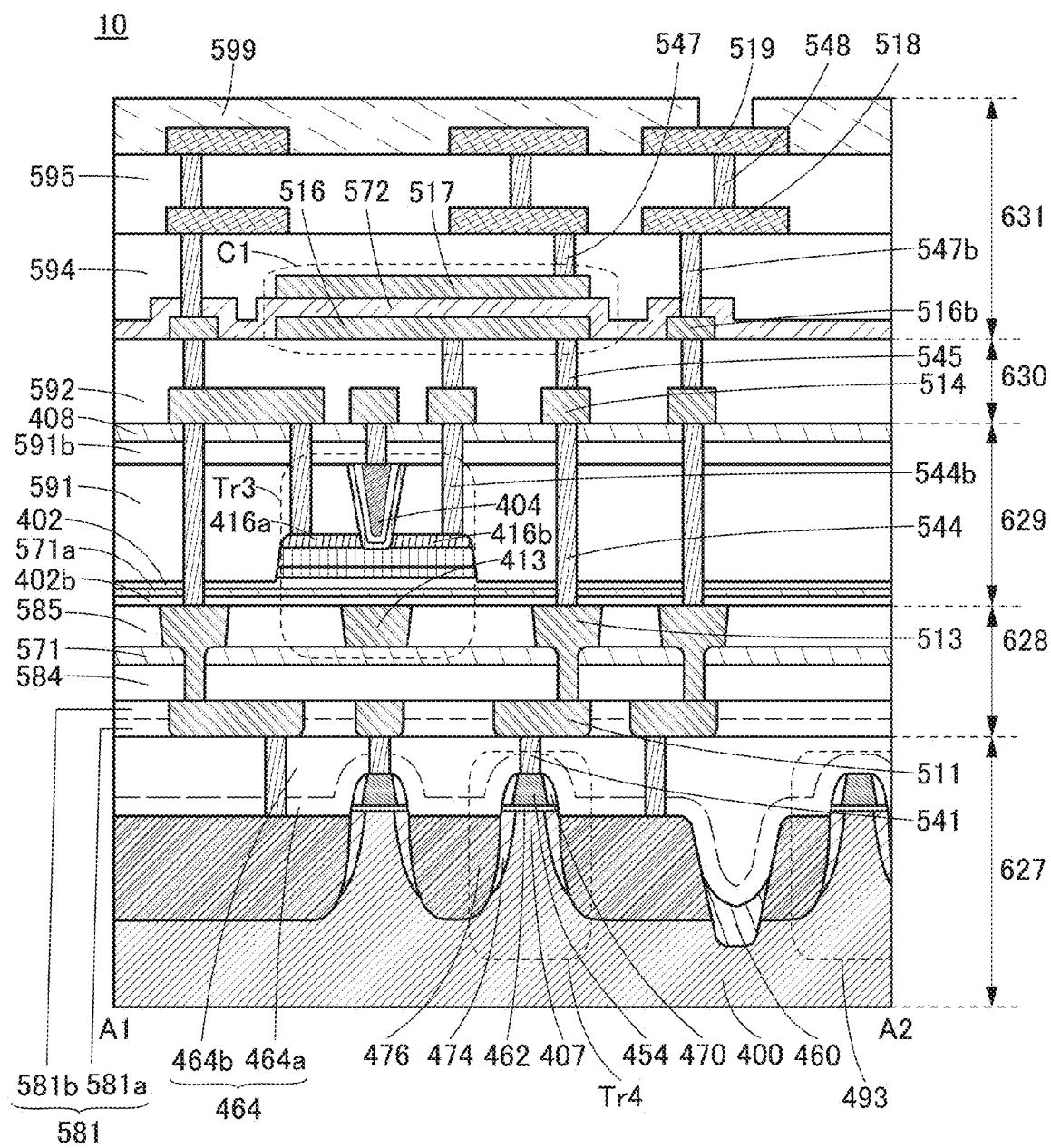

FIG. 25B illustrates an example of the cross section of the semiconductor device 10 including the circuit in FIG. 25A. The transistor Tr3 preferably contains an oxide semiconductor. The transistor Tr3 is provided in the layer 629. For the structure of the transistor Tr3, refer to the description of the transistor Tr2. The transistor Tr3 is preferably provided in the layer 627. For the structure of the transistor Tr3, refer to the description of the transistor 493.

<Transistors 493 and 494>

The transistors 493 and 494 are described below.

The transistor 493 includes the following components: a channel formation region 407; an insulator 462 over the substrate 400; a conductor 454 over the insulator 462; an insulator 470 in contact with a side surface of the conductor 454; a region 476 positioned in the substrate 400 and overlapping with neither the conductor 454 nor the insulator 470; and a region 474 positioned in the substrate 400 and overlapping with the insulator 470. The region 476 is a low-resistance layer and preferably functions as a source or drain region of the transistor 493. The region 474 preferably functions as a lightly doped drain (LDD) region.

The transistor 493 may be either a p-channel transistor or an n-channel transistor, and an appropriate transistor is used depending on the circuit configuration or the driving method. Here, for example, the polarity of the transistor 494 is opposite to that of the transistor 493.

The substrate 400 preferably contains, for example, a semiconductor such as a silicon-based semiconductor, and further preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the transistor 493 may be a high-electron-mobility transistor (HEMT) with GaAs, GaAlAs, or the like.

The region 476 preferably contains an element that imparts n-type conductivity, such as phosphorus, or an element that imparts p-type conductivity, such as boron.

The conductor 454 can be formed using a semiconductor material such as silicon containing the element that imparts n-type conductivity, such as phosphorus, or the element that imparts p-type conductivity, such as boron, or a conductive material such as a metal material, an alloy material, or a metal oxide material. It is preferable to use a high-melting-point material that has both heat resistance and conductivity, such as tungsten or molybdenum, and it is particularly preferable to use tungsten.

The transistors 493 and 494 illustrated in FIG. 22 and the like are examples in which element isolation is performed by a shallow trench isolation (STI) method or the like. Specifically, the transistors are electrically isolated by element isolation using an element isolation region 460 that is formed in such a manner that an insulator containing silicon oxide or the like is buried in a trench formed in the substrate 400 by etching or the like and then is partly removed by etching or the like.

In a projection of the substrate 400 which is positioned in a region other than the trench, the regions 476 and 474 and the channel formation region 407 are provided. Over the channel formation region 407, the insulator 462 that covers the channel formation region 407 and the conductor 454 that overlaps with the channel formation region 407 with the insulator 462 positioned therebetween are provided.

Figure 26A:
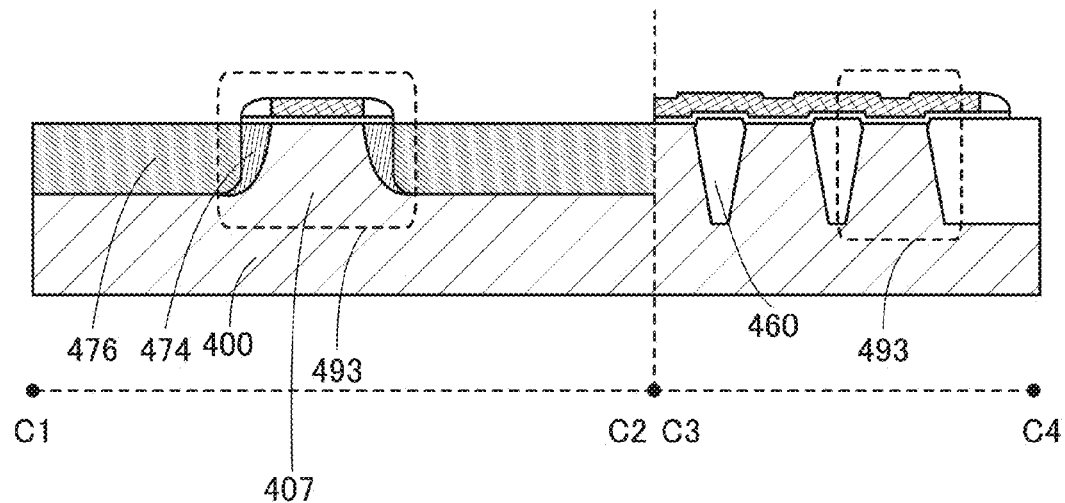
FIGS. 26A and 26B are cross-sectional views each illustrating a structure example of a semiconductor device.
Figure 26B:
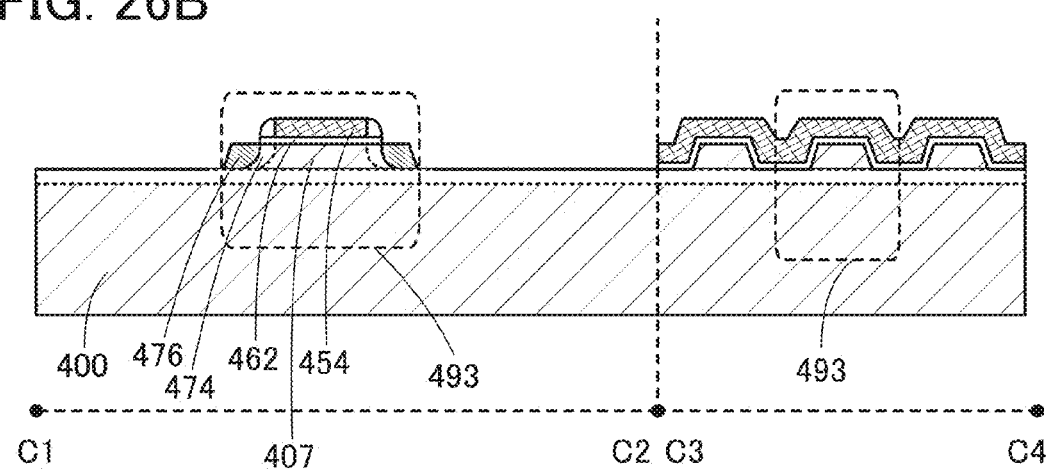

In the transistors 493 and 494, the projection is not necessarily provided in the substrate 400. An example of such a structure is illustrated in FIG. 26A. The transistors 493 and 494 may be formed using a silicon on insulator (SOI) substrate. Another example of such a structure is illustrated in FIG. 26B.

<Transistor 490>

Figure 27A:
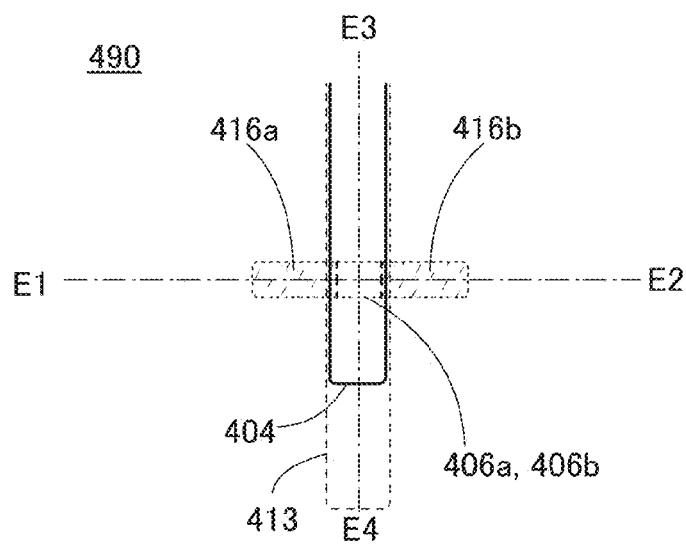
FIGS. 27A and 27B are a top view and a cross-sectional view illustrating a structure example of a semiconductor device.

FIG. 27A is a top view of the transistor (transistor 490) that can be used as each of the transistors Tr1 and Tr2 in FIG. 22 and the transistor Tr3 in FIGS. 25A and 25B. FIG. 27B is a cross-sectional view taken along dashed-dotted line E1-E2 and dashed-dotted line E3-E4 in FIG. 27A.

Figure 27B:
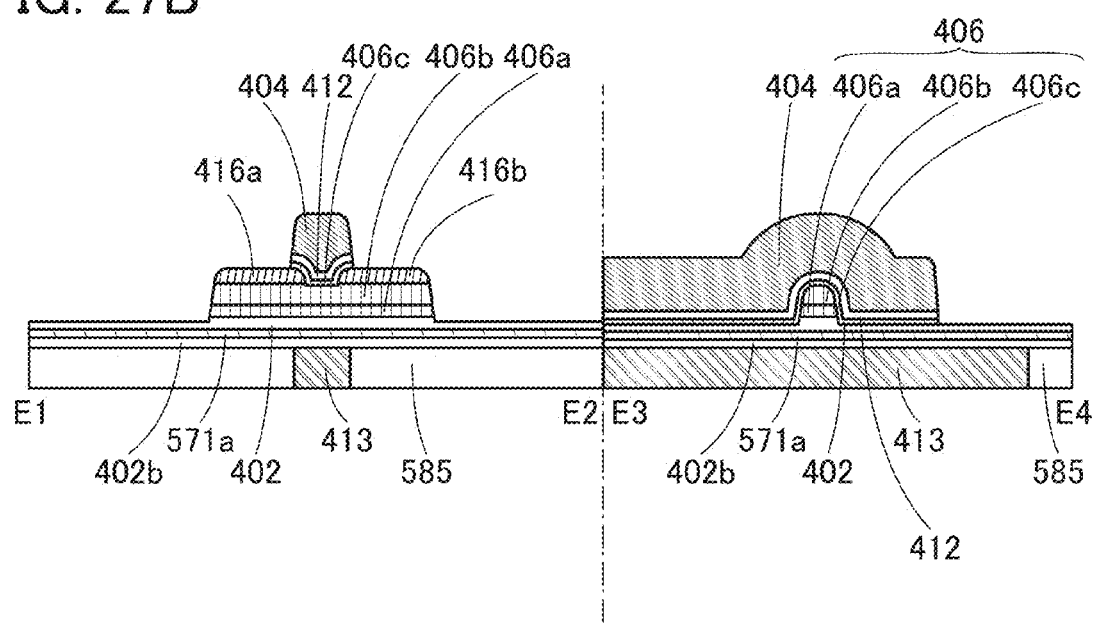

As illustrated in FIG. 27B, the semiconductor layer 406b can be electrically surrounded by an electric field of the conductor 404 (a structure in which a semiconductor is electrically surrounded by an electric field of a conductor is referred to as a surrounded channel (s-channel) structure). Therefore, a channel is formed in the entire semiconductor layer 406b (bulk) in some cases. In the s-channel structure, a large amount of current can flow between a source electrode and a drain electrode of a transistor, so that a high on-state current can be obtained.

The s-channel structure is suitable for a miniaturized transistor because a high on-state current can be obtained. A device including a miniaturized transistor can have a high integration degree and high density. For example, the transistor includes a region having a channel length preferably less than or equal to 40 nm, further preferably less than or equal to 30 nm, and still further preferably less than or equal to 20 nm, and a region having a channel width preferably less than or equal to 40 nm, further preferably less than or equal to 30 nm, and still further preferably less than or equal to 20 nm.

The shape of the transistor Tr3 in FIGS. 25A and 25B is different from those of the transistor Tr2 and the like in FIG. 22 and the like. For the transistor Tr3, the structures of the transistor Tr2 and the like in FIG. 22 and the like can be employed. For the transistors Tr1 and Tr2 in FIG. 22 and the like, the structure of the transistor Tr3 in FIGS. 25A and 25B and the like can be employed.

The transistor Tr3 in FIGS. 25A and 25B includes the semiconductor layer 406a over the insulator 402, the semiconductor layer 406b over the semiconductor layer 406a, the conductors 416a and 416b over the semiconductor layer 406b, the semiconductor layer 406c in contact with a top surface of the semiconductor layer 406b, the insulator 412 over the semiconductor layer 406c, the conductor 404 over the insulator 412, an insulator 591b over the conductors 416a and 416b, and the insulator 408 over the insulator 591b and the conductor 404.

As illustrated in FIGS. 25A and 25B, it is preferable that the insulator 412 be stacked over the semiconductor layer 406c, and the semiconductor layer 406c and the insulator 412 be formed on a side surface of an opening in the insulator 591b. The conductor 404 is preferably formed to fill the opening whose inner wall is covered with the semiconductor layer 406c and the insulator 412. The conductor 404 is preferably formed over the region between the conductors 416a and 416b (a dividing region) with the insulator 412 positioned therebetween.

Figure 37A:
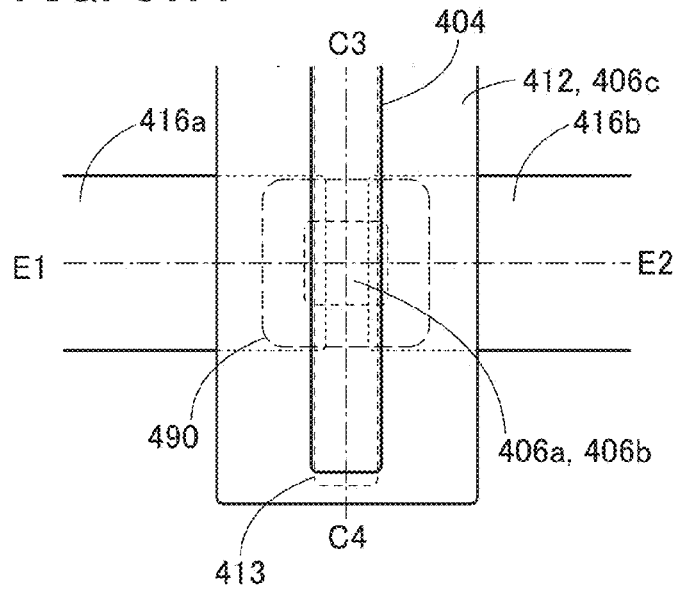
FIGS. 37A and 37B are a top view and a cross-sectional view illustrating a structure example of a semiconductor device.
Figure 37B:
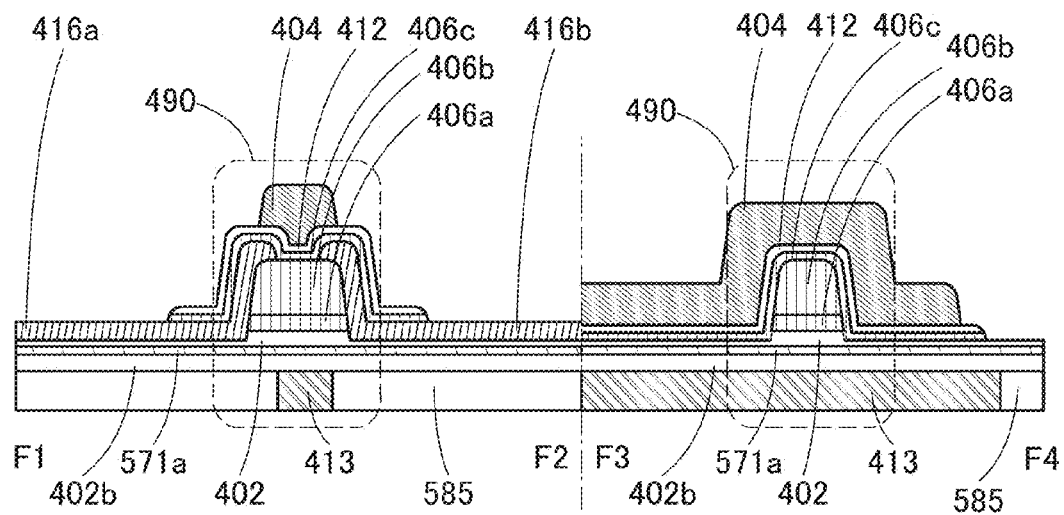
Figure 38A:
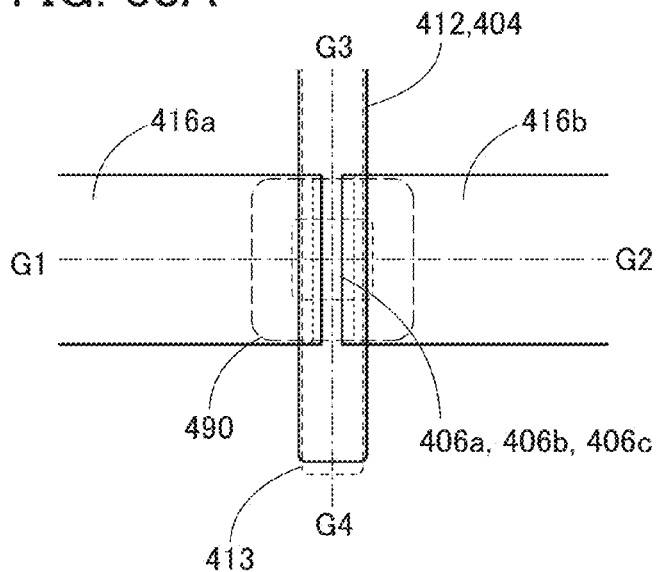
FIGS. 38A and 38B are a top view and a cross-sectional view illustrating a structure example of a semiconductor device.
Figure 38B:
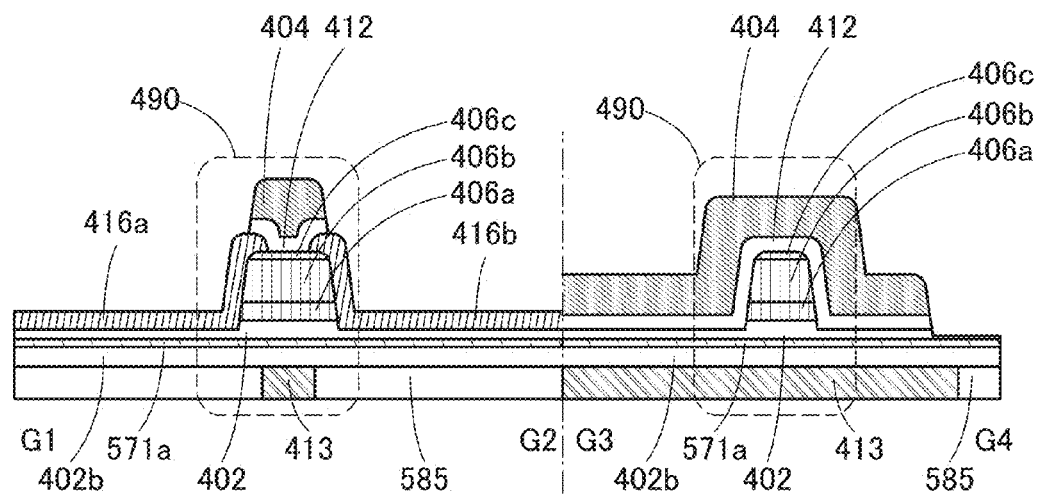
Figure 39A:
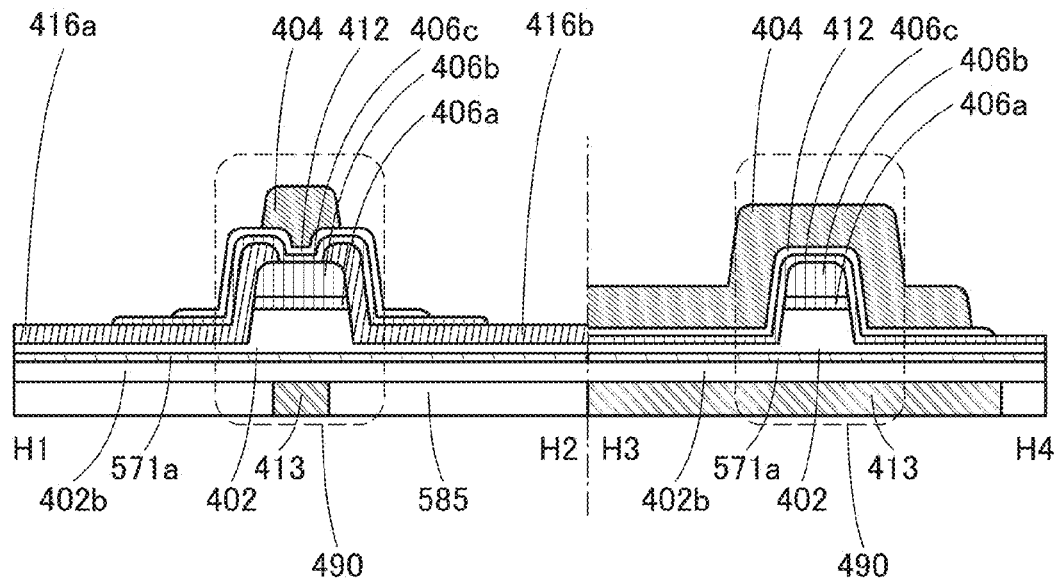
FIGS. 39A and 39B are a top view and a cross-sectional view illustrating a structure example of a semiconductor device.
Figure 39B:
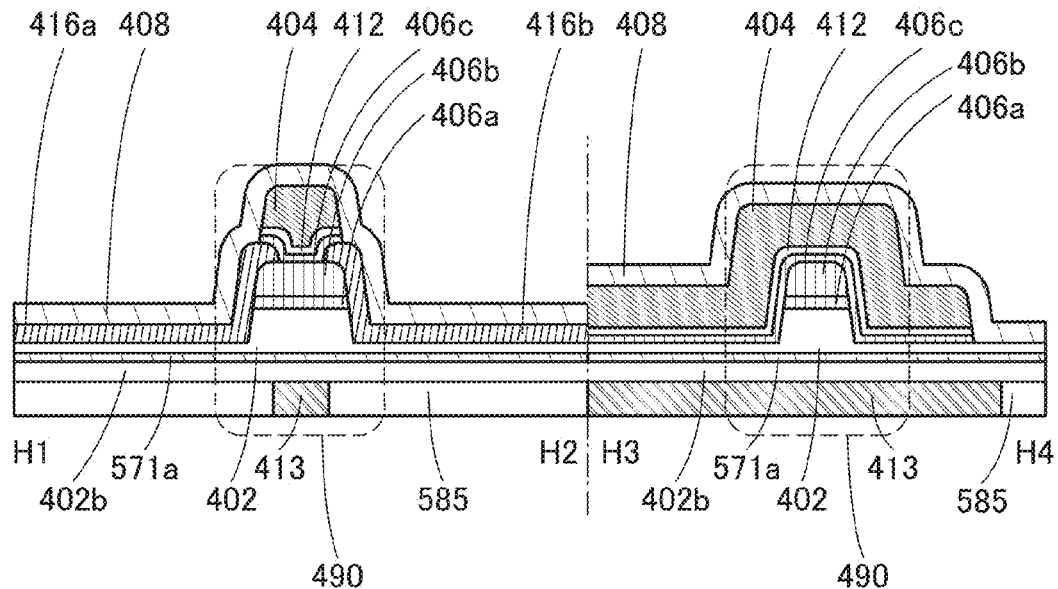
Figure 40A:
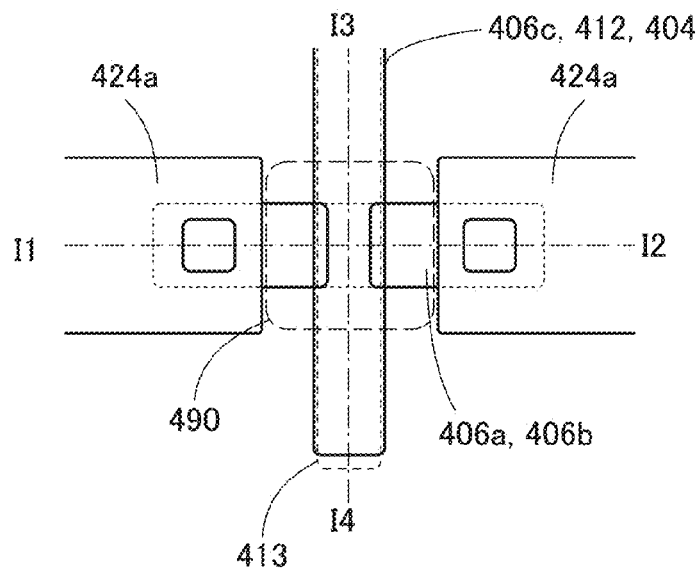
FIGS. 40A and 40B are a top view and a cross-sectional view illustrating a structure example of a semiconductor device.
Figure 40B:
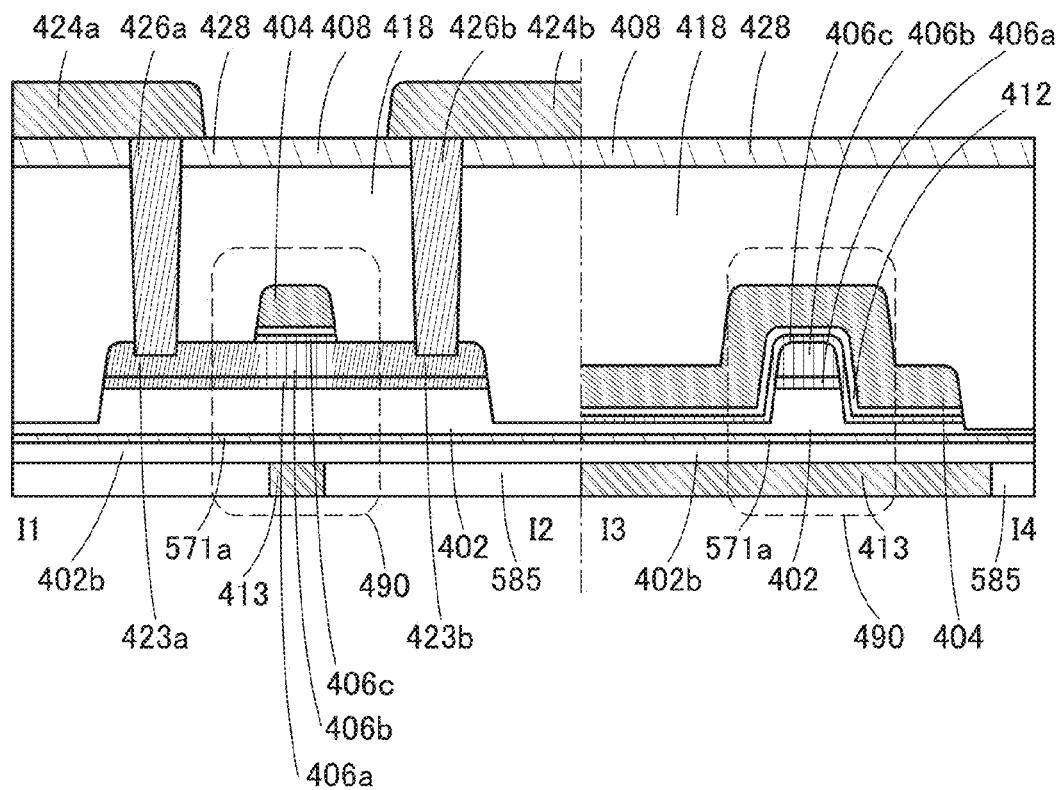

Instead of the structure of the transistor 490 in FIGS. 27A and 27B, a structure illustrated in FIGS. 37A and 37B, a structure illustrated in FIGS. 38A and 38B, a structure illustrated in FIGS. 39A and 39B, or a structure illustrated in FIGS. 40A and 40B may be employed.

FIG. 37A is an example of the top view of the transistor 490. FIG. 37B is a cross-sectional view taken along dashed-dotted line F1-F2 and dashed-dotted line F3-F4 in FIG. 37A.

The transistor 490 illustrated in FIG. 37B includes the following components: the insulator 402; the semiconductor layer 406a over the insulator 402; the semiconductor layer 406b over the semiconductor layer 406a; the conductors 416a and 416b in contact with a side surface of the semiconductor layer 406a and the top surface and the side surface of the semiconductor layer 406b; the semiconductor layer 406c in contact with the side surface of the semiconductor layer 406a, the top surface and the side surface of the semiconductor layer 406b, a top surface and a side surface of the conductor 416a, and a top surface and a side surface of the conductor 416b; the insulator 412 over the semiconductor layer 406c; and the conductor 404 over the insulator 412.

FIG. 38A is an example of the top view of the transistor 490. FIG. 38B is a cross-sectional view taken along dashed-dotted line G1-G2 and dashed-dotted line G3-G4 in FIG. 38A.

The transistor 490 illustrated in FIGS. 38A and 38B includes the following components: the insulator 402; the semiconductor layer 406a over a projection of the insulator 402; the semiconductor layer 406b over the semiconductor layer 406a; the semiconductor layer 406c over the semiconductor layer 406b; the conductors 416a and 416b that are spaced and in contact with the semiconductor layers 406a, 406b, and 406c; the insulator 412 over the semiconductor layer 406c and the conductors 416a and 416b; and the conductor 404 over the insulator 412.

The insulator 412 is in contact with at least the side surface of the semiconductor layer 406b in the cross section G3-G4. The conductor 404 faces the top surface and the side surface of the semiconductor layer 406b with at least the insulator 412 positioned therebetween in the cross section G3-G4.

A structure in which an end of the semiconductor layer 406c is not aligned with an end of the insulator 412 as illustrated in FIG. 39A may be employed. In addition, a structure in which an end of the conductor 404 is substantially aligned with the end of the semiconductor layer 406c and the end of the insulator 412 as illustrated in FIG. 39B may be employed. Alternatively, the insulator 408 may be provided in the transistor 490 so as to be in contact with top surfaces of the conductors 404, 416a, and 416b as illustrated in FIG. 39B, for example.

FIG. 40A is an example of the top view of the transistor 490. FIG. 40B is a cross-sectional view taken along dashed-dotted line 11-12 and dashed-dotted line 13-14 in FIG. 40A. Note that some components such as an insulator are omitted in FIG. 40A for easy understanding.

In the transistor 490 illustrated in FIGS. 40A and 40B, the conductors 416a and 416b are not included, and a conductor 426a and a conductor 426b are in contact with the semiconductor layer 406b. In this case, a low-resistance region 423a (a low-resistance region 423b) is preferably provided in a region in contact with at least the conductors 426a and 426b in the semiconductor layer 406b and/or the semiconductor layer 406a. The low-resistance regions 423a and 423b may be formed in such a manner that, for example, the conductor 404 or the like is used as a mask and impurities are added to the semiconductor layer 406b and/or the semiconductor layer 406a. The conductors 426a and 426b may be provided in holes (portions which penetrate) or recessed portions (portions which do not penetrate) of the semiconductor layer 406b. When the conductors 426a and 426b are provided in holes or recessed portions of the semiconductor layer 406b, contact areas between the conductors 426a and 426b and the semiconductor layer 406b are increased; thus, the adverse effect of the contact resistance can be decreased. In other words, the on-state current of the transistor can be increased.

Embodiment 3

In this embodiment, examples of a semiconductor device which includes a plurality of circuits including OS transistors described in the above embodiment will be described with reference to FIGS. 28A to 28E, FIGS. 29A and 29B, FIGS. 30A and 30B, FIGS. 31A to 31C, FIGS. 32A and 32B, FIGS. 33A to 33C, and FIGS. 34A and 34B.

Figure 28A:
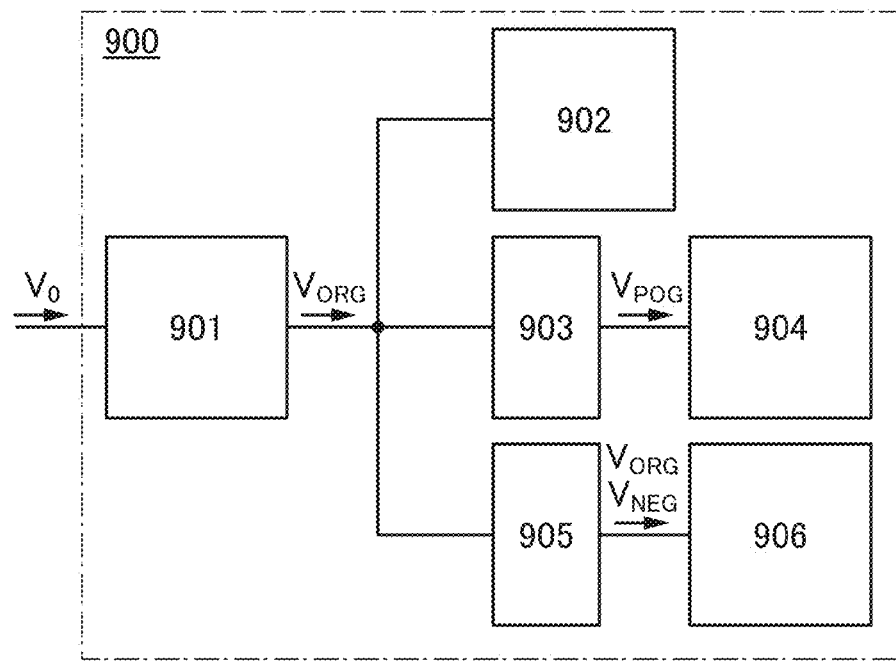
FIGS. 28A to 28E are a block diagram and waveform diagrams illustrating one embodiment of the present invention.

FIG. 28A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without the supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}>V_{SS}$). For example, the power supply voltage of the circuit 904 is a voltage applied on the basis of a voltage $V_{POG}$ and the voltage $V_{SS}$ ($V_{POG}>V_{ORG}$). For example, the power supply voltages of the circuit 906 are voltages applied on the basis of the voltage $V_{ORG}$, the voltage $V_{SS}$, and a voltage $V_{NEG}$ ($V_{ORG}>V_{SS}>V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 28B:
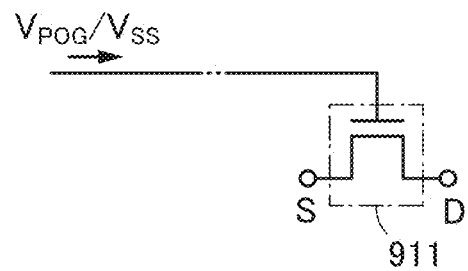
Figure 28C:
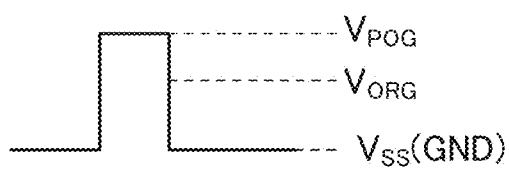

FIG. 28B illustrates an example of the circuit 904 that operates with the voltage $V_{POG}$ and FIG. 28C illustrates an example of a waveform of a signal for operating the circuit 904.

FIG. 28B illustrates a transistor 911. A signal supplied to a gate electrode of the transistor 911 is generated on the basis of, for example, the voltage $V_{POG}$ and the voltage $V_{SS}$. The signal is generated on the basis of the voltage $V_{POG}$ at the time when the transistor 911 is turned on and on the basis of the voltage $V_{SS}$ at the time when the transistor 911 is turned off. As illustrated in FIG. 28C, the voltage $V_{POG}$ is higher than the voltage $V_{ORG}$. Therefore, an operation for bringing a source electrode (S) and a drain electrode (D) of the transistor 911 into a conduction state can be performed more surely. As a result, the frequency of malfunction of the circuit 904 can be reduced.

Figure 28D:
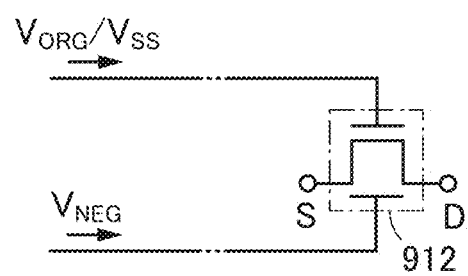
Figure 28E:
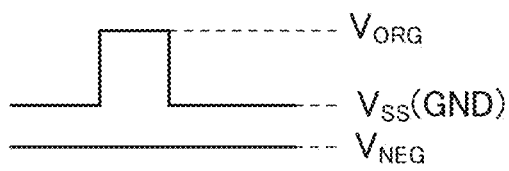

FIG. 28D illustrates an example of the circuit 906 that operates with the voltage $V_{NEG}$ and FIG. 28E illustrates an example of a waveform of a signal for operating the circuit 906.

FIG. 28D illustrates a transistor 912 having a back gate electrode. A signal supplied to a gate electrode of the transistor 912 is generated on the basis of, for example, the voltage $V_{ORG}$ and the voltage $V_{SS}$. The signal has generated on the basis of the voltage $V_{ORG}$ at the time when the transistor 911 is turned on and on the basis of the voltage $V_{SS}$ at the time when the transistor 911 is turned off. A signal supplied to the back gate electrode of the transistor 912 is generated on the basis of the voltage $V_{NEG}$. As illustrated in FIG. 28E, the voltage $V_{NEG}$ is lower than the voltage $V_{SS}$ (GND). Therefore, the threshold voltage of the transistor 912 can be controlled so as to be shifted in the positive direction. Thus, the transistor 912 can be surely turned off and a current flowing between a source electrode (S) and a drain electrode (D) can be reduced. As a result, the frequency of malfunction of the circuit 906 can be reduced and power consumption thereof can be reduced.

The voltage $V_{NEG}$ may be directly supplied to the back gate electrode of the transistor 912. Alternatively, a signal supplied to the gate electrode of the transistor 912 may be generated on the basis of the voltage $V_{ORG}$ and the voltage $V_{NEG}$ and the generated signal may be supplied to the back gate electrode of the transistor 912.

Figure 29A:
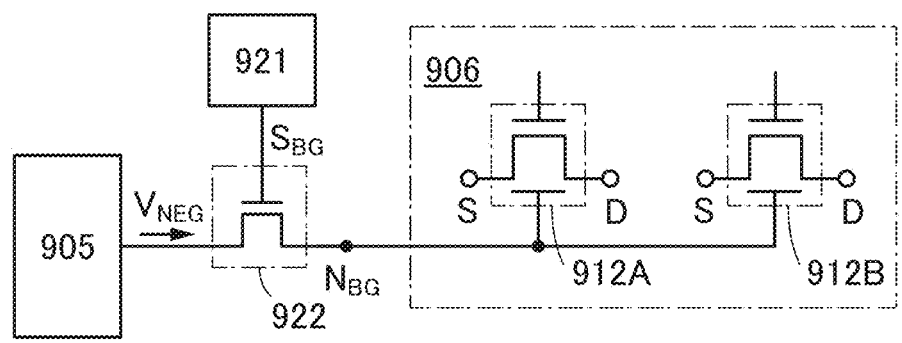
FIGS. 29A and 29B are a circuit diagram and a timing chart illustrating one embodiment of the present invention.
Figure 29B:
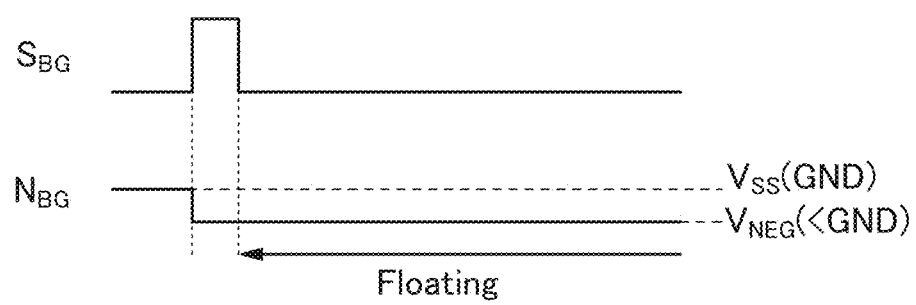

FIGS. 29A and 29B illustrate a modification example of FIGS. 28D and 28E.

In a circuit diagram illustrated in FIG. 29A, a transistor 922 whose conduction state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the conduction state of the transistor 922. Transistors 912A and 912B included in the circuit 906 are the same OS transistors as the transistor 922.

A timing chart in FIG. 29B shows changes in a potential of the control signal $S_{BG}$ and a potential of the node $N_{BG}$. The potential of the node $N_{BG}$ indicates the states of potentials of back gate electrodes of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 30A:
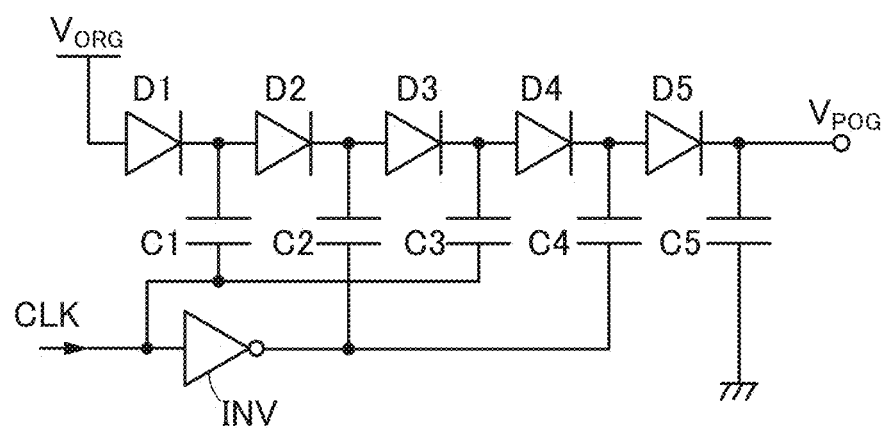
FIGS. 30A and 30B are each a circuit diagram illustrating one embodiment of the present invention.

FIG. 30A illustrates an example of a circuit configuration applicable to the above-described voltage generation circuit 903. The voltage generation circuit 903 illustrated in FIG. 30A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that a forward voltage of the diodes D1 to D5 is 0 V. A desired voltage $V_{POG}$ can be obtained when the number of stages of the charge pump is changed.

Figure 30B:
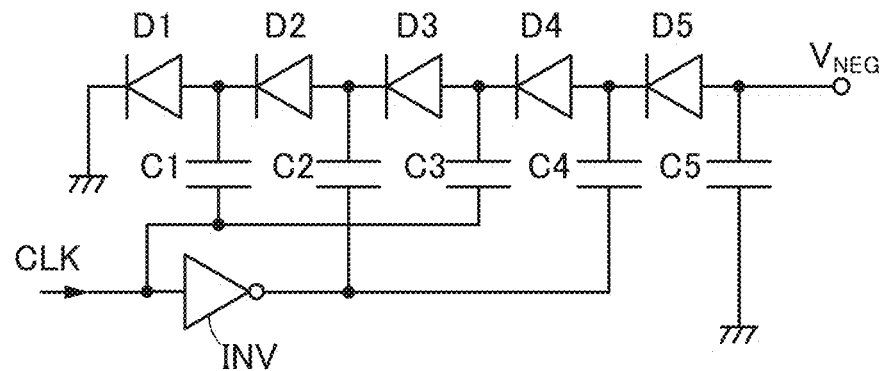

FIG. 30B illustrates an example of a circuit configuration applicable to the above-described voltage generation circuit 905. The voltage generation circuit 905 illustrated in FIG. 30B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that a forward voltage of the diodes D1 to D5 is 0 V. A desired voltage $V_{NEG}$ can be obtained when the number of stages of the charge pump is changed.

The circuit configuration of the voltage generation circuit 903 is not limited to the configuration of the circuit diagram illustrated in FIG. 30A. Modification examples of the voltage generation circuit 903 are shown in FIGS. 31A to 31C and FIGS. 32A and 32B.

Figure 31A:
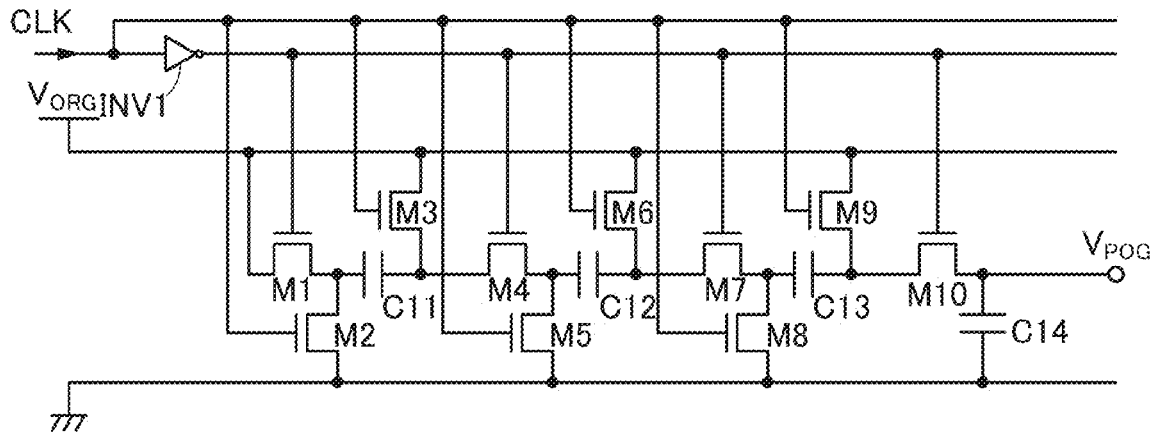
FIGS. 31A to 31C are each a circuit diagram illustrating one embodiment of the present invention.

The voltage generation circuit 903A illustrated in FIG. 31A includes transistors M1 to M10, capacitors C11 to C14, and an inverter INV1. The clock signal CLK is supplied to gate electrodes of the transistors M1 to M10 directly or through the inverter INV1. By application of the clock signal CLK, the voltage $V_{POG}$, which has been increased to a positive voltage having a positively quadrupled value of the voltage $V_{ORG}$, can be obtained. A desired voltage $V_{POG}$ can be obtained when the number of stages is changed. In the voltage generation circuit 903A in FIG. 31A, when OS transistors are used as the transistors M1 to M10, the off-state current can be reduced, so that leakage of charge held in the capacitors C11 to C14 can be inhibited. Thus, efficient voltage increase from the voltage $V_{ORG}$ to the voltage $V_{POG}$ is possible.

Figure 31B:
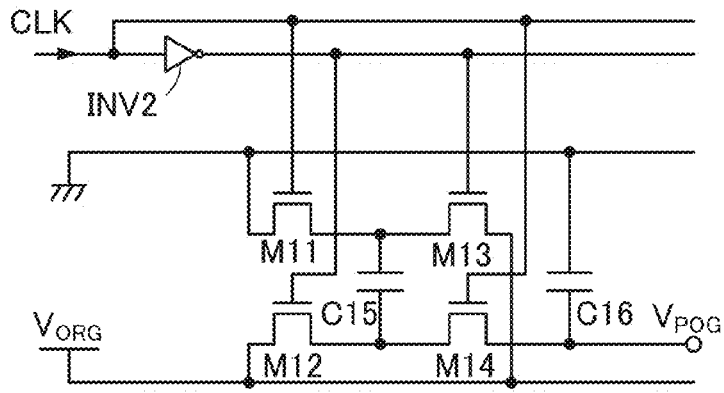

A voltage generation circuit 903B illustrated in FIG. 31B includes transistors M11 to M14, capacitors C15 and C16, and an inverter INV2. The clock signal CLK is supplied to gate electrodes of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 903B in FIG. 31B, when OS transistors are used as the transistors M11 to M14, the off-state current can be reduced, so that leakage of charge held in the capacitors C15 to C16 can be inhibited. Thus, efficient voltage increase from the voltage $V_{ORG}$ to the voltage $V_{POG}$ is possible.

Figure 31C:
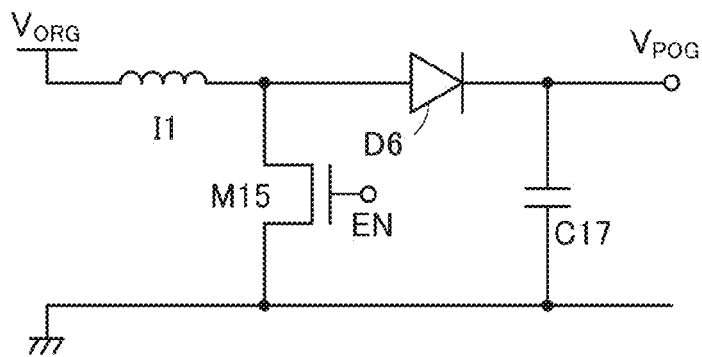

A voltage generation circuit 903C illustrated in FIG. 31C includes an inductor I1, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 31C increases the voltage using the inductor I1, the voltage can be increased efficiently.

Figure 32A:
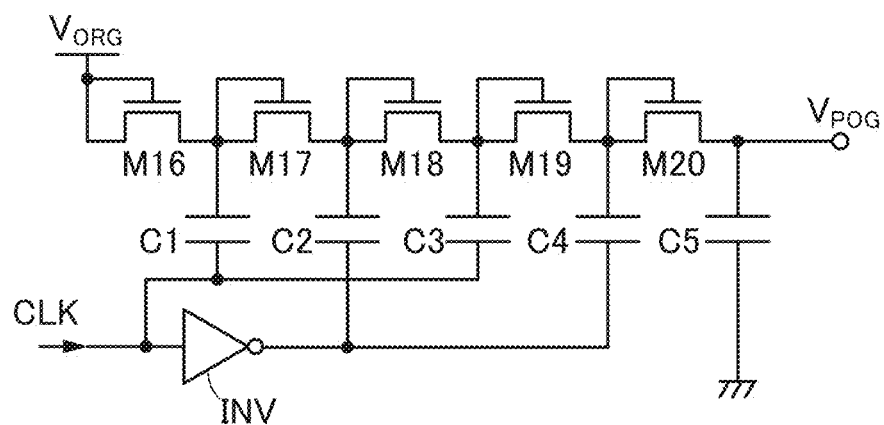
FIGS. 32A and 32B are each a circuit diagram illustrating one embodiment of the present invention.

A voltage generation circuit 903D illustrated in FIG. 32A has a configuration in which the diodes D1 to D5 of the voltage generation circuit 903 in FIG. 30A are replaced with diode-connected transistors M16 to M20. In the voltage generation circuit 903D in FIG. 32A, when OS transistors are used as the transistors M16 to M20, the off-state current can be reduced, so that leakage of charge held in the capacitors C1 to C5 can be inhibited. Thus, efficient voltage increase from the voltage $V_{ORG}$ to the voltage $V_{POG}$ is possible.

Figure 32B:
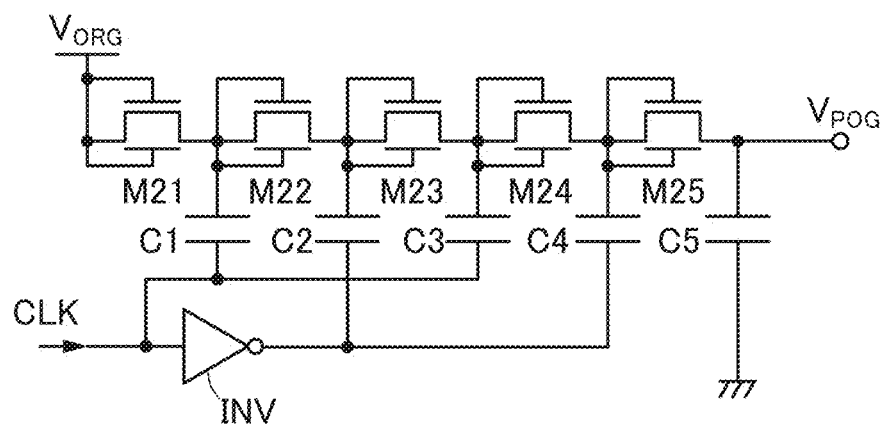
Figure 33A:
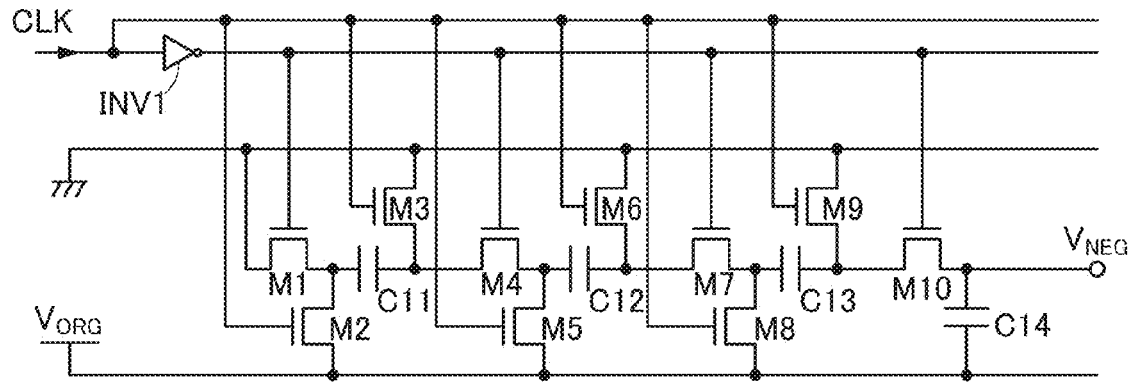
FIGS. 33A to 33C are each a circuit diagram illustrating one embodiment of the present invention.
Figure 33B:
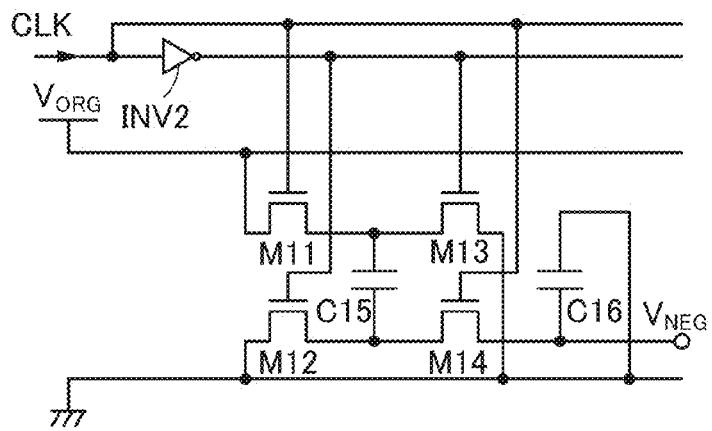
Figure 33C:
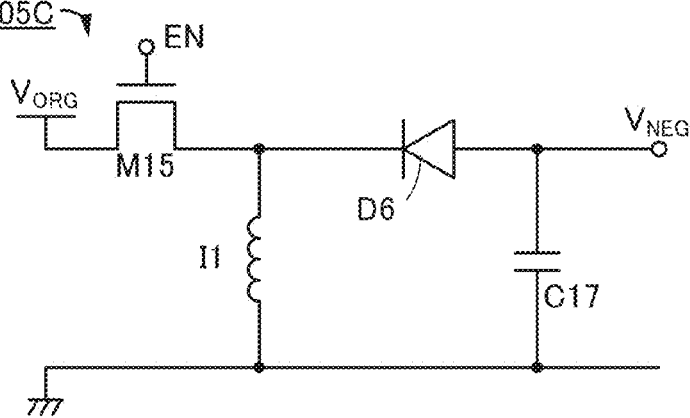
Figure 34A:
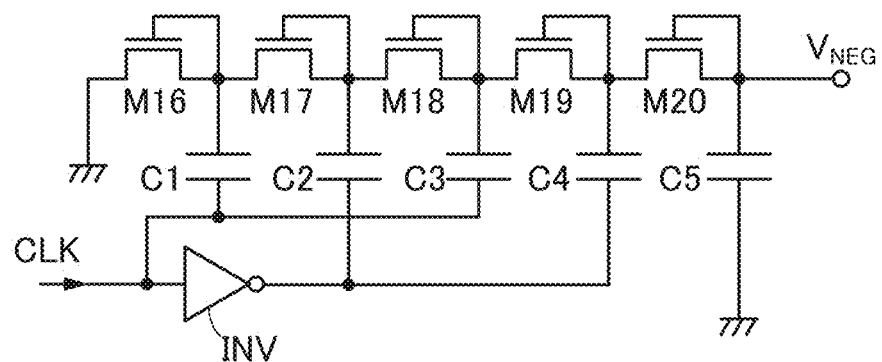
FIGS. 34A and 34B are each a circuit diagram illustrating one embodiment of the present invention.
Figure 34B:
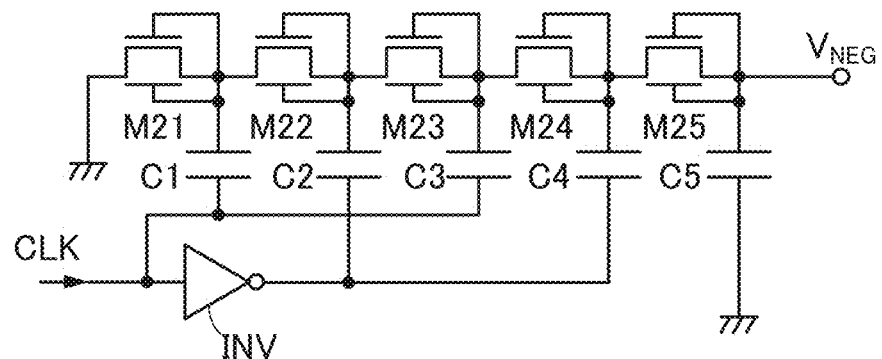

A voltage generation circuit 903E illustrated in FIG. 32B has a configuration in which the transistors M16 to M20 of the voltage generation circuit 903D in FIG. 32A are replaced with transistors M21 to M25 having back gate electrodes. In the voltage generation circuit 903E in FIG. 32B, the back gate electrodes can be supplied with voltages that are the same as those of the gate electrodes, so that the current flowing through the transistors can be increased. Thus, efficient voltage increase from the voltage $V_{ORG}$ to the voltage $V_{POG}$ is possible.

Note that the modification examples of the voltage generation circuit 903 can also be applied to the voltage generation circuit 905 in FIG. 30B. The configurations of a circuit diagram in this case are illustrated in FIGS. 33A to 33C and FIGS. 34A and 34B. In a voltage generation circuit 905A illustrated in FIG. 33A, the voltage $V_{NEG}$ which has been reduced from the voltage $V_{SS}$ to a negative voltage having a negatively tripled value of the voltage $V_{ORG}$ by application of the clock signal CLK, can be obtained. In a voltage generation circuit 905B illustrated in FIG. 33B, the voltage $V_{NEG}$ which has been reduced from the voltage $V_{SS}$ to a negative voltage having a negatively doubled value of the voltage $V_{ORG}$ by application of the clock signal CLK, can be obtained.

The voltage generation circuits 905A to 905E illustrated in FIGS. 33A to 33C and FIGS. 34A and 34B have configurations formed by changing the voltages applied to the wirings or the arrangement of the elements of the voltage generation circuits 903A to 903E illustrated in FIGS. 31A to 31C and FIGS. 32A and 32B. In the voltage generation circuits 905A to 905E illustrated in FIGS. 33A to 33C and FIGS. 34A and 34B, as in the voltage generation circuits 903A to 903E, an efficient voltage decrease from the voltage $V_{SS}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

Embodiment 4

In this embodiment, application examples of the semiconductor device or the memory circuit described in the above embodiment to an electronic component will be described with reference to FIGS. 35A and 35B.

Figure 35A:
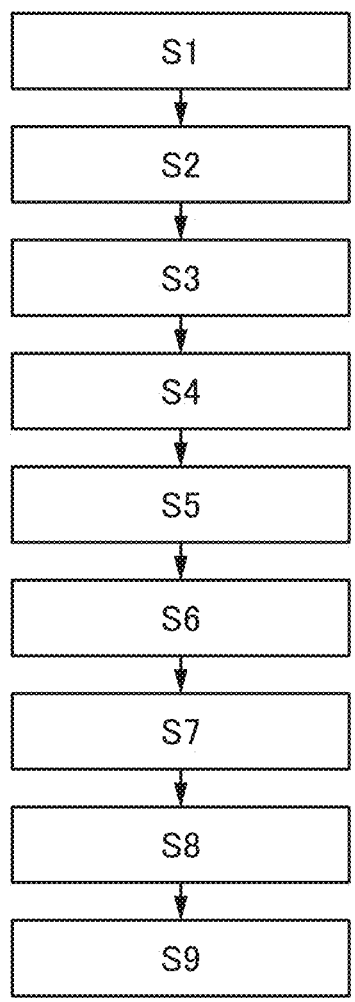
FIG. 35A is a flowchart showing a fabrication process of an electronic component.

FIG. 35A shows an application example of the semiconductor device or the memory circuit described in the above embodiment to an electronic component. Note that an electronic component is also referred to as semiconductor package or IC package. This electronic component has a plurality of standards and names depending on a terminal extraction direction and a terminal shape. Thus, examples of the electronic component are described in this embodiment.

A circuit portion including the transistors described in the above embodiment is completed by integrating detachable components on a printed circuit board through an assembly process (post-process).

The post-process can be completed through steps shown in FIG. 35A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate and dividing the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, a chip may be mounted on and bonded to an interposer.

Next, wire bonding for electrically connecting a lead of the lead frame and an electrode on a chip through a metal wire is performed (Step S4). As the metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The aforementioned electronic component includes the semiconductor device or the memory circuit described in the above embodiments. Therefore, the electronic component has reduced power consumption.

Figure 35B:
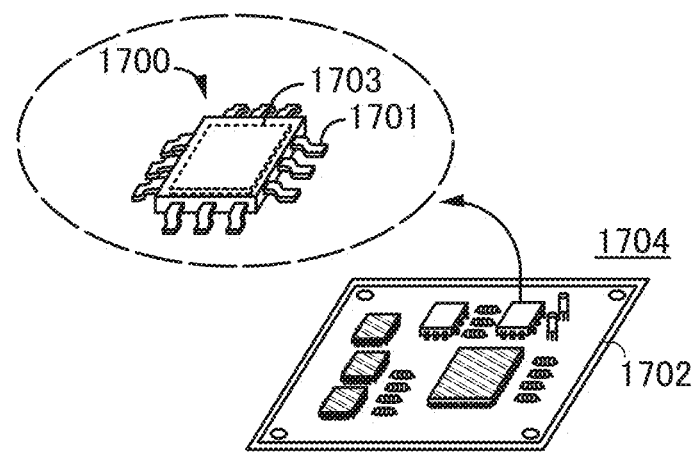
FIG. 35B is a schematic perspective view of the electronic component.

FIG. 35B is a schematic perspective view of a completed electronic component. FIG. 35B is a schematic perspective view of a quad flat package (QFP) as an example of the electronic component. An electronic component 1700 illustrated in FIG. 35B includes a lead 1701 and a circuit portion 1703. The electronic component 1700 in FIG. 35B is mounted on a printed circuit board 1702, for example. When a plurality of electronic components 1700 are used in combination and electrically connected to each other over the printed circuit board 1702, the electronic components 1700 can be provided in an electronic device. A completed circuit board 1704 is provided in an electronic device or the like.

Embodiment 5

A semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Furthermore, as electronic devices that can include the semiconductor device of one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 36A to 36F illustrate specific examples of these electronic devices.

Figure 36A:
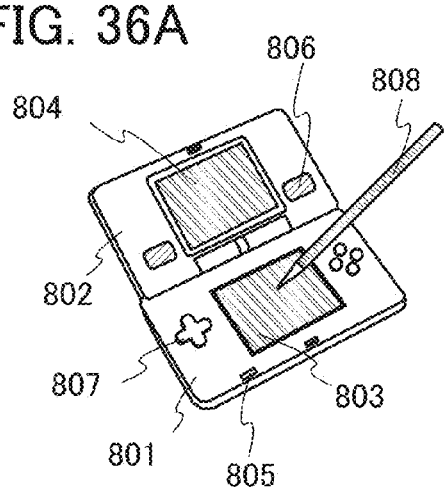
FIGS. 36A to 36F illustrate electronic devices.

FIG. 36A illustrates a portable game machine, which includes housings 801 and 802, display portions 803 and 804, a microphone 805, speakers 806, an operation key 807, a stylus 808, and the like. Although the portable game machine in FIG. 36A has the two display portions 803 and 804, the number of display portions included in the portable game machine is not limited to two.

Figure 36B:
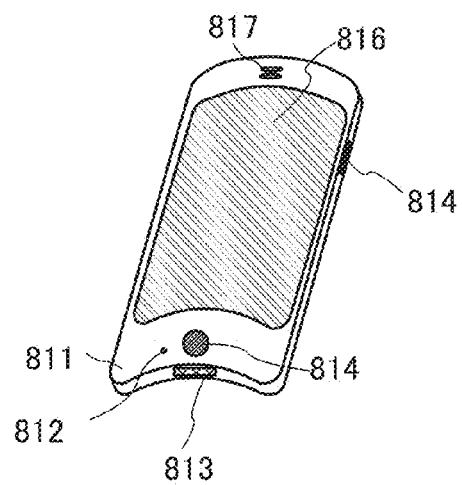

FIG. 36B illustrates a cellular phone, which includes a housing 811, a display portion 816, an operation button 814, an external connection port 813, a speaker 817, a microphone 812, and the like. When the display portion 816 of the cellular phone illustrated in FIG. 36B is touched with a finger or the like, data can be input. Further, operations such as making a call and inputting a character can be performed by touch on the display portion 816 with a finger or the like. The power can be turned on or off with the operation button 814. In addition, types of images displayed on the display portion 816 can be switched; for example, switching images from a mail creation screen to a main menu screen is performed with the operation button 814.

Figure 36C:
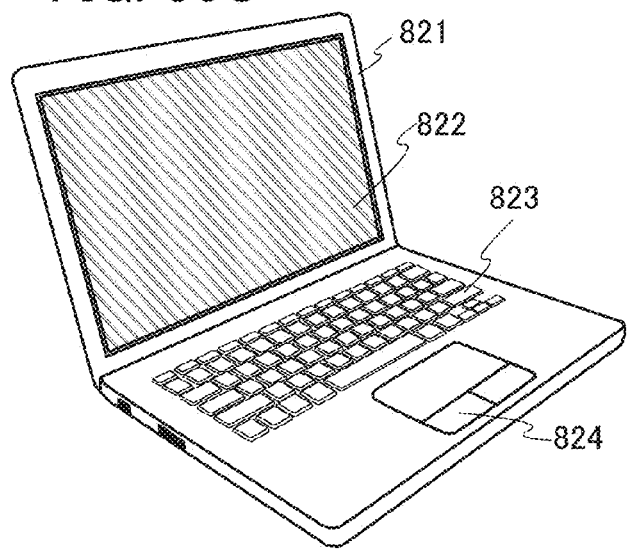

FIG. 36C illustrates a laptop personal computer, which includes a housing 821, a display portion 822, a keyboard 823, a pointing device 824, and the like.

Figure 36D:
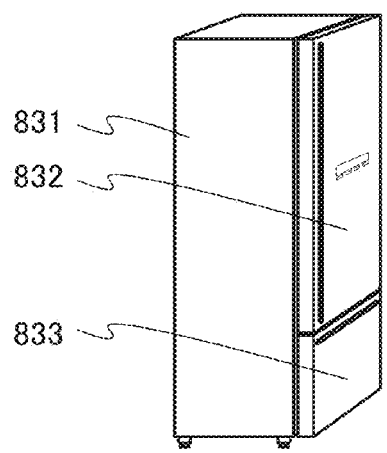

FIG. 36D illustrates an electric refrigerator-freezer, which includes a housing 831, a refrigerator door 832, a freezer door 833, and the like.

Figure 36E:
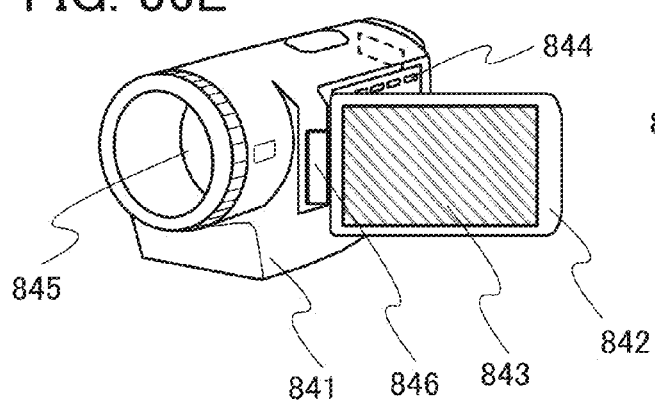

FIG. 36E illustrates a video camera, which includes a first housing 841, a second housing 842, a display portion 843, operation keys 844, a lens 845, a joint 846, and the like. The operation keys 844 and the lens 845 are provided for the first housing 841, and the display portion 843 is provided for the second housing 842. The first housing 841 and the second housing 842 are connected to each other with the joint 846, and the angle between the first housing 841 and the second housing 842 can be changed with the joint 846. Images displayed on the display portion 843 may be switched in accordance with the angle at the joint 846 between the first housing 841 and the second housing 842.

Figure 36F:
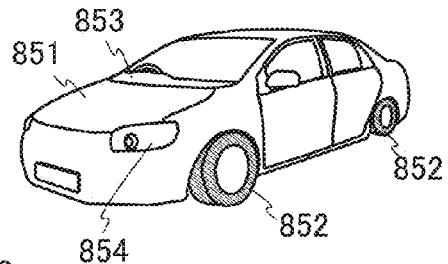

FIG. 36F illustrates a car, which includes a car body 851, wheels 852, a dashboard 853, lights 854, and the like.

Next, an example of use of a display device that can include the semiconductor device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be employed, for example.

For example, in this specification, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on current), a plasma display panel (PDP), an electron emitter, a display element including a carbon nanotube, a liquid crystal element, electronic ink, an electrowetting element, an electrophoretic element, a display element using micro electro mechanical systems (MEMS) (e.g., a grating light valve (GLV), a digital micromirror device (DMD), a digital micro shutter (DMS), MIRASOL (registered trademark), an interferometric modulator (IMOD) element, a MEMS shutter display element, an optical-interference-type MEMS display element, or a piezoelectric ceramic display), quantum dots, and the like. In addition to that, the display element, the display device, the light-emitting element, or the light-emitting device may include display media whose contrast, luminance, reflectivity, transmittance, or the like is changed by electrical or magnetic effect. Examples of display devices including EL elements include an EL display. Examples of display devices including electron emitters include a field emission display (FED), and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. Examples of display devices including quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. When graphene or graphite is provided in this manner, a nitride semiconductor, for example, an n-type GaN semiconductor layer including crystals can be easily formed thereover. Furthermore, a p-type GaN semiconductor layer including crystals or the like can be provided thereover, and thus the LED chip can be formed. Note that an AlN layer may be provided between the n-type GaN semiconductor layer including crystals and the graphene or graphite. The GaN semiconductor layers included in the LED chip may be formed by MOCVD. Note that when the graphene is provided, the GaN semiconductor layers included in the LED chip can also be formed by a sputtering method. In the case of a display element including MEMS, a drying agent may be provided in a space where the display element is sealed (or between an element substrate over which the display element is placed and a counter substrate opposed to the element substrate, for example). Providing a drying agent can prevent MEMS and the like from becoming difficult to move or deteriorating easily because of moisture or the like.

Embodiment 6

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 41A:
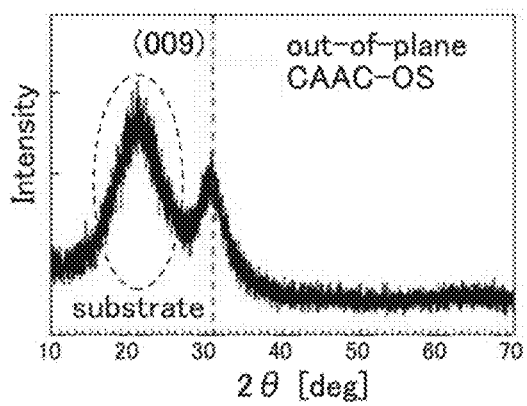
FIGS. 41A to 41E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 41A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 41B:
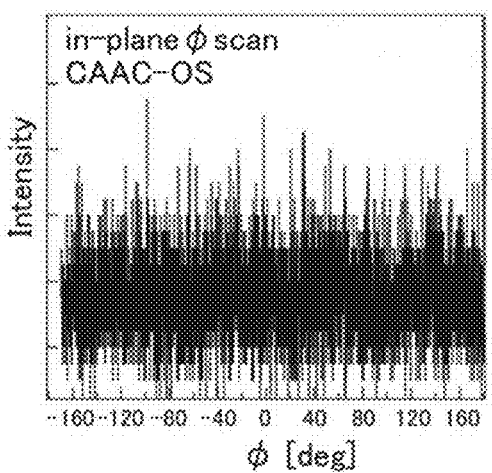
Figure 41C:
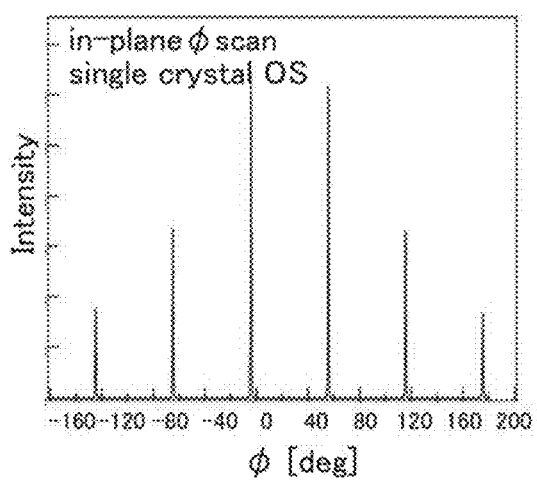

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with a 2θ fixed at around 56° and with the sample rotated using a normal vector to the sample surface as an axis (φ axis), as shown in FIG. 41B, a peak is not clearly observed. In contrast, in the case where single crystal InGaZnO$_4$ is subjected to φ scan with a 2θ fixed at around 56°, as shown in FIG. 41C, six peaks that are derived from crystal planes equivalent to the (110) plane are observed. Accordingly, the structural analysis using XRD shows that the directions of a-axes and b-axes are irregularly oriented in the CAAC-OS.

Figure 41D:
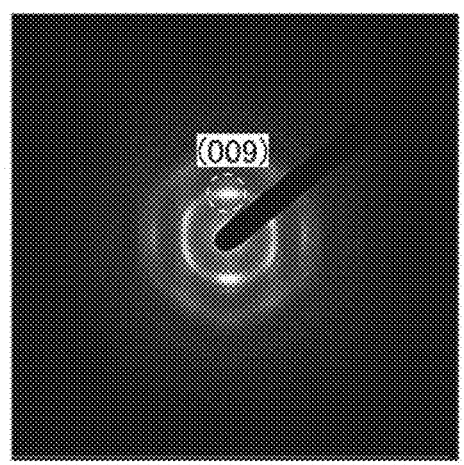
Figure 41E:
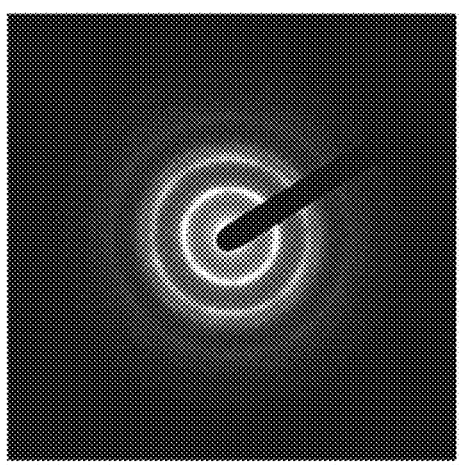

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 41D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 41E shows a diffraction pattern obtained in such a manner that an electron beam with a probe diameter of 300 nm is incident on the same sample in a direction perpendicular to the sample surface. As shown in FIG. 41E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 41E is considered to be derived from the (010) plane, the (100) plane, and the like of the InGaZnO$_4$ crystal. The second ring in FIG. 41E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 42A:
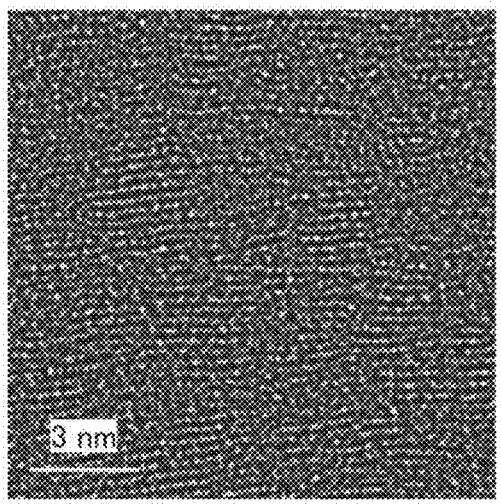
FIGS. 42A to 42E show a cross-sectional TEM image and plan-view TEM images of a CAAC-OS and images obtained through analysis thereof.

FIG. 42A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 42A shows pellets in which metal atoms are arranged in a layered manner. FIG. 42A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 42B:
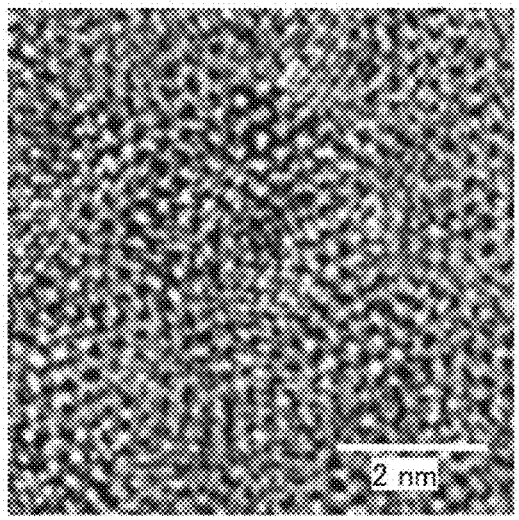
Figure 42C:
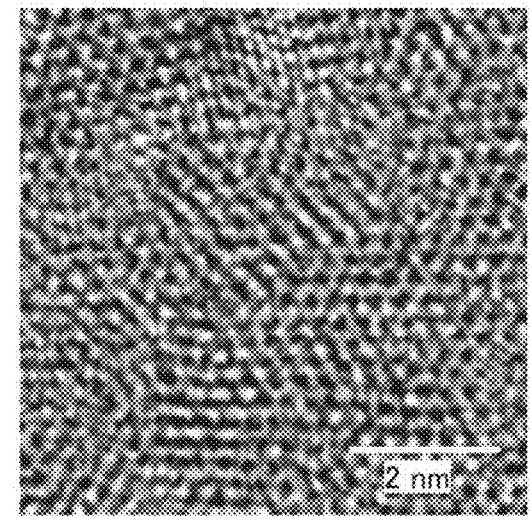
Figure 42D:
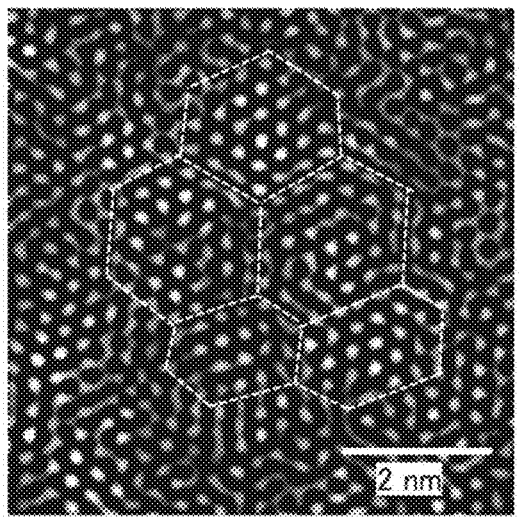
Figure 42E:
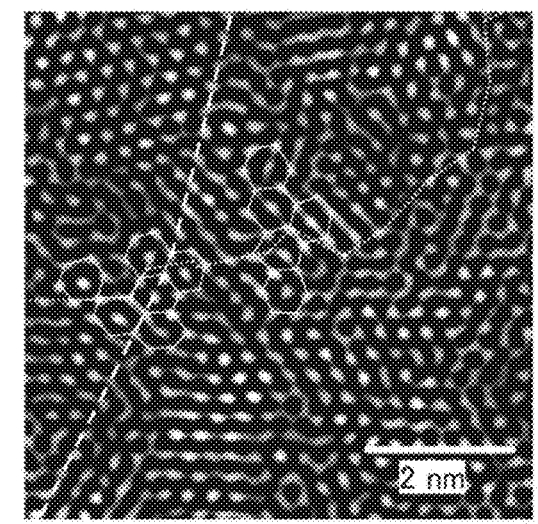

FIGS. 42B and 42C show Cs-corrected high-resolution TEM images of a plane of the CAAC-OS observed from a direction substantially perpendicular to the sample surface. FIGS. 42D and 42E are images obtained through image processing of FIGS. 42B and 42C. The method of image processing is as follows. The image in FIG. 42B is subjected to fast Fourier transform (FFT), so that FFT images are obtained. Then, mask processing is performed such that a range of from 2.8 nm$^{-1}$ to 5.0 nm$^{-1}$ from the origin point in the obtained FFT images remains. After the mask processing, the FFT images are processed by inverse fast Fourier transform (IFFT) to obtain processed images. The images obtained in this manner are called FFT filtering images. An FFT filtering image is a Cs-corrected high-resolution TEM image from which a periodic component is extracted, and shows a lattice arrangement.

In FIG. 42D, a portion where a lattice arrangement is broken is denoted with a dashed line. A region surrounded by a dashed line is one pellet. The portion shown by the dashed line is a junction of pellets. The dashed line draws a hexagon, which means that the pellet has a hexagonal shape. Note that the shape of the pellet is not always a regular hexagon but is a non-regular hexagon in many cases.

In FIG. 42E, a dotted line denotes a portion where the direction of a lattice arrangement is changed between a region with a regular lattice arrangement and another region with a regular lattice arrangement, and a dashed line denotes the change in the direction of the lattice arrangement. A clear grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancies in the oxide semiconductor might serve as carrier traps or serve as carrier generation sources when hydrogen is captured therein.

The CAAC-OS having small amounts of impurities and oxygen vacancies is an oxide semiconductor with a low carrier density (specifically, lower than $8\times10^{11}$/cm$^3$, preferably lower than $1\times10^{11}$/cm$^3$, and further preferably lower than $1\times10^{10}$/cm$^3$, and higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 43A:
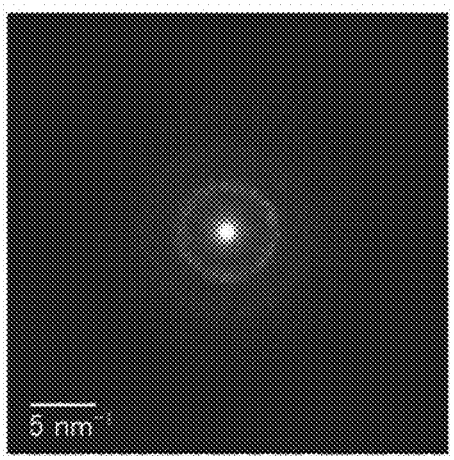
FIGS. 43A to 43D show electron diffraction patterns and a cross-sectional TEM image of an nc-OS.
Figure 43B:
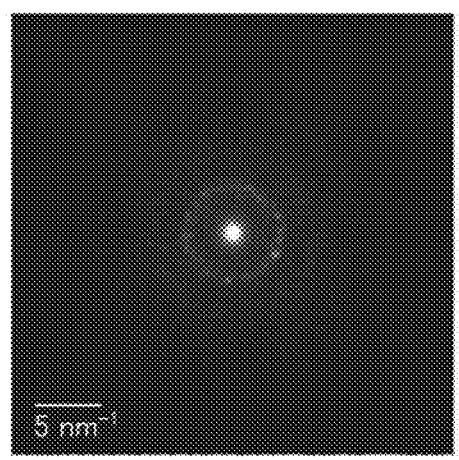

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 43A is observed. FIG. 43B shows a diffraction pattern (a nanobeam electron diffraction pattern) obtained when an electron beam with a probe diameter of 1 nm is incident on the same sample. As shown in FIG. 43B, a plurality of spots are observed in a ring-like region. In other words, ordering in an nc-OS is not observed with an electron beam with a probe diameter of 50 nm but is observed with an electron beam with a probe diameter of 1 nm.

Figure 43C:
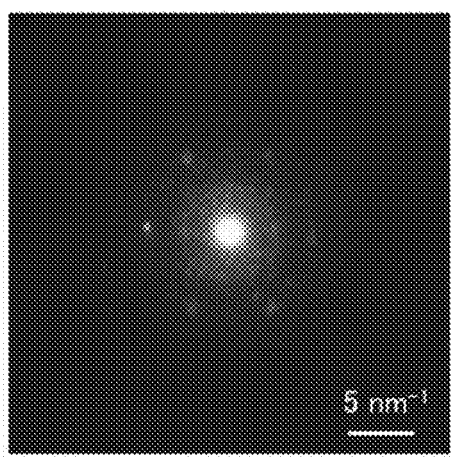

Furthermore, an electron diffraction pattern in which spots are arranged in an approximately regular hexagonal shape is observed in some cases as shown in FIG. 43C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 43D:
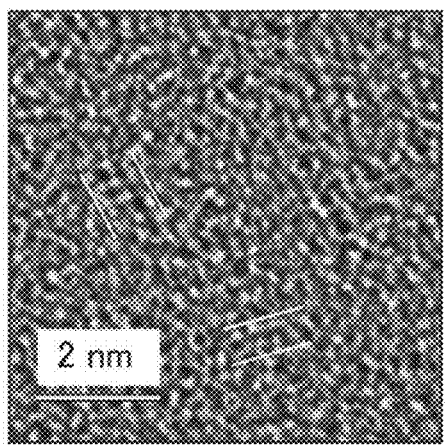

FIG. 43D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 43D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and the amorphous oxide semiconductor.

Figure 44A:
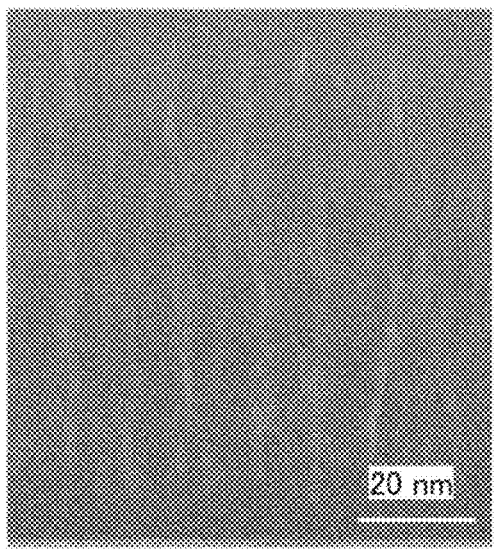
FIGS. 44A and 44B are cross-sectional TEM images of an a-like OS.
Figure 44B:
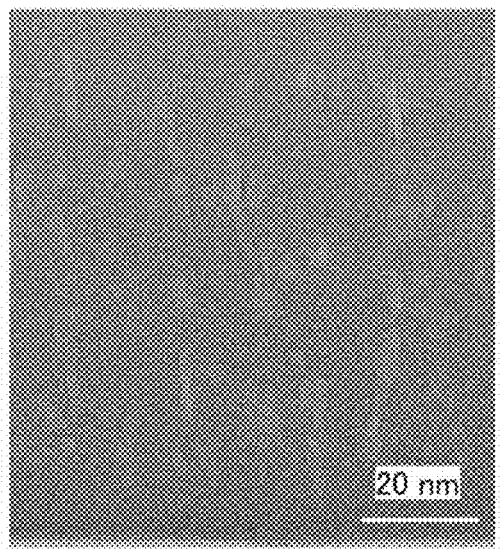

FIGS. 44A and 44B are high-resolution cross-sectional TEM images of an a-like OS. FIG. 44A is the high-resolution cross-sectional TEM image of the a-like OS at the start of the electron irradiation. FIG. 44B is the high-resolution cross-sectional TEM image of the a-like OS after the electron (e$^-$) irradiation at $4.3\times10^8$ e$^-$/nm$^2$. FIGS. 44A and 44B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 45:
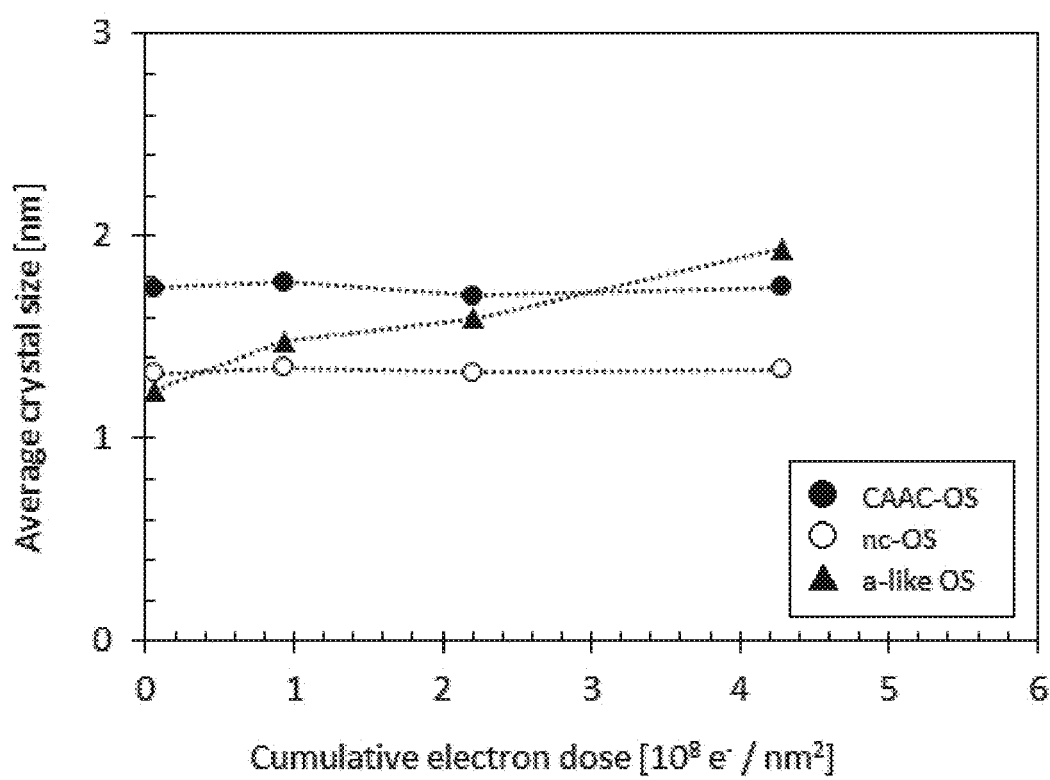
FIG. 45 shows a change of crystal parts of an In—Ga—Zn oxide owing to electron irradiation.

FIG. 45 shows a change in the average size of crystal parts (at 22 points to 30 points) in each sample. Note that the crystal part size corresponds to the length of a lattice fringe. FIG. 45 indicates that the crystal part size in the a-like OS increases with an increase in the cumulative electron dose in obtaining TEM images, for example. As shown in FIG. 45, a crystal part of approximately 1.2 nm (also referred to as an initial nucleus) at the start of TEM observation grows to a size of approximately 1.9 nm at a cumulative electron (e$^-$) dose of $4.2\times10^8$ e$^-$/nm$^2$. In contrast, the crystal part size in the nc-OS and the CAAC-OS shows little change from the start of electron irradiation to a cumulative electron dose of $4.2×10^8$ e$^-$/nm$^2$. As shown in FIG. 45, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7×10^5$ e$^-$/(nm$^2$·s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Oxide>

An oxide of one embodiment of the present invention is described below.

An oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

<Atomic Ratio>

Next, preferred ranges of the atomic ratio of indium, the element M, and zinc contained in an oxide of one embodiment of the present invention are described with reference to FIGS. 46A to 46C. Note that the proportion of oxygen atoms is not shown in FIGS. 46A to 46C. The terms of the atomic ratio of indium, the element M, and zinc contained in the oxide are denoted by [In], [M], and [Zn], respectively.

Figure 46A:
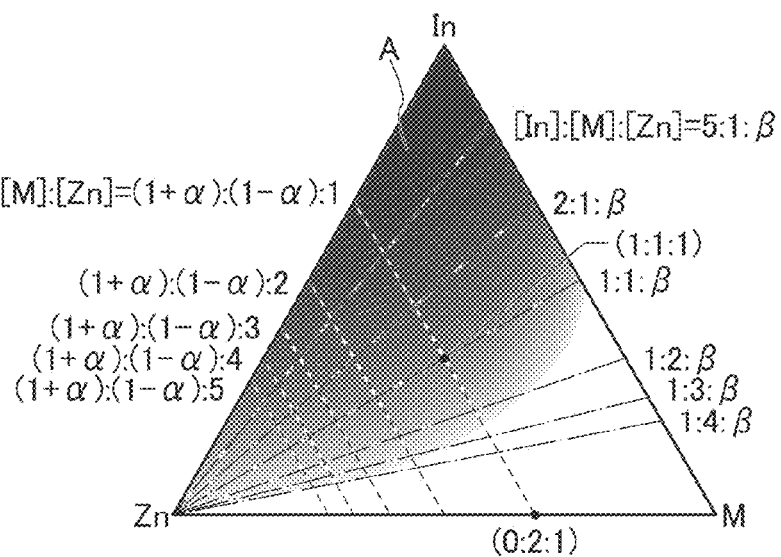
FIGS. 46A to 46C each illustrate an atomic ratio range of an oxide of one embodiment of the present invention.
Figure 46B:
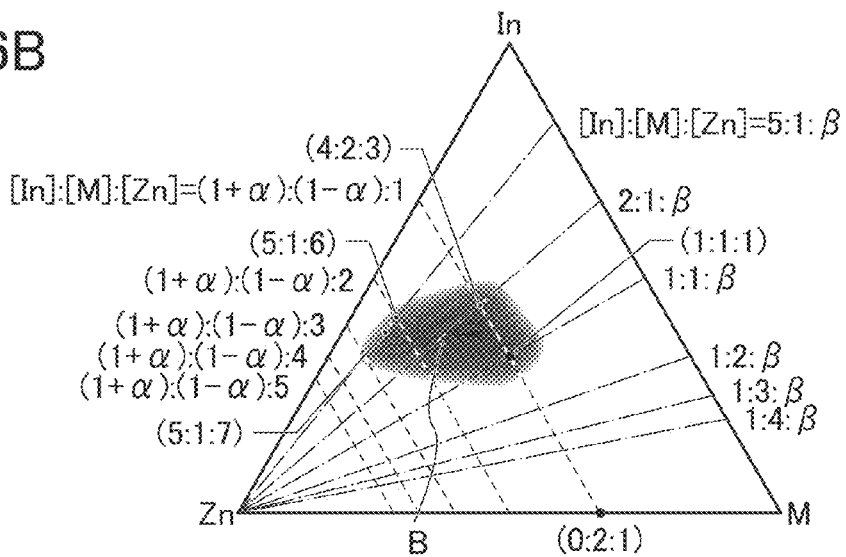
Figure 46C:
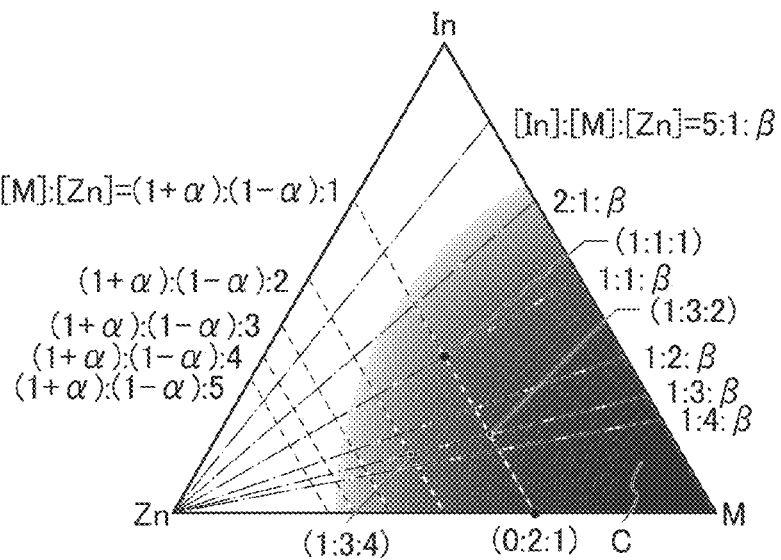

In FIGS. 46A to 46C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$, where $\beta \geq 0$, a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

The oxides shown in FIGS. 46A to 46C with an atomic ratio of [In]:[M]:[Zn]=0:2:1 and the vicinity thereof are likely to have a spinel crystal structure.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

A region A in FIG. 46A shows an example of the preferred ranges of the atomic ratio of indium, the element M, and zinc contained in an oxide.

In addition, the oxide containing indium in a higher proportion can have high carrier mobility (electron mobility). Thus, an oxide having a high content of indium has higher carrier mobility than an oxide having a low content of indium.

In contrast, when the indium content and the zinc content in an oxide become lower, carrier mobility becomes lower. Thus, with an atomic ratio of [In]:[M]:[Zn]=0:1:0 and the vicinity thereof (e.g., a region C in FIG. 46C), insulation performance becomes better.

Accordingly, an oxide of one embodiment of the present invention preferably has an atomic ratio represented by the region A in FIG. 46A. With the atomic ratio, a layered structure with high carrier mobility and a few grain boundaries is easily obtained.

In the region A, in particular a region B in FIG. 46B, an excellent oxide which easily becomes a CAAC-OS and has high carrier mobility can be obtained.

The CAAC-OS is an oxide with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide. This means that the CAAC-OS has small amounts of impurities and defects (e.g., oxygen vacancies). Thus, an oxide including a CAAC-OS is physically stable. Therefore, the oxide including a CAAC-OS is resistant to heat and has high reliability.

Note that the region B includes an atomic ratio of [In]:[M]:[Zn]=4:2:3 to 4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]= 5:1:7 and the vicinity thereof.

Note that the property of an oxide is not uniquely determined by an atomic ratio. Even with the same atomic ratio, the property of an oxide might be different depending on a formation condition. For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which an oxide tends to have specific characteristics, and boundaries of the regions A to C are not clear.

Note that the condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with low carrier density is preferably used for the transistor. For example, an oxide whose carrier density is lower than $8 \times 10^{11}/cm^3$, preferably lower than $1 \times 10^{11}/cm^3$, and further preferably lower than $1 \times 10^{10}/cm^3$, and greater than or equal to $1 \times 10^{-9}/cm^3$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. Examples of impurities include hydrogen, nitrogen, an alkali metal, an alkaline earth metal, iron, nickel, and silicon.

Here, the influence of impurities in the oxide is described.

When silicon or carbon that is one of Group 14 elements is contained in the oxide, defect states are formed. Thus, the concentration of silicon or carbon in the oxide and around an interface with the oxide (measured by secondary ion mass spectrometry (SIMS)) is set lower than or equal to $2 \times 10^{18}$ atoms/cm$^3$, preferably lower than or equal to $2 \times 10^{17}$ atoms/cm$^3$.

When the oxide contains an alkali metal or an alkaline earth metal, defect states are formed and carriers are generated, in some cases. Thus, a transistor including an oxide that contains an alkali metal or an alkaline earth metal is likely to be normally-on. Therefore, it is preferable to reduce the concentration of an alkali metal or an alkaline earth metal in the oxide. Specifically, the concentration of an alkali metal or an alkaline earth metal in the oxide measured by SIMS is set lower than or equal to $1 \times 10^{18}$ atoms/cm$^3$, preferably lower than or equal to $2 \times 10^{16}$ atoms/cm$^3$.

When the oxide contains nitrogen, the oxide easily becomes n-type by generation of electrons serving as carriers and an increase of carrier density. Thus, a transistor whose semiconductor includes an oxide that contains nitrogen is likely to be normally-on. For this reason, nitrogen in the oxide is preferably reduced as much as possible; for example, the concentration of nitrogen in the oxide, which is measured by SIMS, can be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, it is preferable that hydrogen in the oxide be reduced as much as possible. Specifically, the hydrogen concentration of the oxide measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide with sufficiently reduced impurity concentration is used for a channel formation region in a transistor, the transistor can have stable electrical characteristics.

Next, the case where the oxide has a two-layer structure or a three-layer structure is described. A band diagram of a stacked-layer structure of an oxide S1, an oxide S2, and an oxide S3 and insulators that are in contact with the stacked-layer structure and a band diagram of a stacked-layer structure of the oxides S2 and S3 and insulators that are in contact with the stacked-layer structure are described with reference to FIGS. 47A and 47B.

Figure 47A:
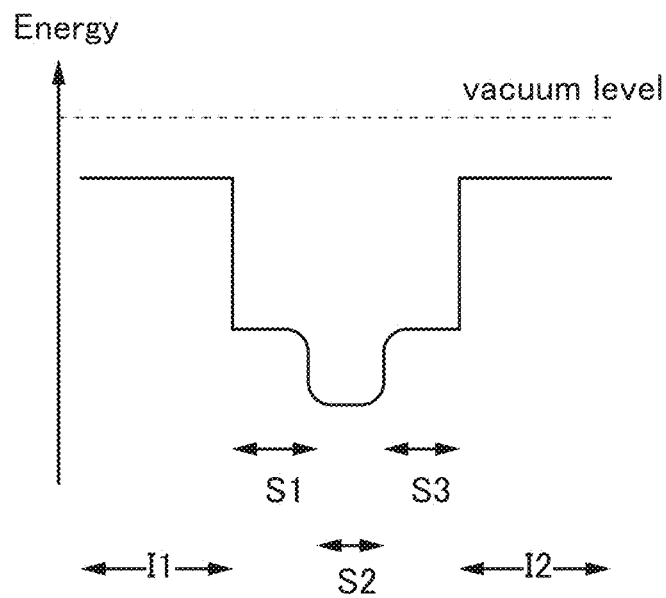
FIGS. 47A and 47B are band diagrams of stacked-layer structures of oxides.
Figure 47B:
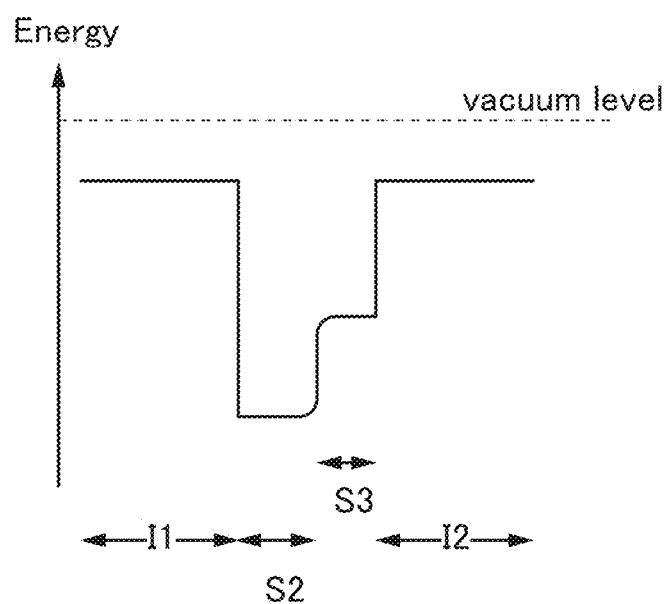

FIG. 47A is an example of the band diagram of a stacked-layer structure including an insulator I1, the oxide S1, the oxide S2, the oxide S3, and an insulator I2 in a film thickness direction. FIG. 47B is an example of the band diagram of a stacked-layer structure including the insulator I1, the oxide S2, the oxide S3, and the insulator I2 in a film thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in the energy level between the conduction band minimum of the oxide S2 and the conduction band minimum of each of the oxides S1 and S3 is preferably greater than or equal to 0.15 eV or greater than or equal to 0.5 eV, and less than or equal to 2 eV or less than or equal to 1 eV. That is, a difference in the electron affinity between each of the oxides S1 and S3 and the oxide S2 is preferably greater than or equal to 0.15 eV or greater than or equal to 0.5 eV, and less than or equal to 2 eV or less than or equal to 1 eV.

As shown in FIGS. 47A and 47B, the energy level of the conduction band minimum of each of the oxides S1 to S3 is gradually varied. In other words, the energy level of the conduction band minimum is continuously varied or continuously connected. In order to obtain such a band diagram, the density of defect states in a mixed layer formed at the interface between the oxides S1 and S2 or the interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor shifts in a positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel region. For example, an oxide with high insulation performance and the atomic ratio represented by the region C in FIG. 46C may be used as the oxides S1 and S3. The region C in FIG. 46C shows the atomic ratio of [In]:[M]:[Zn]=0:1:0 and the vicinity thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2, as each of the oxides S1 and S3. In addition, it is suitable to use an oxide with sufficiently high insulation performance and an atomic ratio where [M]/([Zn]+[In]) is greater than or equal to 1 as the oxide S3.

This application is based on Japanese Patent Application serial no. 2015-217863 filed with Japan Patent Office on Nov. 5, 2015, the entire contents of which are hereby incorporated by reference.

What is claimed is:

1. A semiconductor device comprising:
   a first transistor and a second transistor;
   a capacitor;
   a first wiring and a second wiring;
   a buffer circuit electrically connected to the first wiring; and
   a sense amplifier circuit electrically connected to the second wiring,
   wherein:
   the first transistor comprises an oxide semiconductor film, a first gate electrode, a second gate electrode, a first gate insulating film, and a second gate insulating film,
   the second transistor comprises the oxide semiconductor film,
   the second gate electrode is electrically connected to the first wiring,
   one of source and drain electrodes of the second transistor is electrically connected to the second wiring, and
   the capacitor is electrically connected to one of source and drain electrodes of the first transistor, and the other of the source and drain electrodes of the second transistor.

2. The semiconductor device according to claim 1, further comprising:
   a decoder, a level shifter, and a step-up circuit,
   wherein:
   the level shifter is electrically connected to the step-up circuit,
   the buffer circuit is electrically connected to the level shifter,
   the level shifter is configured to output a first potential, a second potential, and a third potential through the buffer circuit,
   any one of the first potential, the second potential, and the third potential is supplied to the second gate electrode,
   the first potential or the second potential is supplied to the second gate electrode of the first transistor to trap charge in the second gate insulating film, and
   the third potential is supplied to the second gate electrode of the first transistor to turn off the second transistor.

3. The semiconductor device according to claim 1, wherein:
   the second gate insulating film comprises a first layer and a second layer over the first layer, and
   each of the first layer and the second layer contains at least one of hafnium oxide, aluminum oxide, and silicon nitride.

4. A memory device comprising the semiconductor device according to claim 1.

5. An electronic device comprising the memory device according to claim 4 and at least one of a display portion, a microphone, a speaker, and an operation key.

6. A method for operating a semiconductor device,
   the semiconductor device comprising:
   a first transistor and a second transistor;
   a capacitor;
   a first wiring and a second wiring;
   a first circuit electrically connected to the first wiring; and
   a sense amplifier circuit electrically connected to the second wiring,
   wherein:
   the first circuit comprises a decoder, a level shifter, a buffer circuit, and a step-up circuit,
   the level shifter is electrically connected to the step-up circuit, the first transistor comprises an oxide semiconductor film, a first gate electrode, a second gate electrode, a first gate insulating film, and a second gate insulating film,
   the second transistor comprises the oxide semiconductor film,
   the second gate electrode is electrically connected to the first wiring,
   one of source and drain electrodes of the second transistor is electrically connected to the second wiring, and one electrode of the capacitor is electrically connected to one of source and drain electrodes of the first transistor, and the other of the source and drain electrodes of the second transistor, and the method comprising:
- trapping charge in the second gate insulating film by providing a first potential difference between the other of the source and drain electrodes of the first transistor and the second gate electrode of the first transistor;
- turning on the second transistor so that charge is accumulated in the other of the source and drain electrodes of the second transistor; and
- turning off the second transistor so that charge is held in the other of the source and drain electrodes of the second transistor.

7. The method according to claim 6, wherein:
the level shifter is configured to output a first potential, a second potential, and a third potential through the buffer circuit,
any one of the first potential, the second potential, and the third potential is supplied to the second gate electrode of the first transistor,
in the step of trapping charge, the first potential or the second potential is supplied to the second gate electrode of the first transistor, and
in the step of turning off the second transistor, the third potential is supplied to the second gate electrode of the first transistor.

8. The method according to claim 7, further comprising:
providing a second potential difference between the other of the source and drain electrodes of the first transistor and the second gate electrode of the first transistor to measure current between the source and drain electrodes of the first transistor,
wherein the second potential difference is smaller than the first potential difference.

9. The method according to claim 6, wherein:
the second gate insulating film includes a first layer and a second layer over the first layer, and
each of the first layer and the second layer contains at least one of hafnium oxide, aluminum oxide, and silicon nitride.

\* \* \* \* \*